United States Patent
Inoue et al.

(10) Patent No.: US 6,522,350 B2
(45) Date of Patent: Feb. 18, 2003

(54) IMAGING DEVICE, IMAGING METHOD, AND PRINTING DEVICE

(75) Inventors: Yoshinori Inoue, Otsu (JP); Hiroaki Iwai, Kyoto (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 09/194,362

(22) PCT Filed: Mar. 24, 1998

(86) PCT No.: PCT/JP98/01282

§ 371 (c)(1),
(2), (4) Date: Nov. 25, 1998

(87) PCT Pub. No.: WO98/42516

PCT Pub. Date: Oct. 1, 1998

(65) Prior Publication Data

US 2002/0015088 A1 Feb. 7, 2002

(30) Foreign Application Priority Data

Mar. 26, 1997 (JP) ............................................. 9-074101
Jul. 16, 1997 (JP) ............................................. 9-191492

(51) Int. Cl.$^7$ ................................................. B41J 2/45
(52) U.S. Cl. ..................................................... 347/238
(58) Field of Search .................................. 347/238, 237

(56) References Cited

U.S. PATENT DOCUMENTS

| | | | | |
|---|---|---|---|---|
| 3,832,488 A | * | 8/1974 | Fahey et al. ............ | 385/116 X |
| 4,376,282 A | * | 3/1983 | Kotani et al. ............ | 347/244 |
| 4,455,578 A | * | 6/1984 | Fearnside ............ | 347/237 |
| 4,524,372 A | * | 6/1985 | De Cock et al. ............ | 347/238 |
| 4,602,262 A | * | 7/1986 | Milligan et al. ............ | 347/130 |
| 4,689,694 A | * | 8/1987 | Yoshida ............ | 358/298 |
| 4,962,464 A | * | 10/1990 | Henzi et al. ............ | 358/296 X |
| 5,124,720 A | * | 6/1992 | Schantz ............ | 347/19 |
| 5,337,074 A | * | 8/1994 | Thornton ............ | 347/238 X |
| 5,339,737 A | | 8/1994 | Lewis et al. ............ | 101/454 |
| 5,477,259 A | * | 12/1995 | Iwasa ............ | 347/238 |

FOREIGN PATENT DOCUMENTS

| | | | | |
|---|---|---|---|---|
| JP | 57-188003 | | 11/1982 | |
| JP | 60-44374 | * | 3/1985 | ............ B41J/3/21 |
| JP | 04052153 A | * | 2/1992 | ............ B41J/2/44 |
| JP | 5-16320 | | 1/1993 | |
| JP | 5-508123 | | 11/1993 | |
| JP | 6-152939 | | 5/1994 | |
| JP | 6-186750 | | 7/1994 | |
| JP | 7-30207 | | 1/1995 | |
| JP | 7-60934 | | 3/1995 | |
| JP | 8-142400 | | 6/1996 | |

* cited by examiner

Primary Examiner—Michael Nghiem
(74) Attorney, Agent, or Firm—Morgan Lewis & Bockius LLP

(57) ABSTRACT

An imaging apparatus 1 having a plurality of beam irradiation sources individually drivable, an imaging method, an optical fiber array apparatus, an imaging head apparatus, and a printing apparatus. The imaging apparatus 1 includes n (n=2 or more integer) light source blocks 15a to 15d including k (k=2 or more integer) beam irradiation sources, and one or more and below n beam irradiation source driving devices connectable for each block.

10 Claims, 48 Drawing Sheets

F I G. 10
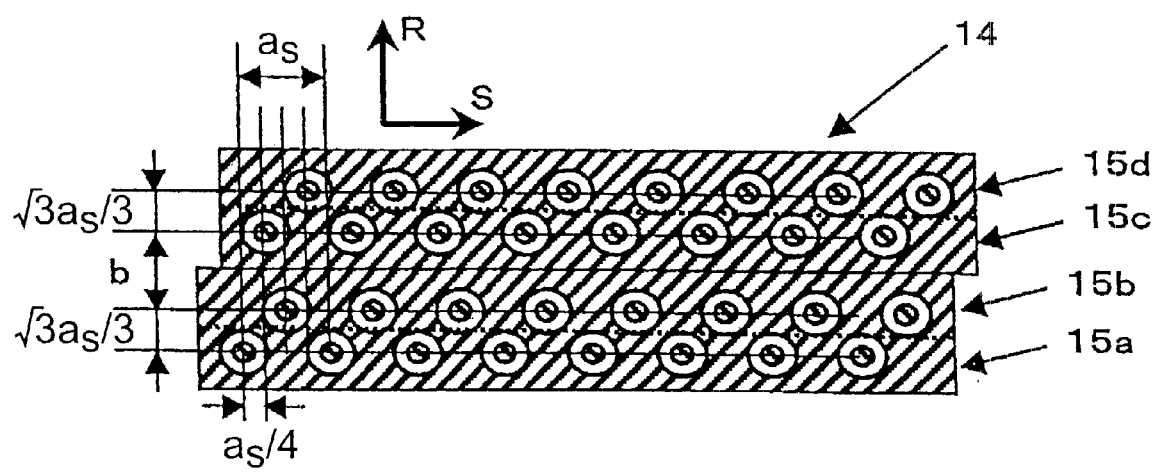

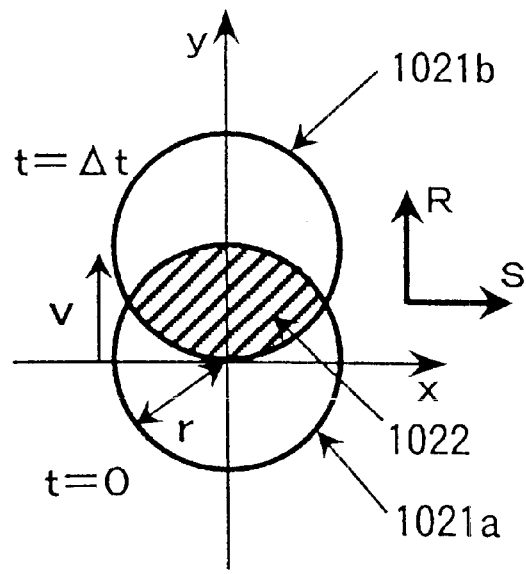
F I G. 14
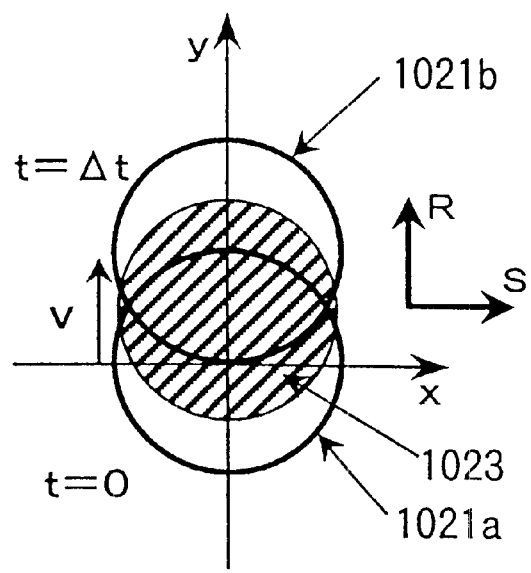
F I G. 15

F I G. 21
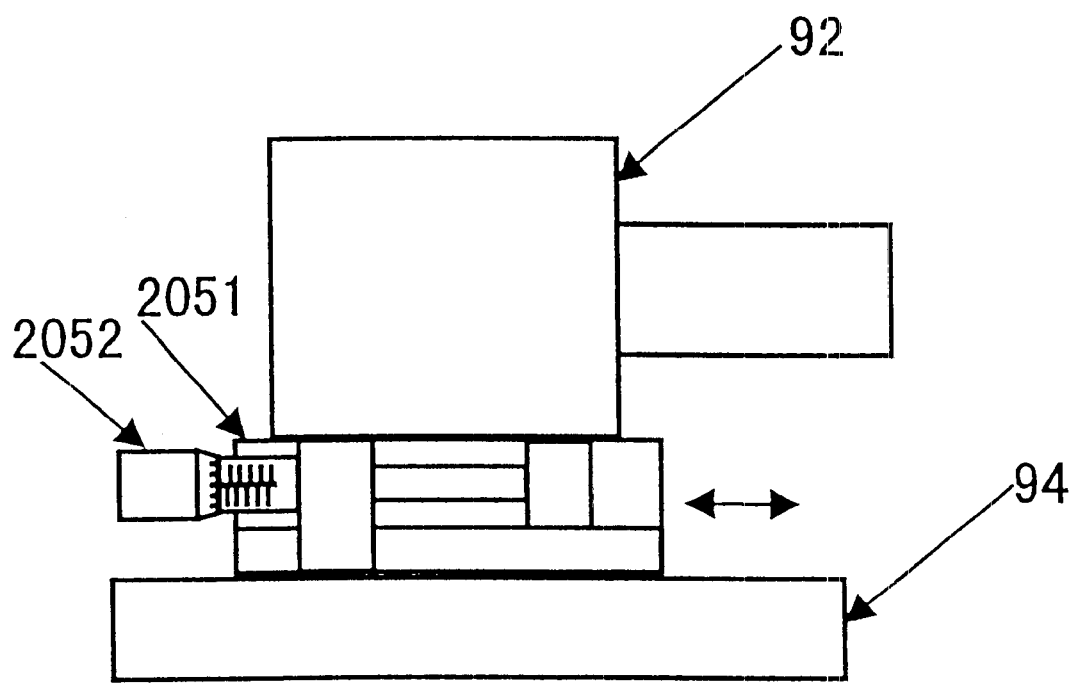

FIG. 31A
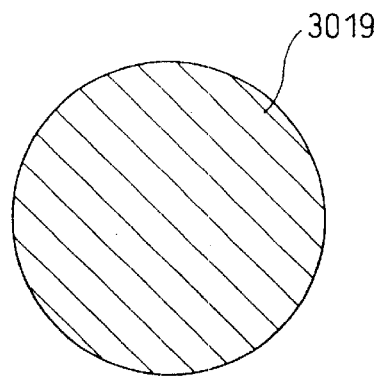
FIG. 31C
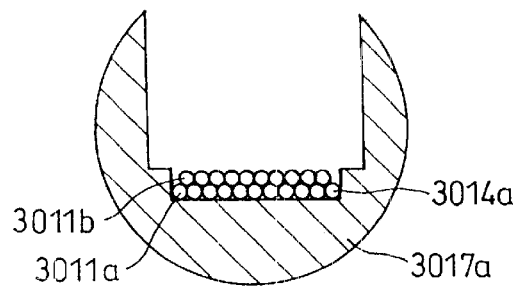
FIG. 31B
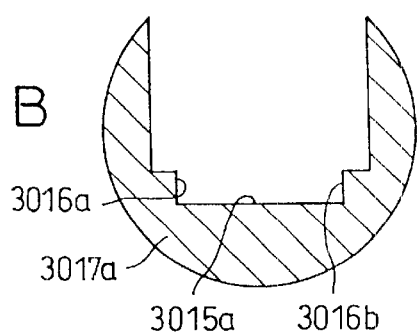
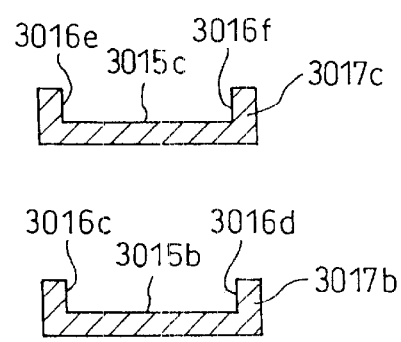
FIG. 31D
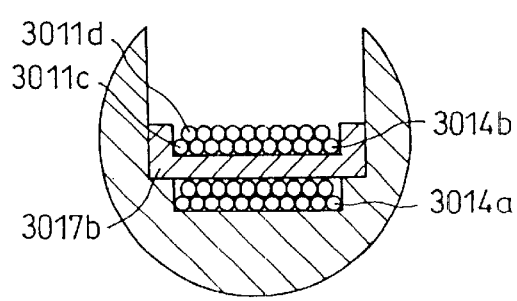
FIG. 31E
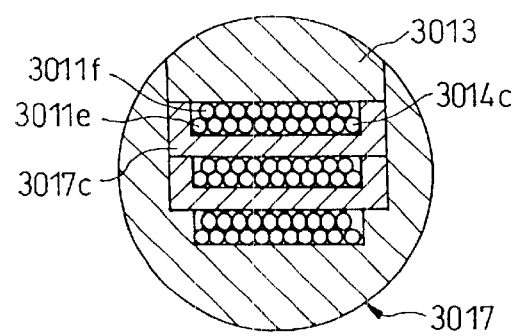

$\cos \psi = 4d_S/a_S$
$s = d_S/\cos \psi + b\tan \psi$

IDEAL CASE

CASE WHEN SCANNING DIRECTION OF IMAGING HEAD IS NOT INCLINED

CASE WHEN SCANNING DIRECTION OF IMAGING HEAD IS INCLINED

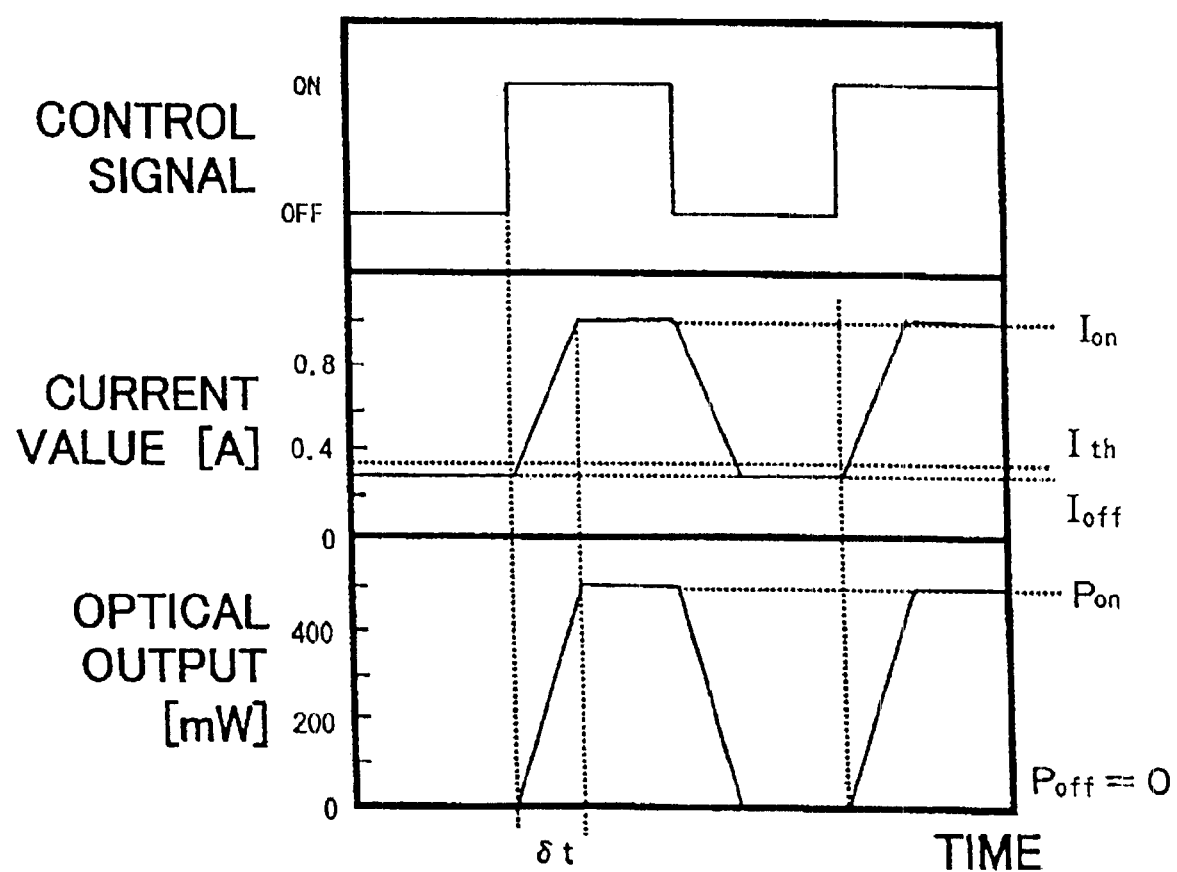

IMAGING DEVICE, IMAGING METHOD, AND PRINTING DEVICE

TECHNICAL FIELD

The present invention relates to an imaging apparatus and an imaging method using beam irradiation sources such as laser beam sources, and preferably to an apparatus and its method for generating a change in an imaging characteristic (physical change) such as projections and depressions or a change in solubility to solvent on an imaging medium such as an imaging film, an imaging plate according to imaging data using a beam digitally controlled. Also, the present invention relates to an optical fiber array apparatus and an imaging head apparatus, which are used in the above imaging apparatus. Moreover, the present invention relates to a printing apparatus using the above imaging apparatus.

BACKGROUND ART

FIG. 61 shows an example of an imaging apparatus using beam irradiation sources such as laser beam source. As described in Unexamined Japanese Patent Publication No. 6-186750 (corresponding to U.S. Pat. No. 5,339,737), an imaging apparatus 9 comprises a medium support drum 91 for winding an imaging medium around on its outer surface, an imaging head 92 including beam irradiation sources and an optical system for condensing beams from the beam irradiation sources, a beam irradiation source control unit 96, and a cable 95 for connecting the imaging head 92 to the beam-irradiation source control unit 96. Moreover, the imaging head 92 is fixed onto a linear stage 94 for realizing a parallel movement with respect to an axial direction of the medium support drum 91.

As the linear stage 94, a linear motor typed linear stage, which is directly driven by a linear motor, and a ball screw typed linear stage using a ball screw typed linear guide are generally used. The distance between the imaging head 92 and the imaging medium 98 is adjusted such that the beams are condensed on the surface of the imaging medium. The outputs of the beam irradiation sources are controlled enough to generate a change in an imaging characteristic (physical change) such as projections and depressions according to imaging data or a change in solubility to solvent between a beam irradiation section of the imaging medium 98 and a non-irradiation section.

In executing the imaging, the beam irradiation sources are switched to correspond to imaging data as performing the following operations. Specifically, the medium support drum 91 around which the imaging medium 98 is wound is rotated in a direction of an arrow R of the figure using a motor 93 such as a pulse motor. Also, the imaging head 92 fixed onto the linear stage 94 is moved in a direction of an arrow S of the figure to be parallel to the shaft of the medium support drum. This generates a two-dimensional change in an imaging characteristic (physical change), such as physical projections and depressions according to imaging data or a change in solubility to solvent, on the surface of the imaging medium.

Generally, a direction R of lines imaged by the rotation of the medium support drum 91 is defined as a main scanning direction, and a direction S of lines imaged by the parallel movement of the imaging head 92 is defined as a sub-scanning direction.

As the method for improving the performance of such the imaging apparatus, there can be easily considered the plurality of beam irradiation sources, which can be independently driven.

The improvement of the performance of the imaging apparatus means to enhance the imaging speed and resolution. The relationship of tradeoff is established between the imaging speed and the resolution. In this case, the resolution denotes that how many dots can be formed per unit length, and dpi (dots per inch) is generally used as a unit.

For example, 2540 dpi corresponds to 100 dots/mm. As one example, suppose that the imaging head having i beam irradiation sources is used to execute imaging i lines continuous to the main scanning direction simultaneously by i beam irradiation sources. At this time, a dot distance $d_p$ for realizing a predetermined resolution r is 1/r. Then, when the linear motor typed linear stage is used, in many cases, the imaging head is moved by a predetermined distance after the imaging corresponding to one circumference in the main scanning direction is finished. When the ball screw typed linear stage is used, the imaging head is moved by a predetermined distance during one turn of the medium support drum. The predetermined distance is i times as large as the dot distance $d_p$ on the imaging medium.

Thereafter, next i lines are imaged, and these series of operations are repeated, and the imaging of the entire surface of the imaging area is completed. By use of i beam irradiation sources, the time required for imaging is reduced to 1/i when the resolution is the same.

In order to increase the resolution j times, it is needed that the dot distance be set to $d_p/j$ and that the distance of the movement of the imaging head be set to $d_p \times i/j$. Then, time required for imaging results in J/i times.

As one of the methods using the plurality of beam irradiation sources, a laser diode array is used. The general outline view is shown in FIG. 39.

A laser diode array 8 includes eight laser diodes, which can be independently driven, in one chip. The laser diodes have laser beam emission ends 81a to 81h, drive side electrodes 82a to 82h, and a rear face common electrode 83 for all laser diodes, respectively. The flow of a predetermined current to the drive side electrodes 82a to 82h allows the laser beam to be emitted from the corresponding laser beam emission ends 81a to 81h. In this case, the predetermined current means a current value of more than a threshold value at which the laser diode starts the laser oscillation.

As another method using the plurality of beam irradiation sources, the fiber array is used. The outline view of a fiber output laser apparatus is shown in FIG. 42.

A laser apparatus 6 comprises a laser diode chip having at least one light emission end, a conductive member for realizing the electrical contact between an electrode of the diode chip and an outer unit, a package section 61 having a heat conduction member for escaping heat from the diode chip to the outside and an optical system for making the laser beams incident onto the optical fibers from the laser diode, and an optical fiber 62 for guiding laser beams to the outer unit.

Then, the laser beam is emitted from an emission end 63 of the optical fiber 62. As shown in FIG. 58, the emission end 63 of the optical fiber 62 has a core portion 64 and a clad portion 65, and the laser beam is output from the core portion 64. Then, the emission ends 63 of the plurality of fibers of the laser device of the plurality of fiber outputs are arranged in an array form and fixed, thereby structuring the fiber array. When the fiber array is used as the beam irradiation sources, the maximum distance between the beam irradiation sources is restricted by an outside dimension of the clad portion 65.

In many cases, it is impossible to arrange the beam irradiation sources, that is, the respective emission ends, to be close to each other without any space in either of the methods of the laser diode array and the fiber array. In order to perform the imaging in the imaging area of the imaging medium without any space, the array must be inclined to the sub-scanning direction S by a predetermined angle θ as shown in FIG. 6. An array 7 comprises eight beam irradiation sources 71a to 71h, and its inclination angle θ is defined by the following equation (1).

$$\cos \theta = d_s / a_s \quad (1)$$

where $a_s$ is a distance between the beam irradiation sources, a light source surface dot distance $d_s$ obtained by converting the central distance between dots, which should be formed to obtain a predetermined resolution in the sub-scanning direction S, to the dimension-at the beam irradiation source surface, and the medium surface dot distance $d_p$ is divided by a magnification of the optical system.

For example, $d_p=10$ μm when resolution is 2540 dpi, and $d_s=40$ μm when the magnification of the optical system is ¼. At this time, the beam diameter is larger than the dot distance $d_p$, preferably about √2 times in order to make it possible completely image the entire surface of the imaging area.

Moreover, in this type of imaging apparatus, Unexamined Japanese Patent Publication No. 5-16320 is known as one of the methods for improving the response of the laser beam sources so as to accelerate the imaging speed. In this method, at an imaging data absent time, a current is made to flow to a value close to a threshold value at which the laser beam sources actuate. Then, in the laser beam sources, time required for switching an imaging data absent state to an imaging data present is reduced.

FIG. 50 shows one example of a characteristic of current-optical output in the laser diode. As shown in the figure, a current value at which the optical output is started to rise is a threshold current $I_{th}$, and a current value at which the imaging is actually executed is an operation current $I_{on}$. At this time, an optical output $P_{on}$ emitted from the laser beam source is an output enough to generate a change in an imaging characteristic between the laser beam irradiation section of the imaging medium and the no-irradiation section thereof. FIG. 62 shows a control signal to be transmitted to a laser diode from a laser beam source driving circuit in the laser beam source control unit, a current value flowing to the laser diode, and a change in the optical output emitted from the laser beam source, respectively, at an imaging operation time.

Unexamined Japanese Patent Publication No. 5-16320 discloses a method for changing the current value at the imaging data absent time to-an extent of the threshold current of the semiconductor laser. In the specification of the above publication, there is a description in which the semiconductor laser beam may be generated if the extent of laser power such that no depression is formed in a plate at the imaging data absent time. However, the above specification does not describe the specific numeral value of what extent of the range is allowable.

FIGS. 63A and 63B show examples of a method for manufacturing an optical fiber array used in the above-mentioned imaging apparatus. As shown in FIG. 63A, a V-shape groove corresponding to the number of optical fibers is formed in an optical fiber support member 3012 so that the optical fibers are arranged in the V-shaped groove. Then, the optical fibers are pressed from the upper portion by a pressing member 3013, and a space between the optical fibers is filled with adhesive to be hardened and combined as one unit. In FIG. 63B, a fixed groove whose width corresponds to the number of optical fibers is formed in the optical fiber support member 3012 so that the optical fibers are arranged in the fixed groove. Then, the optical fibers are pressed from the upper portion by the pressing member 3013, and a space between the optical fibers is filled with adhesive to be hardened and combined as one unit.

According to the inventors' knowledge of the present invention, contrivance is added to sub-scanning means of this type of the optical fiber apparatus, and image data is rearranged. Thereby, the optical fiber apparatus can be arranged in a direction parallel to the sub-scanning direction as in FIG. 64A without being inclined at a predetermined angle as shown in FIG. 64B.

In this case, contrivance to be added to the sub-scanning means denotes as follows. Specifically, when the number of optical fiber emission ends is n, a dot distance necessary for obtaining a predetermined resolution is $d_p$, and a distance between the emission ends projected onto the imaging medium is $a_p$, a magnification 1/h of the optical system is adjusted to establish the relationship $a_p = hd_p$ and the feeding of the sub-scanning means the repetition of the feeding of $d_p$ of (h−1) times and one feeding of $\{na_p−(h−1)d_p\}$.

For realizing such an irregular delivery, it is desirable that the linear motor drive stage be used. The rearrangement of data means a process for adjusting the case in which lines discontinuous to the sub-scanning direction are imaged simultaneously in executing the above-mentioned feeding of the sub-scanning. The manufacturing method of the optical fiber array apparatus in this case is the same as the above-mentioned method, that is, an angle may be changed when the optical fiber array apparatus may be incorporated into the imaging head.

In the imaging head apparatus using the laser beam sources of the optical fiber array type in which all optical fiber emission ends are arranged in a straight line, it is required that all laser beams be satisfactorily condensed on the imaging medium.

In this case, however, a good image area of the optical system, which is used to cover all optical fiber emission ends on both edges, must be enlarged with an increase in the number of the optical fiber emission ends. For this reason, the manufacturing cost of the optical system and its size are increased. When the laser beam sources are inclined to the sub-scanning direction S, timing for imaging the dots at the same position in the main scanning direction is largely shifted in the optical fiber emission ends on both edges. In order to justify the position of the dots in the main scanning direction formed by the above imaging head apparatus, the shift amount must be counted in a manner of an electric circuit. For this reason, the electric circuit for controlling timing of the imaging becomes complicated or expensive with an increase in the number of the optical fiber emission ends to be arranged in a straight line.

In order to solve such a problem, it is considered that the optical fiber emission ends are arrayed in a plurality of rows (optical fiber multiple row). FIGS. 65A and 65B show examples of the array method of the optical fiber emission ends. FIG. 65A is a two-row array like a barrel piling, and FIG. 65B is a three-row array of vertical piling.

The two-row array like a barrel piling is that a second optical fiber array is arranged on a first optical fiber array such that the pitch of the emission ends becomes the same as the first optical fiber row. In this case, the first optical fiber row is formed such that the emission ends of the optical fibers are arrayed with a predetermined pitch. The two-row array like a barrel piling is formed such that the shift in the array direction between the first optical fiber row and the second optical fiber row becomes 0.5 times as large as the predetermined pitch. According to the above array, the convex portions of the other optical fiber row enter the concave portions of one optical fiber row, which are formed since the optical fibers are substantially columnar shape. Thereby, both fiber rows are closely contacted to each other. In the array of vertical piling, there is no shift of the optical fiber rows. In these array methods, the manufacturing method of the optical fiber array is basically the same as the above-mentioned method.

In the case of the two-row array like a barrel piling shown in FIG. 66A, an optical fiber fixed groove, having a width corresponding to the size which is one larger than the number of optical fibers, is formed in the optical fiber support member 3012. Then, the optical fiber row of the first stage and a dummy fiber 3014 are arranged in the fixed groove. Then, the optical fiber row of the second stage is arranged thereon, and pressed from the upper portion by the pressing member 3013, and the space therebetween is filled with adhesive to be hardened and combined as one unit.

In the case of the three-row array of vertical piling of FIG. 66B, an optical fiber fixed groove, having a width corresponding to the number of optical fibers, is formed in the optical fiber support member 3012. Then, the optical fiber row of the first stage is arranged in the fixed groove. Then, the optical fiber of the second stage is arranged thereon through a spacer 3018, and the optical fiber of the third stage is arranged thereon through the space 3018 again. Finally, the optical fibers are pressed from the upper portion by the pressing member 3013, and the space therebetween is filled with adhesive to be hardened and combined as one unit.

The dummy fiber 3014 in the two-row array like a barrel piling and the spacer 3018 in the three-row array of vertical piling are used to stabilize the position of the fibers.

However, in the conventional imaging apparatus using the imaging head in which the plurality of the beam irradiation sources are arranged in an array form, the following problems are present. More specifically, when at least one of the beam irradiation sources is out of order, the apparatus cannot be completely operated until the entire array or the entire imaging head is repaired or replaced. Moreover, when the plurality of beam irradiation sources is formed in the same semiconductor chip at the time of manufacturing the imaging head, all beam irradiation sources become defective if at least one of the beam irradiation sources becomes defective because of local defectiveness in the semiconductor chip. This reduces yield of the imaging head. When the number of beam irradiation sources per one imaging head is increased to improve the performance of the imaging apparatus, the above-mentioned problems become more conspicuous.

When all beam irradiation apparatus are arranged in a straight line, the good image area of the optical system, which is used to cover all optical fiber emission ends on both edges, must be enlarged in order to condense all beams on the imaging medium in accordance with an increase in the number of the optical fiber emission ends . For this reason, there is a problem in which the cost of the optical system and its size are increased. Since the laser beam sources are simultaneously inclined to the sub-scanning direction S, timing for imaging the dots at the same position in the main scanning direction is largely shifted in the optical fiber emission ends on both edges. In order to justify the position of the dots in the main scanning direction formed by the above imaging head apparatus, the shift amount must be counted in a manner of an electric circuit. For this reason, the electric circuit for controlling timing of the imaging becomes complicated or expensive in accordance with an increase in the number of the optical fiber emission ends to be arranged in a straight line.

In the conventional imaging apparatus in which the current is made to flow to the value close to the threshold value at which the laser beam sources actuate at the imaging data absent time in order to improve the response of the laser beam sources and accelerate the imaging speed, the following problem exists. More specifically, the threshold current value $I_{th}$ at which the laser beam sources actuate is considerably smaller than the operation current $I_{on}$ for obtaining outputs enough to generate a change in the imaging characteristic (physical change) such as a change in the physical shape of the imaging medium or a change in solubility to solvent. For this reason, there is a problem in which a reduction in switching time is not largely expected.

As described in Unexamined Japanese Patent Publication No. 5-16320, if a large current value is set to obtain such exposure energy that does not reach sensitivity of the imaging medium even at the imaging data absent time, it can be considered that large improvement can be obtained. However, when the adjacent lines in the main scanning direction are simultaneously imaged using the plurality of laser beam sources according to this method, the following problem may occur. More specifically, at the imaging data present time, it is assumed that exposure energy is set to a value, which is fairly close to the sensitivity of the imaging medium. In this case, there is a possibility that the closest line will be erroneously imaged even in the imaging data absent portion because of the overlap of the irradiation areas of the adjacent laser beam sources.

Also, in the conventional imaging apparatus, the distance between the imaging head including the laser beam sources and the imaging medium must be delicately adjusted. It takes much time to condense the beams on the surface of the imaging medium satisfactorily so as to execute a good imaging. The actual adjustment is a trial-and-error work. Specifically, the imaging result is observed by a magnifying glass, the distance is adjusted by focal adjusting means based on the observation result, and the imaging is executed again. Moreover, the determination cannot be made only by the imaging result, depending on the imaging medium. The estimation can be often performed only after the imaging medium is used as a press plate and the printing is executed. In this case, the imaging post-process and the printing process are further needed. Moreover, the cost and time are required. Even when the thickness of the imaging medium is changed, it is needed that the distance between the imaging head and the imaging medium be adjusted again. In many cases, it is impossible to image a plurality of kinds of imaging mediums having a different thickness by one imaging apparatus since the complicated adjustment work of the distance between the imaging head and the imaging medium must be frequently executed.

In the conventional multi-stage piling array of the optical fibers, the following problem exists.

More specifically, in the two-row array like a barrel piling shown in FIG. 65A, the optical axis of the optical fibers on the second stage (upper stage) in the sub-scanning direction is positioned at just the center of the optical axis of the optical fibers on the first stage (lower stage). As a result, resolution, which is twice as high as the horizontal array of one row, can be obtained. However, in order to execute the imaging in the imaging area of the imaging medium without having any space, the clad diameter must be reduced to a value close to a core diameter. Or, imaging data must be rearranged after adding contrivance to the sub-scanning method as mentioned above. Moreover, in piling the optical fibers on the third stage like a barrel piling manner, since the position of the optical axis of the optical fibers in the sub-scanning direction is coincident with the first stage, the multi-stage piling effect will be lost.

In the array of vertical piling shown in FIG. 65B, the optical fiber array must be inclined at a predetermined angle such that the projection distance between the optical fiber arrays to the sub-scanning direction is constantly maintained. However, the shift amount of each optical array in the sub-scanning direction is defined by only the inclination angle, and the shift of each stage can be neither defined and nor adjusted individually. Therefore, it is difficult to manufacture the optical fiber array having an excellent positional accuracy.

An object of the present invention is to provide an imaging apparatus, which can execute an alternative operation without completely disabling the apparatus when a part of a plurality of beam-irradiation sources is out of order.

Another object of the present invention is-that even when a part of the beam irradiation sources becomes defective because of local defectiveness in the semiconductor chip in the case of forming a plurality of beam irradiation sources in the same semiconductor chip at the time of manufacturing an imaging head, the imaging apparatus can be used with limitations and a considerable reduction in yield can be prevented.

Another object of the present invention is to provide an imaging apparatus having an imaging head having many beam irradiation sources arranged without increasing the cost of an optical system and its size and without complicating an electric circuit for controlling timing of imaging or increasing the manufacturing cost thereof.

Another object of the present invention is to provide an imaging apparatus which can largely reduce time required for changing from an imaging data absent state of the beam irradiation sources to an imaging data present state so as to make it possible to improve imaging speed, and to provide an imaging method in the imaging apparatus for executing imaging using a plurality of beam irradiation sources which can be independently driven.

Another object of the present invention is to provide an imaging apparatus and an imaging method, which does not easily generate an erroneous imaging at an imaging data absent portion caused by setting exposure energy to a value, which is fairly close to the sensitivity of the imaging medium, because of the overlap of irradiation areas of the adjacent laser beam sources.

Another object of the present invention is to provide an imaging apparatus, which can easily execute the adjustment of the distance between an imaging head and an imaging medium.

Another object of the present invention is to provide a multi-stage piling optical fiber array apparatus having an excellent positional accuracy, an imaging head apparatus using such an optical fiber array apparatus, and an imaging apparatus for executing imaging by the imaging head apparatus.

Another object of the present invention is to provide a printing apparatus for executing printing onto a recording medium using an imaging medium imaged by the above imaging apparatus.

DISCLOSURE OF INVENTION

In order to attain the above object, according to the present invention, there is provided an imaging apparatus having a plurality of beam irradiation sources which can be individually driven, said imaging apparatus comprising: n (n=2 or more integer) light source blocks including k (k=2 or more integer) beam irradiation sources; and one or more and below n beam irradiation source driving devices connectable for each block.

According to another embodiment of the present invention, there is provided an imaging apparatus having a plurality of beam irradiation sources which can be individually driven, said imaging apparatus comprising: supporting means for an imaging medium; n (n=2 or more integer) light source blocks including k (k=2 or more integer) beam irradiation sources; at least one or more and below n beam irradiation source driving devices connectable for each block; and scanning means, provided between said light source blocks and said supporting means in a sub-scanning direction, capable of changing a feed amount.

According to another embodiment of the present invention, there is provided the imaging apparatus wherein said respective light source blocks including a plurality of beam irradiation sources arranged in a line.

According to another embodiment of the present invention, there is provided the imaging apparatus wherein said blocks are arranged in the same direction as the direction where the beam irradiation sources of the blocks are arranged.

According to another embodiment of the present invention, there is provided the imaging apparatus wherein said blocks are arranged to have a predetermined angle to the direction where the beam irradiation sources of the blocks are arranged.

According to another embodiment of the present invention, there is provided the imaging apparatus wherein said imaging apparatus including an imaging head manufactured using the light source blocks having at least one of the beam irradiation sources of said blocks is normally operated and at least one of the beam irradiation sources is abnormally operated.

According to another embodiment of the present invention, there is provided the imaging apparatus wherein said beam irradiation sources are emission ends of a laser device formed of a compound semiconductor.

According to another embodiment of the present invention, there is provided the imaging apparatus wherein the beam irradiation sources of one block are formed in the same semiconductor chip.

According to another embodiment of the present invention, there is provided the imaging apparatus wherein all beam irradiation sources are formed in the same semiconductor chip.

According to a favorable embodiment of the present invention, there is provided the imaging apparatus wherein said beam irradiation sources are emission ends of the optical fibers.

According to another embodiment of the present invention, there is provided an imaging method for generating a change in a physical characteristic according to imaging data on an imaging medium by the above imaging apparatus.

According to another embodiment of the present invention, there is provided a printing apparatus for executing printing on a recording medium using an imaging medium imaged by the above imaging.

According to a favorable embodiment of the present invention, there is provided the printing apparatus wherein said imaging apparatus is provided in its interior, and an imaging operation is executed in its interior of the apparatus, thereafter the printing is executed using said imaging medium in its interior of the apparatus.

According to another embodiment of the present invention, there is provided an optical fiber array apparatus including: a plurality of optical fiber rows having emission ends of optical fibers arranged each other in a row with a predetermined pitch and an optical fiber support member for supporting said optical fiber rows, said optical fiber array apparatus comprising: parallel portions closely contacting said optical fiber rows along said optical fiber rows; and restricting portions for restricting movement of said optical fiber rows in their arranging direction so as to position said optical fibers such that a distance between optical axes of the optical fibers at the edge of each of said optical fiber rows in a projection direction forming a predetermined angle to said arranging direction is substantially a constant value.

According to another embodiment of the present invention, there is provided the optical fiber array apparatus wherein two or more parallel portions are provided at said optical fiber support member, and the restricting portions are provided at at least one edge of each of said parallel portions.

According to another embodiment of the present invention, there is provided the optical fiber array apparatus wherein said optical fiber support member comprises one or more optical fiber arranging members, support member of said arranging members, at least one parallel portion and at least one restricting portion are provided to said optical fiber arranging members.

According to another embodiment of the present invention, there is provided the optical fiber array apparatus further comprising at least one another optical fiber row closely contacting the optical fiber row being closely in contact with said parallel portions, and having emission ends of optical fibers arranged each other in a row with a predetermined pitch;

According to a favorable embodiment of the present invention, there is provided the optical fiber array apparatus wherein at least one array of the optical fiber rows being closely in contact with said parallel portions and said another optical fiber row is formed in a barrel-piling manner.

According to another embodiment of the present invention, there is provided an optical fiber array apparatus including: a plurality of optical fiber double rows having a first optical fiber row having emission ends of optical fibers arranged each other in a row with a predetermined pitch and a second optical fiber row closely contacting said first optical fiber row and having emission ends of optical fibers arranged each other in a row with a predetermined pitch, said second optical fiber row arranged at a position shifted by 0.5 times as large as said predetermined pitch in said arranging direction from said first optical fiber row; and an optical fiber support member for supporting said optical fiber double rows, said optical fiber support member comprising: parallel portions closely contacting said first optical fiber rows along said first optical fiber rows; restricting portions for restricting movement of said optical fiber double rows in their arranging direction so as to position said optical fibers such that a distance between optical axes of the optical fibers at the edge of each of said optical fiber rows in a projection direction forming a predetermined angle to said arranging direction is substantially a constant value.

According to a favorable embodiment of the present invention, there is provided the optical fiber array apparatus wherein two or more parallel portions are provided at said optical fiber support member, and the restricting portions are provided at least one edge of each of said parallel portions.

According to a favorable embodiment of the present invention, there is provided the optical fiber array apparatus wherein said optical fiber support member comprises one or more optical fiber arranging members, support members of said arranging members, at least one parallel portion and at least one restricting portion are provided to said optical fiber arranging members.

According to a favorable embodiment of the present invention, there is provided an optical fiber array apparatus including: a plurality of optical fiber rows having emission ends of optical fibers arranged each other in a row with a predetermined pitch and an optical fiber support member for supporting said optical fiber rows, said optical fiber array apparatus comprising: pairs of parallel portions closely contacting each of both sides of said optical fiber rows along said optical fiber rows; and restricting portions for restricting movement of said optical fiber rows in their arranging direction so as to position said optical fibers such that a distance between optical axes of the optical fibers at the edge of each of said optical fiber rows in a projection direction forming a predetermined angle to said arranging direction is substantially a constant value.

According to another embodiment of the present invention, there is provided an imaging head apparatus comprising the optical fiber array apparatus and laser emission ends capable of supplying light to each of optical fibers in said optical fiber array apparatus, and an optical system for condensing laser beams emitted from said optical fiber array apparatus.

According to another embodiment of the present invention, there is provided an imaging apparatus for executing imaging by the above imaging head apparatus.

According to another embodiment of the present invention, there is provided an imaging apparatus for generating a physical change according to imaging data on an imaging medium using a plurality of beam irradiation sources which can be independently driven, said imaging apparatus comprising: a beam irradiation source control device for controlling said beam irradiation sources such that said beam irradiation sources are maintained to be an ON-state at an imaging operation time in an imaging area, an imaging data present portion is irradiated with energy beams having irradiation energy density larger than a sensitivity threshold value of an imaging medium, and an imaging data absent portion is irradiated with energy beams having irradiation energy density smaller than the sensitivity threshold value of the imaging medium; and sub-scanning control device for controlling a sub-scanning means or beam irradiation sources such that the closest lines in the main scanning direction are not imaged simultaneously at said imaging operation time.

According to another embodiment of the present invention, there is provided an imaging apparatus for generating a physical change according to imaging data on an imaging medium using a plurality of beam irradiation sources which can be independently driven, said imaging apparatus comprising: a beam irradiation source control device for controlling said beam irradiation sources such that said beam irradiation sources are maintained to be an ON-state at an imaging operation time in an imaging area, an imaging data present portion is irradiated with energy beams having irradiation energy density being 1.5 to 2.5 times as large as a sensitivity threshold value of an imaging medium, and an imaging data absent portion is irradiated with energy beams having irradiation energy density corresponding to 70% to 90% of the sensitivity threshold value of the imaging medium.

According to another embodiment of the present invention, there is provided the imaging apparatus wherein the beam irradiation sources are controlled to be turned on at a standby position out of the imaging area before starting said imaging operation, and an imaging head is controlled to be moved into the imaging area after a rotation speed of an imaging medium support drum reaches a stable rotation speed at the imaging operation time.

According to another embodiment of the present invention, there is provided the imaging apparatus wherein an energy beam heat discharge member is provided at a position which is within a beam irradiation allowable portion of said beam irradiation sources at said standby position, and which is a position where the irradiation beam density is $1/10$ or less than irradiation energy density at a focal position.

According to another embodiment of the present invention, there is provided the imaging apparatus wherein an imaging head is controlled to be moved into the imaging area before starting said imaging operation, and the beam irradiation sources are controlled to be turned on in the imaging area after a rotation speed of an imaging medium support drum reaches a stable rotation speed at the imaging operation time.

According to another embodiment of the present invention, there is provided the imaging apparatus wherein said beam irradiation sources are emission ends of a laser device formed of a compound semiconductor.

According to a favorable embodiment of the present invention, there is provided the imaging apparatus wherein said beam irradiation sources are emission ends of the optical fibers.

According to another embodiment of the present invention, there is provided an imaging method for generating a change in a physical characteristic according to imaging data on an imaging medium by the above imaging apparatus.

According to another embodiment of the present invention, there is provided a printing apparatus for executing printing on a recording medium using an imaging medium imaged by the above imaging apparatus.

According to another embodiment of the present invention, there is provided the printing apparatus wherein said imaging apparatus is provided in its interior, and an imaging operation is executed in its interior of the apparatus, thereafter the printing is executed using said imaging medium in its interior of the apparatus.

According to another embodiment of the present invention, there is provided an imaging apparatus for generating a physical change according to imaging data on an imaging medium using beam irradiation sources, said imaging apparatus comprising: imaging medium support means; beam irradiation means for projecting energy beams modulated in accordance with imaging data onto the imaging medium attached to said imaging medium support means; and focal position adjusting means for adjusting the positional relationship between said beam irradiation means provided in said imaging medium support means in accordance with the position on said imaging medium and said imaging medium.

According to another embodiment of the present invention, there is provided an imaging apparatus for generating a physical change according to imaging data on an imaging medium using beam irradiation sources, said imaging apparatus comprising: imaging medium support means; beam irradiation means for projecting energy beams modulated in accordance with imaging data to the imaging medium attached to said imaging medium support means; a focal position detecting member, provided in said imaging medium support means in accordance with the position on said imaging medium, having an energy passage line where a passage state of said energy beams changes in accordance with a focal state of said energy beams; a detector for measuring the energy beams passed through said focal position detecting member; and focal position adjusting means for adjusting the positional relationship between said beam irradiation means and said imaging medium.

According to another embodiment of the present invention, there is provided the imaging apparatus further comprising focal position controlling means for controlling an operation of said focal position adjusting means in accordance with an output value of said focal position detecting means.

According to a favorable embodiment of the present invention, there is provided the imaging apparatus, wherein said energy passage line is substantially a rectangular opening portion for passing energy, and the position of the sub-scanning direction of one of sides of said opening portion in the sub-scanning direction is set to a position substantially equal to the central axis of the energy beam at a focal position adjusting time.

According to another embodiment of the present invention, there is provided the imaging apparatus wherein said energy passage line is substantially a circular opening portion for passing energy, and a diameter of said opening portion is 0.9 to 1.1 times as large as a beam diameter of the energy beam at the focal position.

According to another embodiment of the present invention, there is provided the imaging apparatus wherein said energy passage line is periodically set in the main scanning direction.

According to a favorable embodiment of the present invention, there is provided the imaging apparatus wherein said detector has energy detecting elements divided in the sub-scanning direction in a state that a central axis of the energy beam is used as reference, and outputs of the energy beams being incident on the respective portions of said energy detecting elements are separately detectable.

According to another embodiment of the present invention, there is provided an imaging apparatus for generating a physical change according to imaging data on an imaging medium using beam irradiation sources, said imaging apparatus comprising: imaging medium support means; beam irradiation means for projecting energy beams modulated in accordance with imaging data to the imaging medium attached to said imaging medium support means; focal position detecting means moving with said beam irradiation means as one unit; and focal position adjusting means for adjusting the positional relationship between said beam irradiation means and said imaging medium.

According to a favorable embodiment of the present invention, there is provided the imaging apparatus wherein said focal position detecting means is a laser typed displacement sensor.

According to a favorable embodiment of the present invention, there is provided the imaging apparatus, wherein said focal position detecting means is an eddy current typed displacement sensor.

According to a favorable embodiment of the present invention, there is provided the imaging apparatus wherein said focal position detecting means is an electrostatic capacitance typed displacement sensor.

According to another embodiment of the present invention, there is provided the imaging apparatus wherein said focal position adjusting means operates said beam irradiation means in a direction intersecting at right angles with both the main scanning direction and the sub-scanning direction with respect to said imaging medium fixed to the imaging medium support means so as to adjust the positional relationship between said beam irradiation means and said imaging medium.

According to another embodiment of the present invention, there is provided the imaging apparatus wherein said focal position adjusting means is an X-stage with a micrometer.

According to another embodiment of the present invention, there is provided the imaging apparatus wherein said focal position adjusting means is an X-stage driven by a stepping motor.

According to a favorable embodiment of the present invention, there is provided the imaging apparatus wherein said focal position adjusting means is an X-stage driven by a linear motor.

According to another embodiment of the present invention, there is provided the imaging apparatus wherein said imaging medium support means is a drum.

According to another embodiment of the present invention, there is provided the imaging apparatus wherein the plurality of said beam irradiation sources, which can be independently driven, are used.

According to another embodiment of the present invention, there is provided the imaging apparatus wherein said beam irradiation sources are emission ends of a laser device formed of a compound semiconductor.

According to another embodiment of the present invention, there is provided the imaging apparatus wherein said beam irradiation sources are emission ends of the optical fiber.

According to another embodiment of the present invention, there is provided an imaging method for executing imaging by the above imaging apparatus.

According to another embodiment of the present invention, there is provided a printing apparatus for executing printing using an imaging medium imaged by the above imaging apparatus.

According to a favorable embodiment of the present invention, there is provided the printing apparatus wherein said imaging apparatus is provided in its interior, and an imaging operation is executed in its interior of the apparatus.

In the present invention, the imaging medium denotes a film or a plate having a multi-stage piling structure including a layer showing specific reactions to the irradiation of the beam irradiation sources such as laser beam sources. In many cases, the specific reactions are classified into a photon mode and a heat mode depending on the difference in the reaction.

In the case of the photon mode, in a layer showing the specific reaction, that is, a photosensitive layer, an imaging characteristic such as solubility to specific solvent is changed by optical energy of the beams. In other words, for example, a soluble property is changed to an insoluble property, or an insoluble property is changed to a soluble property. Also, there is a possibility that a change in light transmittance, and occurrence of an affinity for specific solution in the surface layer will be brought about. Then, a developing process using specific solvent is added after an imaging process, so that an original film or a press plate is formed.

In the case of the heat mode, the layer showing the specific reaction, that is, a heat sensitive layer is removed by heat energy of the beams, or the heat sensitive layer is likely to be removed. When the layer is not completely removed by only the beam irradiation, a physical post-process is added thereto, so that the layer is completely removed. Thus, physical projections and depressions are generated, and the press plate is formed.

The imaging medium is not limited to the press plate for printing and the original film. For example, the recording medium to be finally printed (e.g., photographic printing paper) may be used. Or, there may be used the photosensitive member such as an electrophotographic printer in which the image is once formed and-transferred to the final recording medium. Also, the display elements may be used.

As the press plate for printing, as described in Unexamined Japanese Patent Publication No. 6-186750, there is favorably used the press plate comprising a substrate, a heat sensitive layer (or photosensitive layer) formed thereon, and a surface layer formed on the heat sensitive layer wherein the heat sensitive layer has a different affinity from the surface layer for printing liquid such as ink or liquid of ink repulsion (dampening water). Also, a primer layer is formed between the heat sensitive layer (photosensitive layer) and the substrate, and the difference in the affinity may be provided between the primer layer and the surface layer. As the heat sensitive layer for the heat mode, material in which carbon black is diffused to nitrocellulose, or the metal film such as titanium is favorably used.

Thus, in the specification of the present invention, the properties such as the shape, the chemical affinity, and optical properties such as light transmittance, which differs depending on the portion subjected to the beam irradiation or the portion subjected to non-beam irradiation, are referred to as imaging properties or physical properties of the imaging medium and the change in such properties is particularly referred to as a physical change.

In the present invention, the "beam irradiation sources" include sources for generating a beam of light (including electromagnetic waves such as ultraviolet rays, visible radiation, infrared rays,) such as a laser beam, and a generation source of particle beams such as electron beams. Also, other than the beams having the define directivity, the following sources are included in the "beam irradiation sources" of the present invention. Specifically, there are included all sources, which can resultingly cause the change in the imaging properties in the minute portion of the imaging medium by the discharge of such as a stylus electrode used in an electrostatic printer.

The most favorable beam irradiation sources are emission ends of optical fibers which are connected and coupled to the laser light sources or the emission ends of the light sources. To miniaturize the apparatus, a semiconductor laser is favorably used as the beam irradiation source. To obtain high power, a gas laser such as an argon ion laser, a carbon dioxide laser, or a solid laser such as a YAG laser is favorably used. Also, "beam irradiation means" denotes means including the beam irradiation sources and the optical system for projecting beam irradiation obtained from the beam irradiation sources to the imaging medium. Optical guides such as a reflector, a lens system, a rod lens system can be included other than the beam irradiation sources.

In the present invention, the "linear stages" indicates a "linear motor typed linear stage" or a "ball screw typed linear stage." The linear motor typed linear stage is a stage, which has no mechanical transmission mechanism, which needs play such as a gear, a ball screw in the intermediate portion between an actuator such as a motor and a moving object, in the movable stage. For example, in the linear motor, the movable stage is moved along the linear guide by a repulsion force and a suction force of a permanent magnet or an electromagnet, thereby reducing the generation of play. By such a driving principle, even when the intermittent driving is performed, the high positional accuracy can be obtained, and the moving distance can be dynamically varied. In other words, the moving distance can be relatively easily varied for each driving operation.

On the other hand, in the ball screw typed linear stage, the movable stage is connected through the mechanical transmission mechanism, which needs play, such as the ball screw and the gear rotatable in the linear guide. Then, the mechanism is rotated by a stepping motor so as to move the movable stage. In the ball screw typed linear stage, the positional shift easily occurs in the repetitive operation of stop and move such as the intermittent driving because of the property of the mechanical transmission mechanism for which play is indispensable. In many cases, the continuous driving of the ball screw typed linear stage is generally executed at a fixed speed. However, the ball screw typed linear stage has an advantageous in the point that the cost of the driving devices and the material is relatively low as compared with the linear motor typed linear stage, which needs the expensive driving devices due to the complicated driving system and the expensive material of the permanent magnet.

Demerits caused when the continuous driving of the linear stage is executed will be explained as follows. Specifically, when the imaging head is continuously moved in the direction of the rotation axis of the medium support drum at a fixed speed while continuously rotating the medium support drum at an uniform speed, there is a problem in which an image is diagonally formed with respect to a reference direction of the original imaging area of the imaging medium.

In other words, in the imaging apparatus 9 as shown in FIG. 59, it is assumed that the imaging medium 98 is rotated in a direction R (rotational direction of the medium support drum 91) at a circumferential speed Vx and the imaging head 92 is moved in a direction S (direction of the rotation axis of the medium support drum 91) at a feeding speed Vy. In this case, as shown in FIG. 60A, it would be ideal if imaging dots 102 formed in an imaging area 101 would be arranged along the direction of the imaging area 101 in a matrix form of a rectangle.

However, the imaging apparatus 9 scans the imaging head in the direction of the rotation axis as rotating the medium support drum. For this reason, the imaging medium 98 is fixed to the medium support drum 91 such that the reference direction of the imaging area becomes parallel to the rotation axis of the medium support drum 91. Also, the scanning direction of the imaging head completely conforms to the S direction (δ=0 in the figure). At this time, the imaging dots 102 are changed to be a parallelogram as shown in FIG. 60B.

Generally, in the imaging apparatus 9, the following method is used to prevent the image on the imaging medium 98 from being a parallelogram. More specifically, the feeding direction of the imaging head is inclined by δ in advance in a state in which the central portion of the image allowable range of the imaging apparatus is set as a center and the rotation axis of the medium support drum 91 and the beam irradiation direction are set as axes. As a result, as shown in FIG. 60C, the image is formed to be inclined by δ with respect to the reference direction of the original imaging area 101 of the imaging medium 98. If the linear motor typed linear stage, which is capable of intermittently driving, is used in the scanning of the imaging head 92, there occurs no problem in which the image is inclined.

In the specification of this invention, excepting for the case in which the discussion of the above problem is made, there is a case in which the direction of the rotation axis of the imaging medium support drum and the sub-scanning direction are not distinguished from each other, or regarded as substantially the same as each other for the sake of convenience even when such inclination δ is present.

In the present invention, "scanning means" denotes means for relatively moving the imaging medium and the directional position of the beam. The scanning using the rotation of the drum, and the scanning using beam deflecting means such as a polygon mirror are used as the scanning means other than the above-mentioned linear stage. Particularly, when the supporting means of the imaging medium is the drum, the rotation of the drum is preferably used as the main scanning means and the linear stage is preferably used as the sub-scanning means. When the supporting means is a flat bed member, the beam deflecting means other than the linear stage is preferably used as the main scanning means and the linear stage is mainly used as the sub-scanning means preferably.

In the present invention, the "feed amount" means the distance where the stage moves after the imaging for one circumference is executed in the main scanning direction in the case of using the linear motor typed linear stage. Also, the "feed amount" means the distance where the stage moves while one rotation of the medium support drum is performed in the case of using the ball screw typed stage.

In the specification of this invention, the portion of the imaging medium where the change of the imaging characteristic (physical change) should be generated is referred to as the imaging data present portion. The portion of the imaging medium where the change of the imaging characteristic (physical change) should not be generated is referred to as the imaging data absent portion. In many cases, the portion where the change in the imaging characteristic on the imaging medium is generated is formed as imaging dots on the final recording medium such as paper. Conversely, because of the difference in the affinity for liquid such as ink or liquid of ink repulsion of the imaging medium, there is a possibility that the portion where the change in the imaging characteristic on the imaging medium is not generated will be formed as imaging dots on the final recording medium.

In the present invention, "focal position detecting means" is means for detecting the distance between the imaging head including the beam irradiation sources and the imaging medium. Actually, the distance between the imaging medium or the imaging medium support member and the displacement sensor head is detected using the displacement sensor. Then, the distance between the imaging head and the imaging medium is calculated from the positional relationship among the displacement sensor, the imaging head and the imaging medium or the imaging medium support member.

As the distance measuring principle of the displacement sensor, there are used an optical system using the laser utilizing optical interference, beat etc., an eddy current system for detecting the change in the eddy current, an electrostatic capacitance type for detecting the change in the electrostatic capacitance are used. In addition, there is a system using an energy passage line to directly detect the focal state of the beams for imaging to be described later. The focal position detecting means may be combined with the beam irradiation sources for imaging, the imaging medium or the supporting means.

Any embodiment can be used as any one of focal position detecting means. In the case of the optical system, the eddy current system and the electrostatic capacitance system, the combination with the beam irradiation sources can be easily used. In the case of the system using the energy passage line, the combination with the imaging medium or the support means can be easily used in the transmission type, and the combination with the beam irradiation sources can be easily used in the reflection type.

In the present invention, the "energy passage line" is that a part or all energy beams irradiated are transmitted or reflected. At this time, the magnitude, the direction, the phase of the transmitted energy or the reflected energy are changed, depending on a state that focus is achieved or a state that focus is not achieved. Specifically, there is provided an opening portion, and all energy beams are transmitted through the opening portion in the focal state. If the focus is shifted, the passage of the part of the energy beams is shifted from the opening portion, and the transmittance state of the energy beams is changed. Also, the lens and the reflecting mirror can be also used as the energy passage line. In this case, the magnitude and the direction of the energy beams to be transmitted or reflected are changed, depending on the focal state.

BRIEF DESCRIPTION OF DRAWINGS

FIG. 10 is a view showing the arrangement of beam irradiation sources of one embodiment of an imaging apparatus of the present invention;

FIG. 14 is a view showing the movement of the laser beam in the main scanning direction according to one embodiment of an imaging apparatus of the present invention;

FIG. 15 is a view showing the imaging dot formation of one embodiment of an imaging apparatus of the present invention;

FIG. 21 is a schematic view showing focal adjusting means of one embodiment of an imaging apparatus of the present invention;

FIGS. 31A to 31E are views showing the manufacturing process of one embodiment of an optical fiber array apparatus of the present invention;

FIG. 62 is a view showing a switching waveform of prior art;

BEST MODE FOR CARRYING OUT THE INVENTION

First of all, the following will explain an embodiment of an imaging apparatus of the present invention which can immediately and easily perform an alternative operation without disabling the operation of the apparatus when a part of a plurality of beam sources is out of order.

Figure 1:
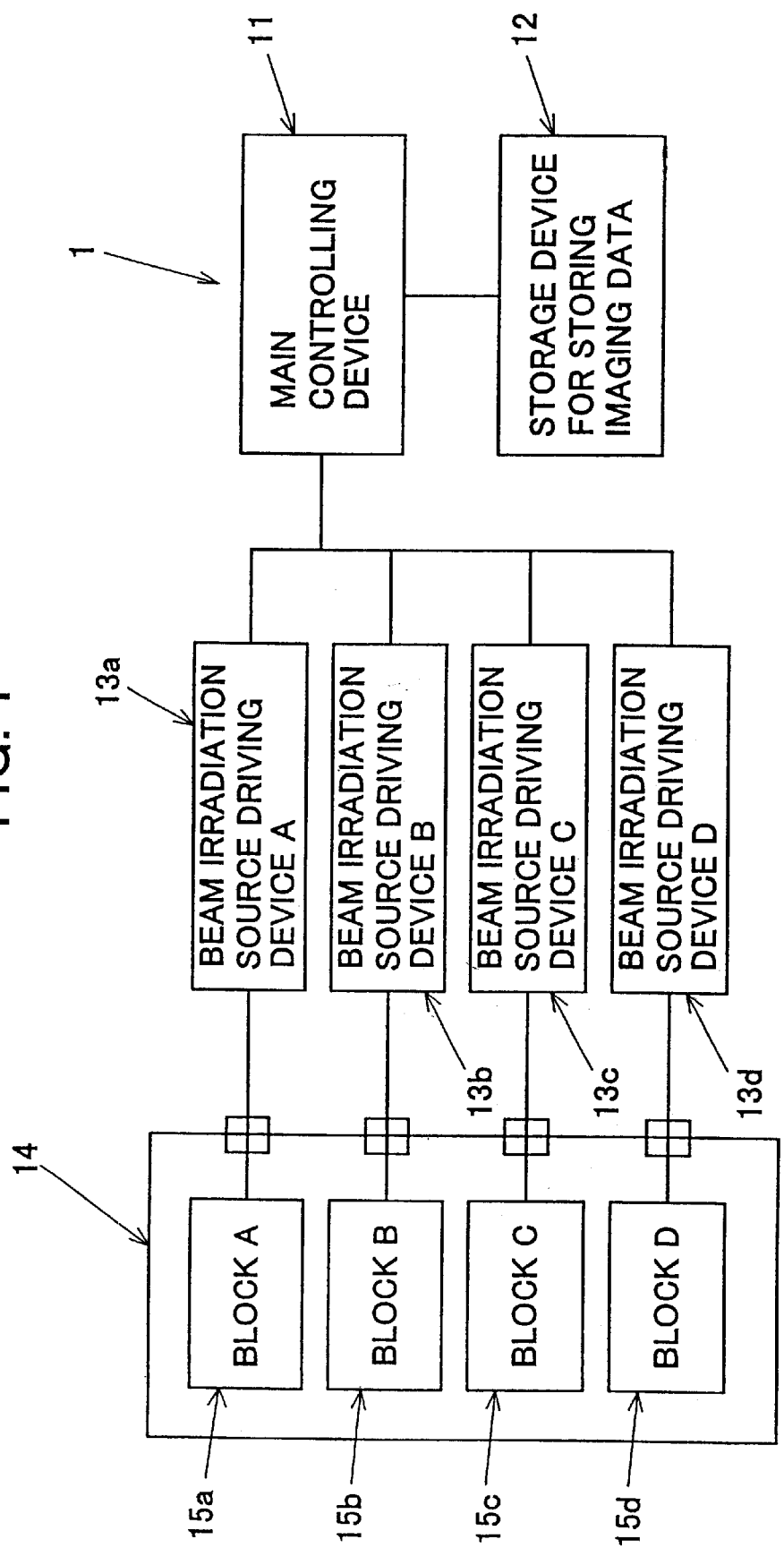
FIG. 1 is a block diagram of one embodiment of an imaging apparatus of the present invention.

FIG. 1 shows a block diagram of an example of the embodiment of the imaging apparatus of the present invention. In an imaging apparatus 1, the imaging head 14 includes four light source blocks A to D (15a to 15d), and each light source block includes k (k is 2 or more integer) beam irradiation sources (not shown). The respective light source blocks are connected to beam irradiation source driving devices A to D (13a to 13d) in a block unit, respectively. In the respective beam irradiation source devices A to D, at least k beam irradiation source driving circuits are included. The respective beam irradiation source driving devices and an imaging data storing memory 12 are connected to a main control device 11.

At an imaging operation time, the main control device 11 transmits a signal for switching the respective irradiation sources to the respective beam irradiation source driving devices A to D (13a to 13d) in accordance with imaging data. This signal transmission is executed with reference to imaging data stored in the imaging data storing memory 12. The respective beam irradiation driving devices drive the corresponding beam irradiation sources upon reception of the signal. In this embodiment, the number of light source blocks n included in the imaging head is 4. Actually, if the number of light source blocks is two or more, any number is possible. The preferable range is 4 to 8.

Figure 2:
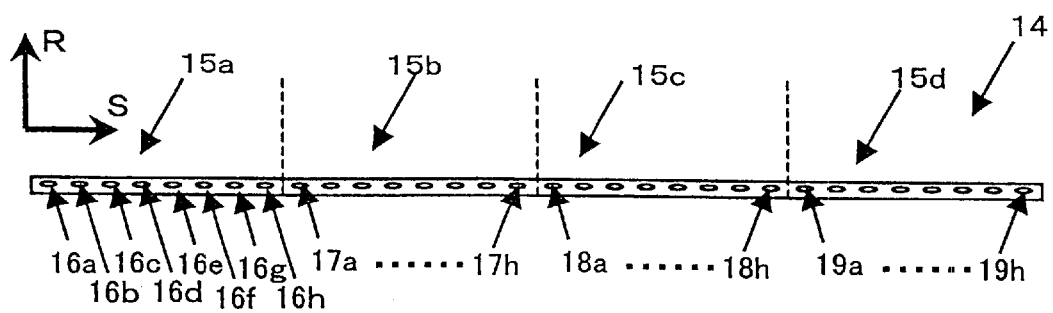
FIG. 2 is a view showing the arrangement of beam irradiation sources of one embodiment of an imaging apparatus of the present invention.

FIG. 2 is an example 1 showing the arrangement of light source blocks in the imaging head 14. In each block, eight beam irradiation sources (16a to 16h, 17a to 17h, 18a to 18h, 19a to 19h), which are arranged in a straight line, are provided. Each light source block is arranged in the same direction as the direction where the beam irradiation sources of the light source blocks are arranged.

In this example, the number of beam irradiation sources k of one block is eight. In actual, if the number of beam irradiation sources is two or more, any number is possible. The preferable range is 4 to 16.

Figure 3:
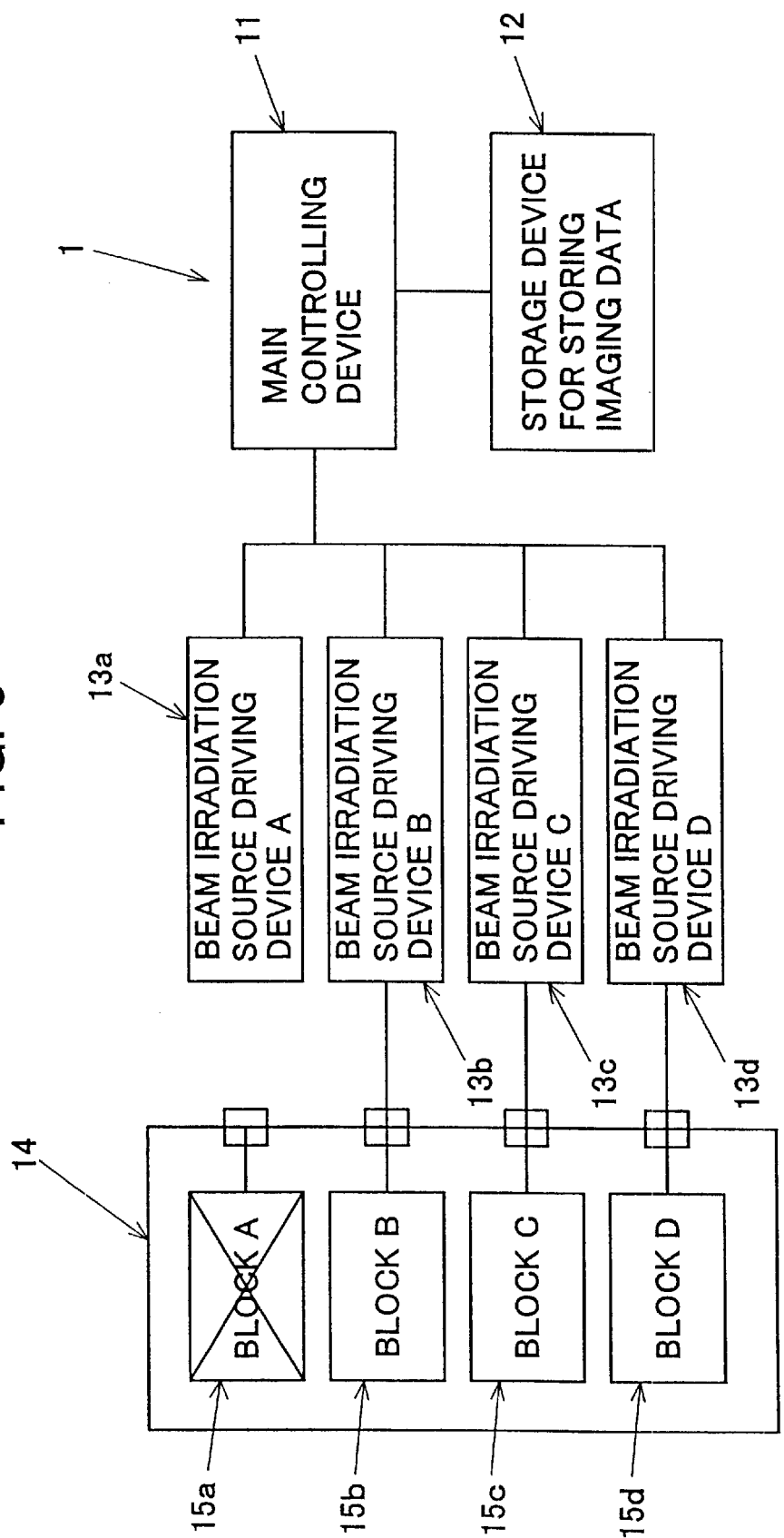
FIG. 3 is a block diagram showing an alternative operation when a part of the beam irradiation sources of one embodiment of an imaging apparatus of the present invention is out of order.

As shown in FIG. 3, it is assumed that one beam irradiation source of the block A (15a) is out of order in the imaging apparatus 1.

In the conventional imaging apparatus, when at least one of the beam irradiation sources is out of order, the apparatus cannot be completely operated until the entire array or the entire imaging head is repaired or replaced.

In the imaging apparatus 1 of the present invention, however, the block A (15a) and the beam irradiation driving device A (13a) are separated from each other. Then, software for outputting imaging data of the main control device 11 is changed from software for all four blocks to one for three blocks, and blocks B to D (15b to 15d) are used. Thereby, in the imaging apparatus 1, the imaging speed is reduced to ¾, but the imaging operation can be continued without stopping the apparatus.

Generally, when one block on both sides is out of order in the imaging apparatus having n blocks, the imaging speed is reduced to (n−1)/n, but the imaging operation can be continued without stopping the apparatus. At this time, the optical system incorporated into the imaging head is designed such that the beams sent from all light source blocks can be condensed in the same manner so as to condense the beams emitted from the beam irradiation sources onto the imaging medium. For this reason, the mechanical readjustment of the optical system is not needed, and the feed amount of the linear stage at the time of imaging operation may be changed to (n−1)/n times as large as an initial value in software. Similarly, when at least one light source block is normally operated, software for outputting imaging data corresponding to the block arrangement and software for controlling the feed amount in the sub-scanning direction are prepared. As a result, the imaging speed is reduced, but the imaging operation can be continued without stopping the apparatus.

Figure 4:
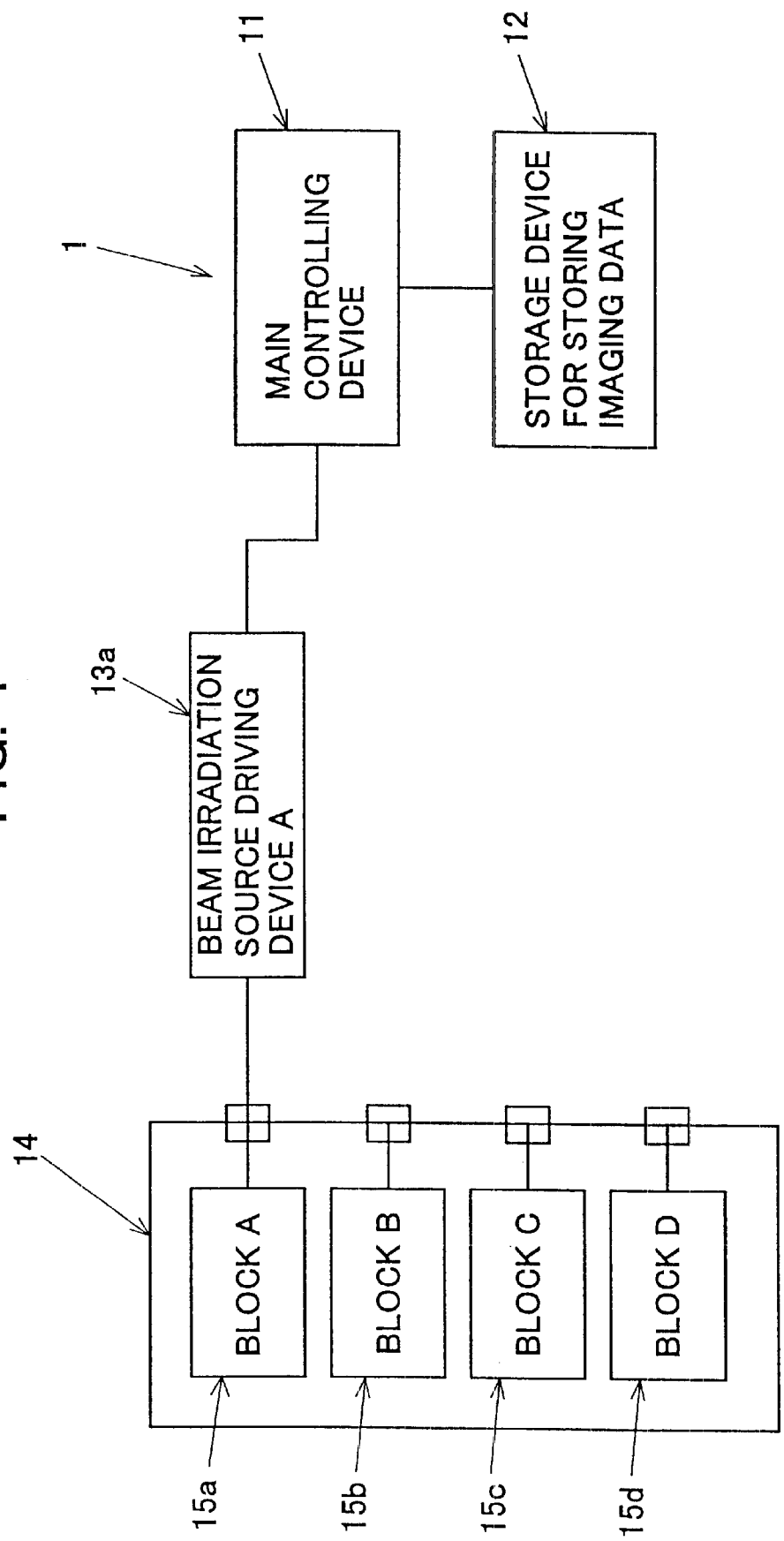
FIG. 4 is a block diagram showing an application of an imaging head of one embodiment of an imaging apparatus of the present invention.

Also, in consideration of the cost reduction, the imaging head 14 of the present invention can be applied to the imaging apparatus in which the imaging speed is restrained. More specifically, as shown in FIG. 4, if only one beam irradiation source driving device is connected to, use one (block A in the figure) of four blocks, the imaging head 14 can be directly applied. At this time, the number of expensive beam irradiation driving devices may be one and the electric circuit and the software of the main control device 11 can be simplified, thereby making it possible to realize the cost reduction.

When the beam irradiation source of the block in use is out of order, another normal light source block is connected to the beam irradiation source driving device, thereby easily making it possible to reproduce the imaging apparatus having the same specification. At this time, the optical system incorporated into the imaging head is designed such that the beams sent from all light source blocks can be condensed in the same manner so as to condense the beams emitted from the beam irradiation sources onto the imaging medium. For this reason, if software for compensating for the position of each beam irradiation source is prepared, the mechanical readjustment of the optical system, which takes much time, is not needed.

When it is found out that a part of the beam irradiation sources is defective at the imaging head manufacturing stage, the imaging head or the entire array becomes a defective good in the conventional imaging apparatus.

In the imaging apparatus of the present invention, however, even if one beam irradiation source of a certain block becomes defective, the beam irradiation source can be used if the beam irradiation sources of the other light source blocks are normal. In this case, the beam irradiation source is used as an imaging apparatus whose imaging speed is restrained in consideration of the above-mentioned cost reduction. Therefore, it is possible to save the imaging head or the array with limitations, and the yield reduction can be prevented.

Figure 5:
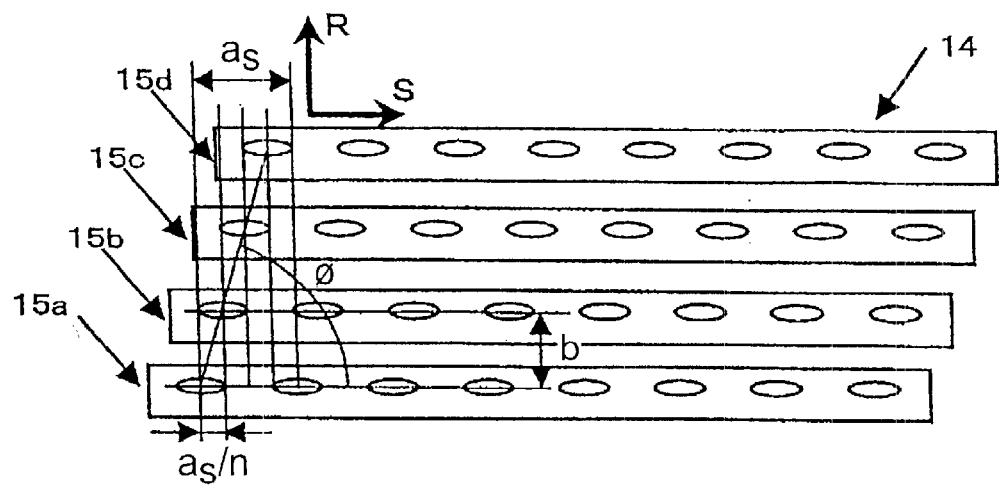
FIG. 5 is a view showing the arrangement of beam irradiation sources of one embodiment of an imaging apparatus of the present invention.

FIG. 5 is an example 2 showing the arrangement of light source blocks in the imaging head 14. In each block, k (eight in the figure) beam irradiation sources are arranged in a straight line. Each block is arranged to have a predetermined angle φ to the direction where the beam irradiation sources of the blocks are arranged. In such an arrangement, the number of light source blocks n and that of beam irradiation sources k of the light source blocks are preferably the same as each other, and 4 to 16 are preferable. The predetermined angle φ is defined by the following equation (2).

$$\tan \phi = n \cdot b / a_s \quad (2)$$

where $a_s$ is a distance between the beam irradiation sources of the light source blocks in the sub-scanning direction, and b is a distance between the respective light source blocks in the main scanning direction. In the equation, n corresponds to the number of light source blocks (four in FIG. 5) in the imaging head.

Figure 6:
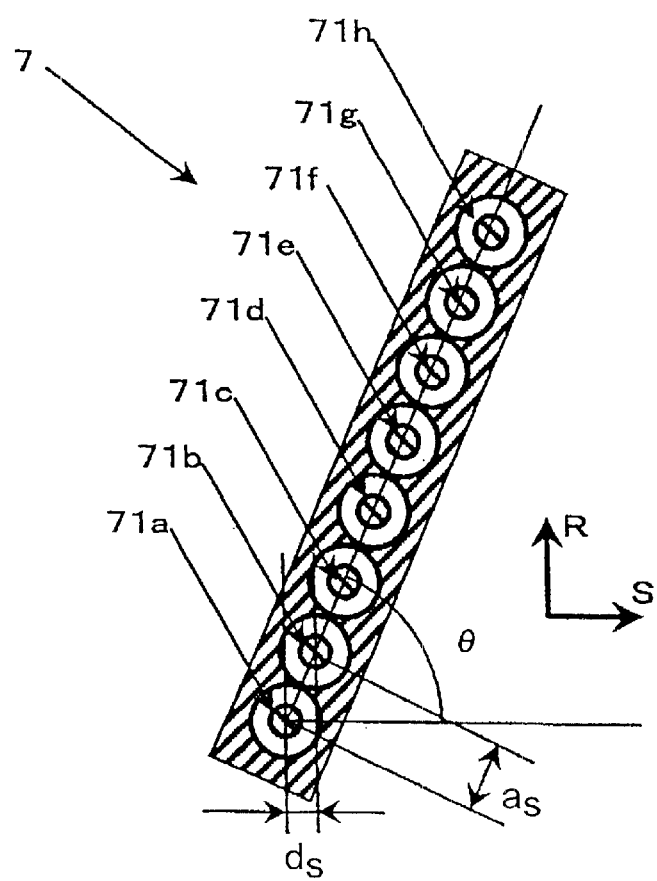
FIG. 6 is an arrangement view showing that the beam irradiation sources of one embodiment of an imaging apparatus of the present invention are arranged in an inclined manner.

In the case of the above arrangement of beam irradiation sources, the entire imaging area can be imaged without inclining the array to the sub-scanning direction as shown in FIG. 6. At this time, a medium surface dot distance $d_p$ can be obtained by multiplying a light source surface dot distance $d_s = a_s/n$ by a magnification of the optical system. Also, in such an arrangement, the good image area, which is required for the optical system, can be reduced to an extent that a size corresponding to one block is sufficiently included as compared with the case in which all beam irradiation sources are arranged in a straight line. Therefore, a large amount of beam irradiation sources can be arranged without increasing the cost of the optical system and the size thereof.

Since the shift amount of the beam irradiation sources in the main scanning direction can be reduced to (n−1) b, many beam irradiation sources can be arranged without complicating the electric circuit for controlling timing of imaging with the shift or without increasing the manufacturing cost. In this embodiment, though the inclination angle of the light source block to the sub-scanning direction is 0, an inclination is sometimes added in order to obtain a desired resolution. In this case, the inclination angle can be set to a small value as compared with the case in which all beam irradiation sources are arranged in a straight line. Therefore, the advantage is unchanged in terms of the point of designing and manufacturing the optical system and the electric circuit for controlling timing.

Next, it is assumed that the beam irradiation sources of the block A (15a) are out of order in the imaging apparatus 1.

When at least one of the beam irradiation sources is out of order in the conventional imaging apparatus, the apparatus cannot be completely operated until the entire array or the entire imaging head is repaired or replaced. However, in the imaging apparatus 1 of the present invention, the following two alternative operations can be executed.

Figure 7:
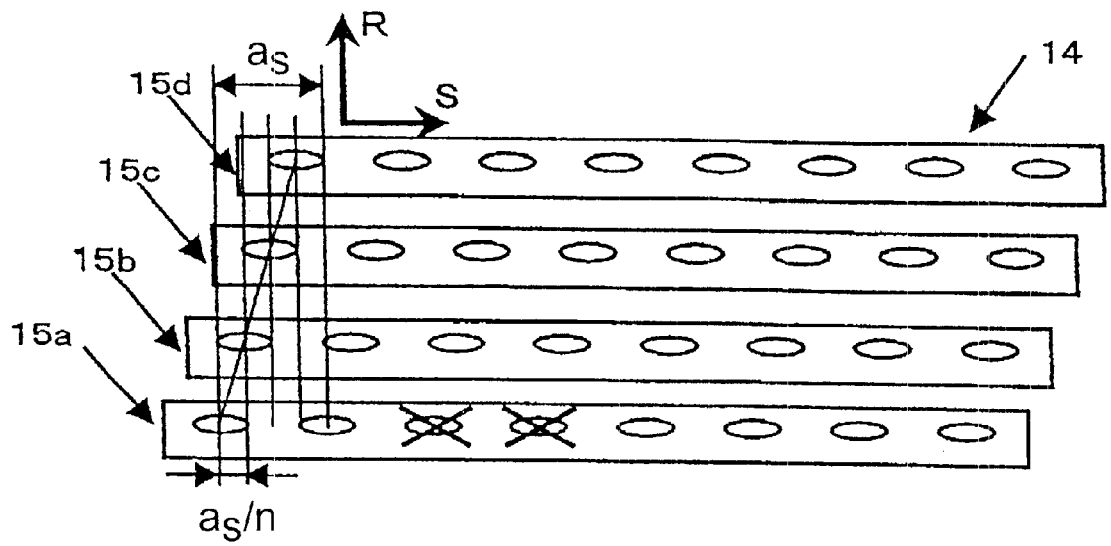
FIG. 7 is a view showing a state in which a part of the beam irradiation sources of one embodiment of an imaging apparatus of the present invention is out of order.

More specifically, the first alternative operation is that the feed amount of the imaging head in the sub-scanning direction and software for outputting image data are changed in accordance with the position of the troubled beam irradiation source. It is assumed that third and fourth beam irradiation sources of the light source block A are out of order as shown in FIG. 7. The feed amount is changed to $2a_p$, $6a_p$, $2a_p$, $6a_p$, . . . $2a_p$, $6a_p$, sequentially, and the software is also changed to one for outputting data in accordance with the change in the feed amount. In this case, the imaging speed is reduced to ½, but the imaging operation can be continued without stopping the imaging apparatus 1.

Figure 8:
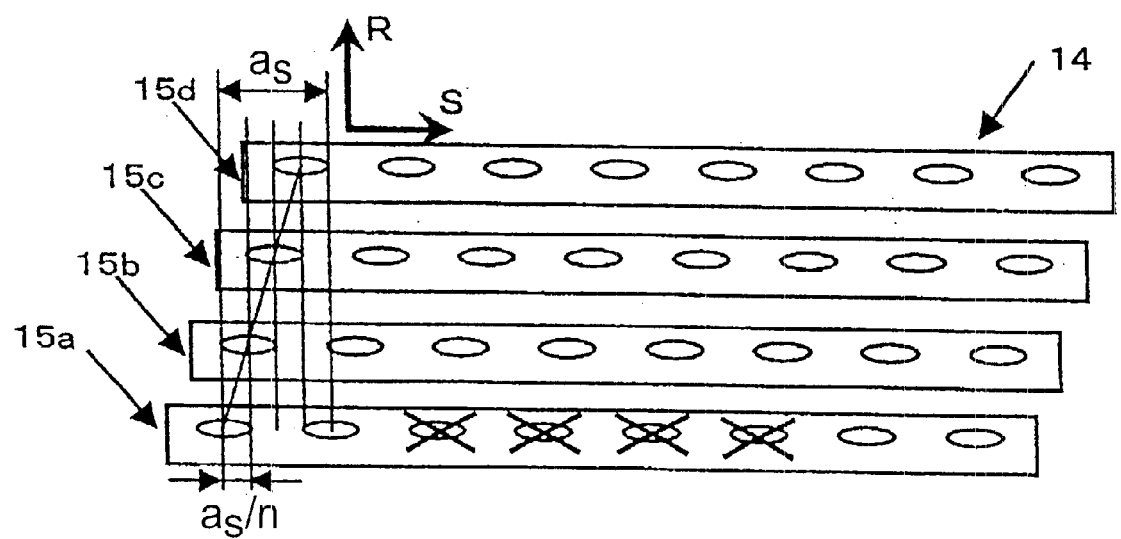
FIG. 8 is a view showing a state in which a part of the beam irradiation sources of one embodiment of an imaging apparatus of the present invention is out of order.

Here, $a_p$ is a value obtained by multiplying the light source distance $a_s$ by a magnification of the optical system, and indicates a distance between the beam irradiation sources at the imaging medium surface. It is assumed that third to sixth beam irradiation sources of the light source block A are out of order as shown in FIG. 8. The feed amount is changed to $2a_p$, $2a_p$, $4a_p$, $2a_p$, $2a_p$, . . . $2a_p$, $2a_a$, $4a_p$, sequentially, and the software is also changed to one for outputting data in accordance with the change in the feed amount. In this case, the imaging speed is reduced to ⅓, but the imaging operation can be continued without stopping the imaging apparatus 1.

In the imaging apparatus whose number of beams of one block is k, when all beam irradiation sources are normally operated, the imaging is executed by repeating one feeding with the feed amount $ka_p$ in the sub-scanning direction. On the other hand, when the beam irradiation sources are out of order, the feeding in the sub-scanning direction is repeated h times (h is an integer of two or more and below k) so as to cover the troubled beam irradiation sources, thereby realizing the imaging of the entire area. In this case, each feed amount is an integral multiple of $a_p$, the total feed amount h times is $ka_p$, and imaging time multiplies h-fold. However, the imaging operation can be continued without stopping the imaging apparatus. In this case, it is unnecessary to readjust the positions of the beam irradiation sources. It is noted that the first alternative operation can be realized when the linear motor typed linear stage is used.

Figure 9:
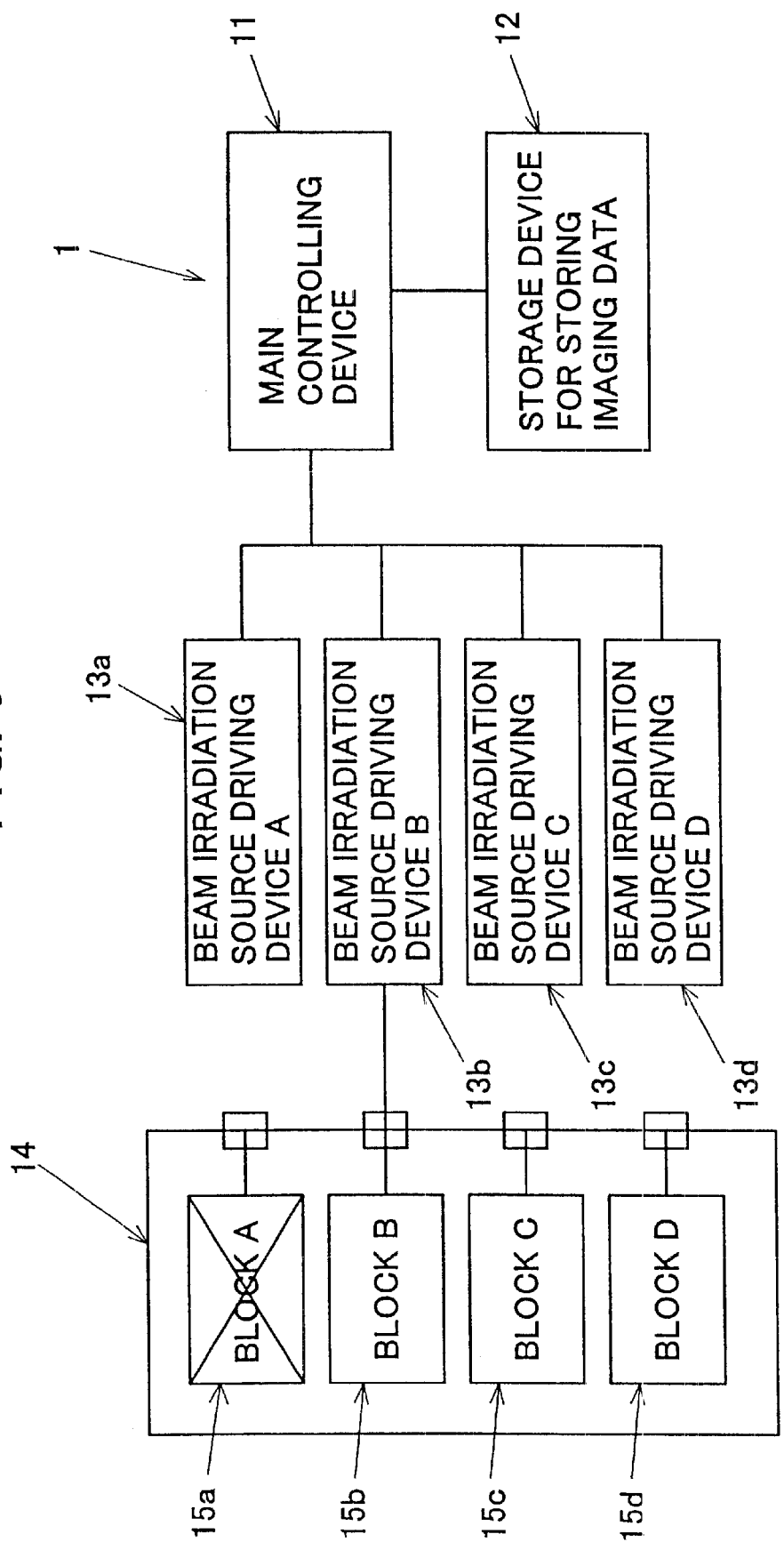
FIG. 9 is a block diagram showing an alternative operation when a part of the beam irradiation sources of one embodiment of an imaging apparatus of the present invention is out of order.

The second alternative operation will be explained as follows. More specifically, as shown in FIG. 9, the block A (15*a*) and the beam irradiation source driving device A (13*a*) are separated from each other. Also, a block C (15*c*) and a beam irradiation source driving device C (13*c*) are separated from each other. Moreover, a block D (15*d*) and a beam irradiation source driving device D (13*d*) are separated from each other. Then, the software for outputting imaging data of the main control device 11 is changed from one for all four blocks to one for one block. Moreover, the light source blocks of the imaging head are inclined by a predetermined angle, and only a block B (15*b*) is used.

In this case, when the number of blocks is n, the imaging speed is reduced to 1/n, but the imaging operation can be continued without stopping the imaging apparatus 1. It is of course that any block may be used if the other blocks are normal. The predetermined angle θ is set to $\cos^{-1}(1/n)$ in order to maintain the same resolution. Note that the second alternative operation can be realized when either one of the linear motor typed linear stage and the ball screw typed linear stage is used.

FIG. 10 is an example 3 showing the arrangement of light source blocks in the imaging head 14. In each block, eight beam irradiation sources are arranged in a straight line. The respective light source blocks are arranged such that the array direction of the beam irradiation sources included therein becomes parallel to the sub-scanning direction. If the position of the light source block A (15*a*) is used as a reference, the light source block B (15*b*) is shifted by $\sqrt{3}a_s/3$ in the main scanning direction and $a_s/2$ in the sub-scanning direction. The light source block c (15*c*) is shifted by $\sqrt{3}a_s/3+b$ in the main scanning direction and $a_s/4$ in the sub-scanning direction. The light source block D (15*d*) is shifted by $2\sqrt{3}a_s/3+b$ in the main scanning direction and $3a_s/4$ in the sub-scanning direction.

In the above embodiment, the number k of beam irradiation sources in one block is 8. Actually, if the number k of beam irradiation sources of one block is two or more, any number is possible. The preferable range is 8 to 64. In the case of using the above arrangement of the beam irradiation sources, the entire imaging area can be imaged without inclining the array in the sub-scanning direction as shown in FIG. 6.

In the above arrangement, the good image area, which is required for the optical system, can be reduced to an extent that a size corresponding to one block is sufficiently included as compared with the case in which all beam irradiation sources are arranged in a straight line. Therefore, a large amount of beam irradiation sources can be arranged without increasing the cost of the optical system and the size thereof. Also, since the shift amount of the beam irradiation sources in the main scanning direction can be reduced to $2\sqrt{3}a_s/3+b$, many beam irradiation sources can be arranged without complicating the electric circuit for controlling timing of imaging with the shift or without increasing the manufacturing cost.

Next, it is assumed that the beam irradiation sources of the block A (15*a*) are out of order in the imaging apparatus 1.

When at least one of the beam irradiation sources is out of order in the conventional imaging apparatus, the apparatus cannot be completely operated until the entire array or the entire imaging head is repaired or replaced. However, in the imaging apparatus I of the present invention, the following two alternative operations can be executed.

The first alternative operation is that the feed amount of the imaging head in the sub-scanning direction and software for outputting image data are changed in accordance with the position of the troubled beam irradiation source. This is the same as the operation explained in example 2.

Figure 11:
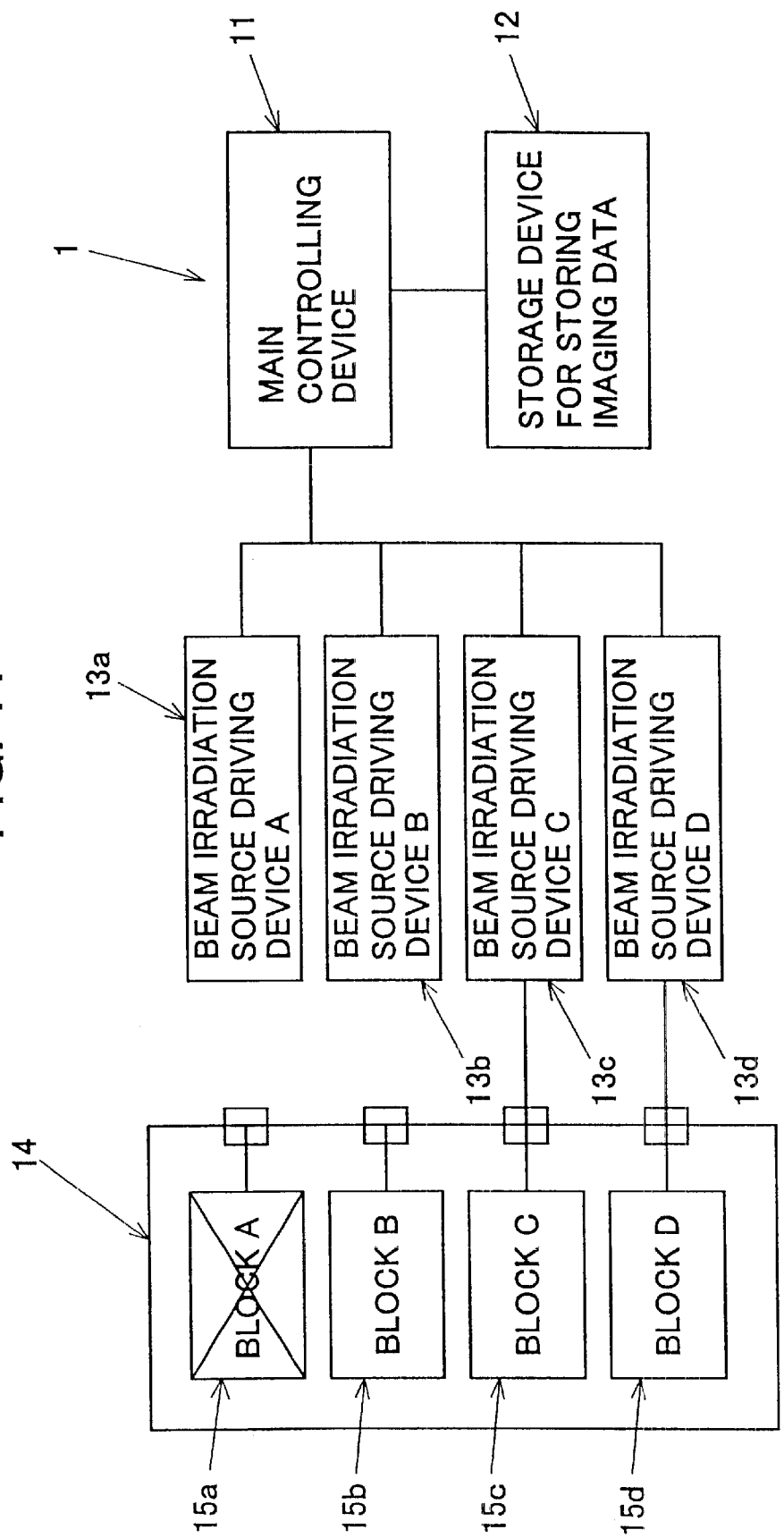
FIG. 11 is a block diagram showing an alternative operation when a part of the beam irradiation sources of one embodiment of an imaging apparatus of the present invention is out of order.
Figure 12:
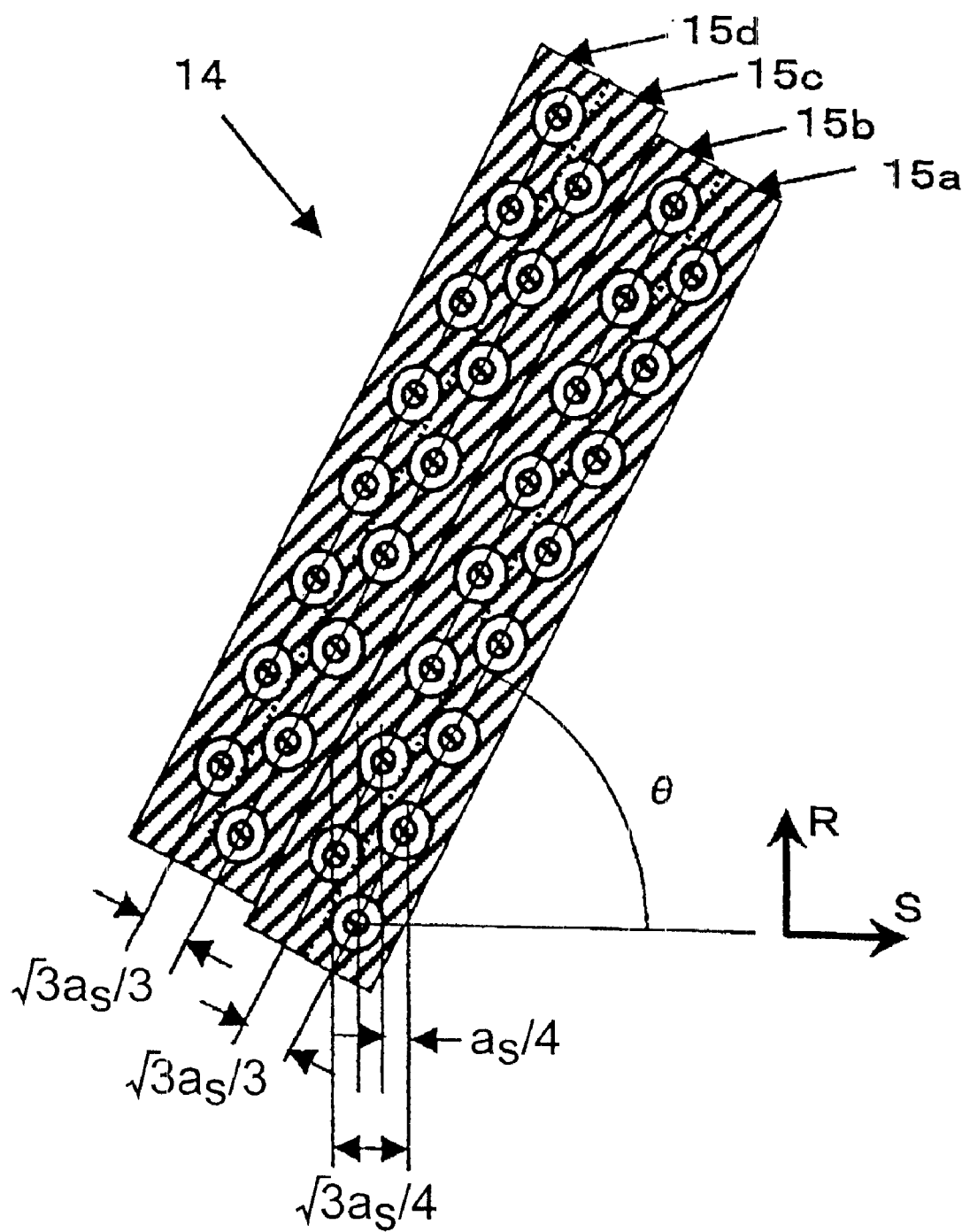
FIG. 12 is a view showing the arrangement of beam irradiation sources of one embodiment of an imaging apparatus of the present invention.

The second alternative operation will be explained as follows. More specifically, as shown in FIG. 11, the block A (15*a*) and the beam irradiation source driving device A (13*a*) are separated from each other. Also, a block B (15*b*) and a beam irradiation source driving device B (13*b*) are separated from each other. Then, the software for outputting imaging data of the main control device 11 is changed from one for all four blocks to one for two blocks. Then, the light source blocks of the imaging head are inclined by a predetermined angle θ as shown in FIG. 12 and only block C and block D (15*c* and 15*d*) is used. As a result, the imaging speed is reduced to ½, but the imaging operation can be continued without stopping the imaging apparatus 1. At this time, the predetermined angle θ is $\cos^{-1}(½)=60°$ in order to maintain the same resolution. Note that the second alternative operation can be realized when either one of the linear motor typed linear stage and the ball screw typed linear stage is used.

Next, the following will explain the imaging apparatus which can largely reduce time, which is required for changing an imaging data absent state of the beam irradiation sources to an imaging data present state, thereby making it possible to improve the imaging speed.

Figure 13:
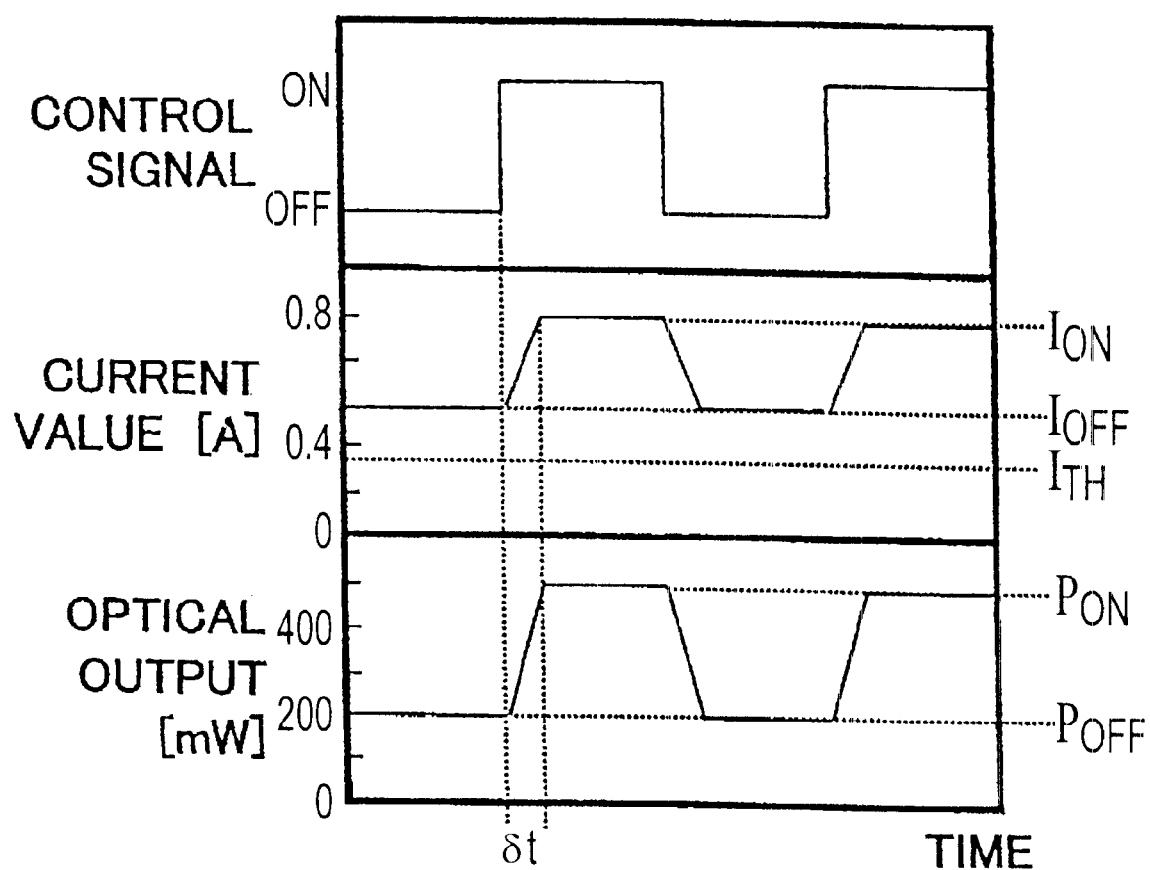
FIG. 13 is a view showing a switching waveform of one embodiment of an imaging apparatus of the present invention.

FIG. 13 shows a change in each of a control signal, which is transmitted to a laser diode from the laser beam source driving circuit of the laser beam source control unit, a current value flowing to the laser diode, and an optical output emitted from the laser beam source at an imaging operation time of the embodiment of the imaging apparatus of the present invention.

As shown in FIG. 14, the following assumption is set. More specifically, a coordinate system in which a central position of a beam 1021*a* at time t=0 is an origin, the sub-scanning direction is an x-axis, and the main scanning direction is a y-axis is introduced. Then, the laser beams of optical outputs P[W], which are condensed such that a radius becomes r[m] on the imaging medium, move on the imaging medium at speed v[m/s].

In this case, when lighting time of the laser corresponding to one imaging dot is $\Delta t$, a beam 1021b at time $t=\Delta t$ moves by $v\Delta t$ in the main scanning direction R (normal direction of y-axis). Then, exposure energy $E(x,y)$ per unit area on the imaging medium is a time integral of optical outputs during this time, and expressed by the following equation (3):

$$E(x, y) = \int_0^{\Delta t} I(x, y - vt)dt \quad [J/m^2] \qquad (3)$$

Here, $I(x, y)[W/m^2]$ is a distribution function of optical outputs, which is determined by the laser beam sources and the characteristic of the optical system. When the laser beam sources are the emission ends of the laser diodes, the distribution is generally Gaussian distribution, which can be expressed by the following equation (4).

$$I(x,y)=2P/\pi r^2 \cdot \exp\{-(x^2+y^2)/r^2\} \qquad (4)$$

Also, almost of all high output laser diodes of about 1W used in imaging in a heat mode are in a multi-mode, and the spatial distribution of the optical outputs in the beams are often flat, and the power distribution in the beams is substantially equal. As a result, the distribution function $I(x, y)$ $[W/m^2]$ becomes a step functional distribution as shown in the following equation (5). The same distribution can be obtained when the laser emission ends of the fiber outputs of the multi-mode are used as the laser beam sources, and uniform reducing or enlarging optical system is employed.

$$I(x, y) = P/\pi r^2 \quad \text{(when } x^2 + y^2 \leq r^2\text{)} \qquad (5)$$
$$\phantom{I(x, y)} = 0 \quad \text{(when } x^2 + y^2 > r^2\text{)}$$

Then, as shown in FIG. 13, a current of more than the threshold value $I_{th}$ of the laser diode is made to flow at the imaging operation time, thereby the laser beam source can be maintain to be ON-state. When imaging data is present, the laser beam sources are controlled to obtain such an optical output $P_{on}$ that exposure energy density of a predetermined imaging area becomes larger than a sensitivity threshold value $E_{th}$ of the imaging medium. When imaging data is absent, the laser beam sources are controlled to obtain such an optical output $P_{off}$ that exposure energy density becomes smaller than the sensitivity threshold value $E_{th}$ of the imaging medium over the entire surface of the laser irradiation region.

In order to explain the meaning of the above optical outputs clearly, it is assumed that the distribution function of the optical outputs is the step functional distribution as shown in equation (4), and that the moving speed v of the beams is $r/\Delta t$.

At this time, an overlapping portion 1022 of the beam 1021a at time t=0 shown in FIG. 14 and a beam 1021b at time $t=\Delta t$ is always irradiated with the optical output of $P/\pi r^2$. For this reason, exposure energy density of the overlapping portion 1022 becomes maximum in the portion irradiated with the laser beams, and exposure energy density of $P\Delta t/\pi r^2$ can be obtained from equation (2).

Then, when imaging data is absent, $P=P_{off}$ is established, and a condition in which no imaging is executed is $P_{off}\Delta t/\pi r^2 < E_{th}$, that is, $P_{off} < E_{th}\pi r^2/\Delta t$. On the other hand, when imaging data is present, $P=P_{on}$ is established. Then, if $P_{on}\Delta t/\pi r^2 \geq E_{th}$, an imaging area whose size is more than the overlapping portion 1022 is formed. Here, if $P_{on}\Delta t/\pi r^2 = \alpha E_{th}$ (1.5≤α≤2.5), that is, $P_{on}=\alpha E_{th}\pi r^2/\Delta t$, the imaging area having substantially same the size as the laser beam shown in FIG. 15 is formed.

Here, it is assumed that the optical output by which the imaging area is formed on the imaging medium at time $\Delta t$ is set to $P_0$ when the laser beams do not move. $P_0=E_{th}\pi r^2/\Delta t$ is established, and the above condition can be expressed as $P_{on}=\alpha P_0$ (1.5≤α≤2.5), $P_{off}<P_0$.

Figure 16A:
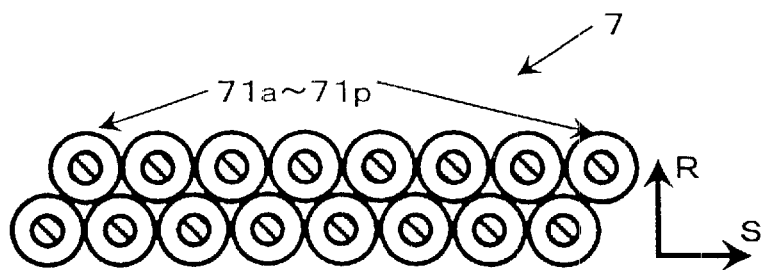
FIGS. 16A to 16C are schematic views showing the arrangement of the laser beam sources and lines imaged by the beam sources in the main scanning direction according to one embodiment of an imaging apparatus of the present invention.

The arrangement of the laser beam sources of this embodiment is shown in FIG. 16A. The arrangement of the beam sources is provided such that k laser beam sources of two rows are parallel to the sub-scanning direction. In FIG. 16A, laser beam sources 71a to 71p of k=8 are arranged. At this time, the distance $a_s$ between the laser beam sources is set to be twice as large the dot distance necessary for making conversions on the imaging medium surface so as to obtain a predetermined resolution.

Figure 16B:
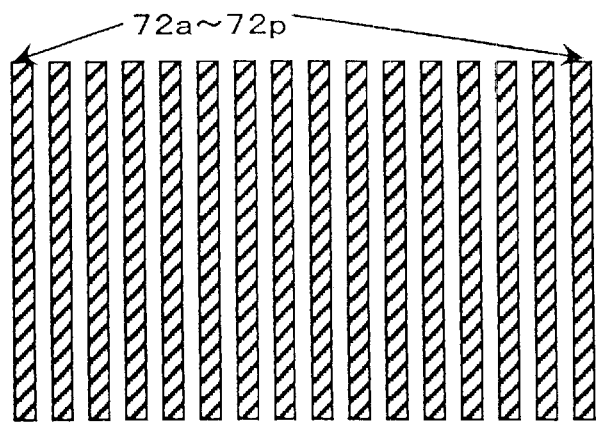

Then, as shown in FIG. 16B, 2k (16 in this figure) odd-numbered lines (72a to 72p in this figure) in the main scanning direction are simultaneously imaged during the time when the imaging head is opposite to the imaging medium at a first one turn of an imaging medium support drum. Then, the imaging head is shifted by $a_s/2$ by sub-scanning means during a blanking time in which the imaging head is not opposite to the imaging medium at the one turn of the imaging medium support drum.

Figure 16C:
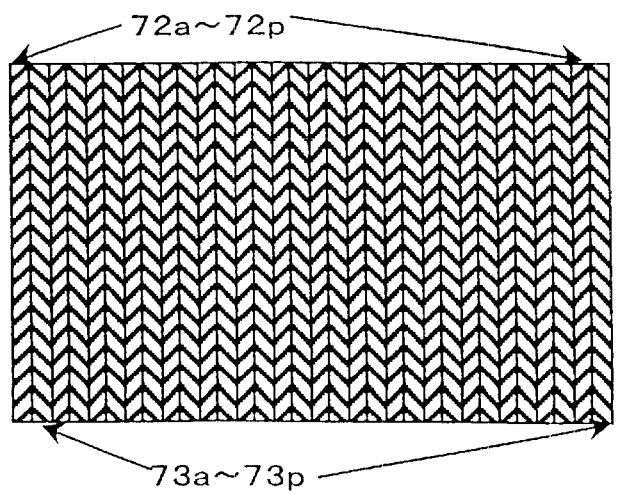

Thereafter, as shown in FIG. 16C, 2k (16 in this figure) even-numbered lines (73a to 73p in this figure) in the main scanning direction are simultaneously imaged during the time when the imaging head is opposite to the imaging medium at a next one turn of the imaging medium support drum. Then, the imaging head is shifted by $(4k-1)a_s/2$ by sub-scanning means during the blanking time at the one turn of the imaging medium support drum. When k=8, the shift amount is $31a_s/2$.

The imaging of the entire surface of the imaging medium is executed by the repetition of these series of operations.

If $P_{off}$ is set to a value close to $P_0$ to image the closest lines in the main scanning direction simultaneously by the conventional light source apparatus shown in FIG. 6, there is possibility that the following problem will occur. Specifically, when imaging data is present, the closest lines in the main scanning direction may be erroneously imaged even at the position where imaging data is absent. In contrast, according to the imaging apparatus of the present embodiment, the closest lines in the main scanning direction are imaged with a time interval corresponding to one turn of the imaging medium support drum. Therefore, even if $P_{off}$ is set to a value close to the threshold value of about $P_{off}=\beta P_0$ (0.7≤β≤0.9), the closest lines in the-main scanning direction are not erroneously imaged.

The above embodiment explained the arrangement of the laser beam sources including eight laser beam sources and two rows. There is a case in which the number of laser beam sources is more increased to improve the performance of the imaging apparatus. Or, there is a case in which the number of laser beam sources is more reduced to reduce the manufacturing cost. Also, the above embodiment explained the case in which the linear motor type was used as the linear stage. However, the ball screw typed linear stage can execute substantially the same operation as the linear motor typed linear stage.

As a method in which the closest lines in the main scanning direction are not simultaneously imaged, there is a method for shifting irradiation timing of the adjacent beam irradiation sources. More specifically, the movement of sub-scanning means is stopped during two turns of the imaging medium support drum. For example, the odd-numbered lines in the main scanning direction are imaged at the first turn, and the even-numbered lines in the main scanning direction are imaged at the second turn. In this case, the substantial distance between the beam irradiation sources in the sub-scanning direction must be half as compared with the aforementioned method, but the same object can be attained.

Next, the following will explain the imaging apparatus of the present invention, which can easily execute the adjustment of the distance between the imaging head and the imaging medium.

Figure 17:
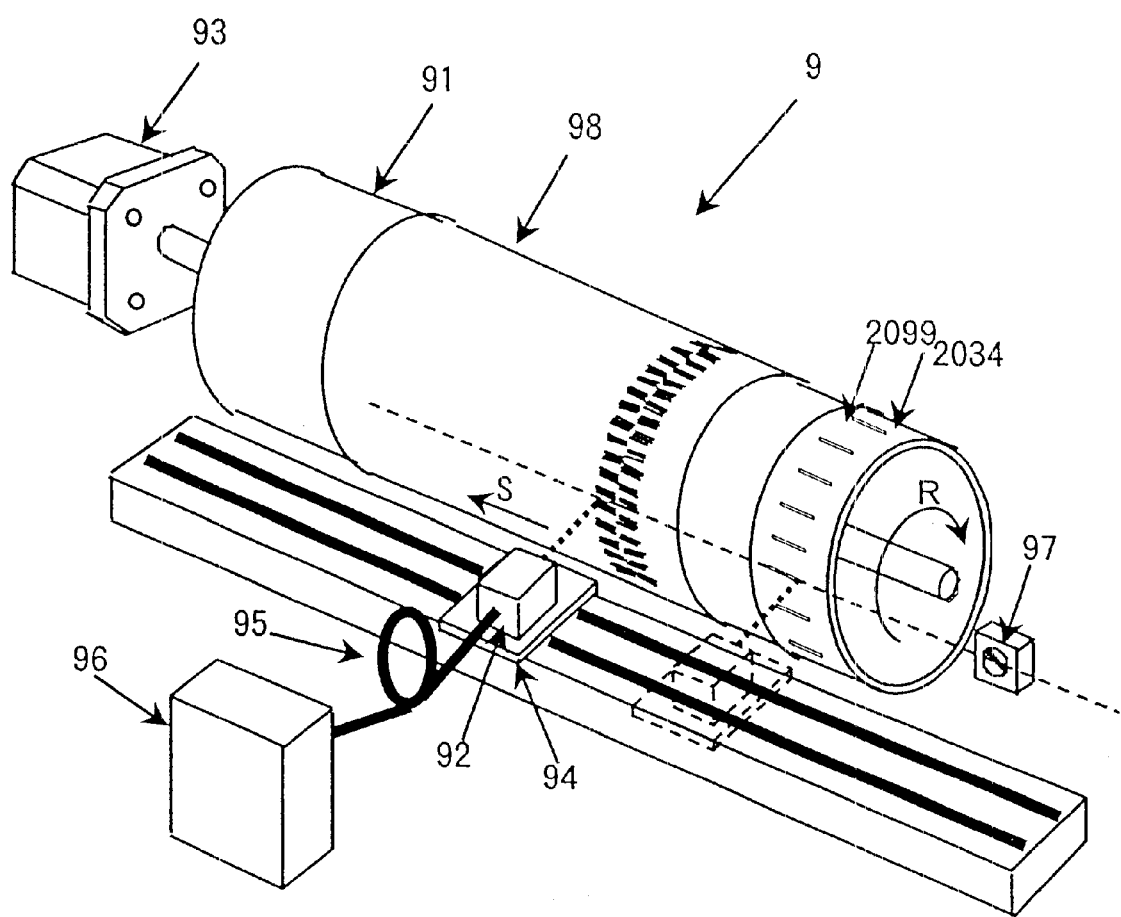
FIG. 17 is a schematic view of one embodiment of an imaging apparatus of the present invention.
Figure 61:
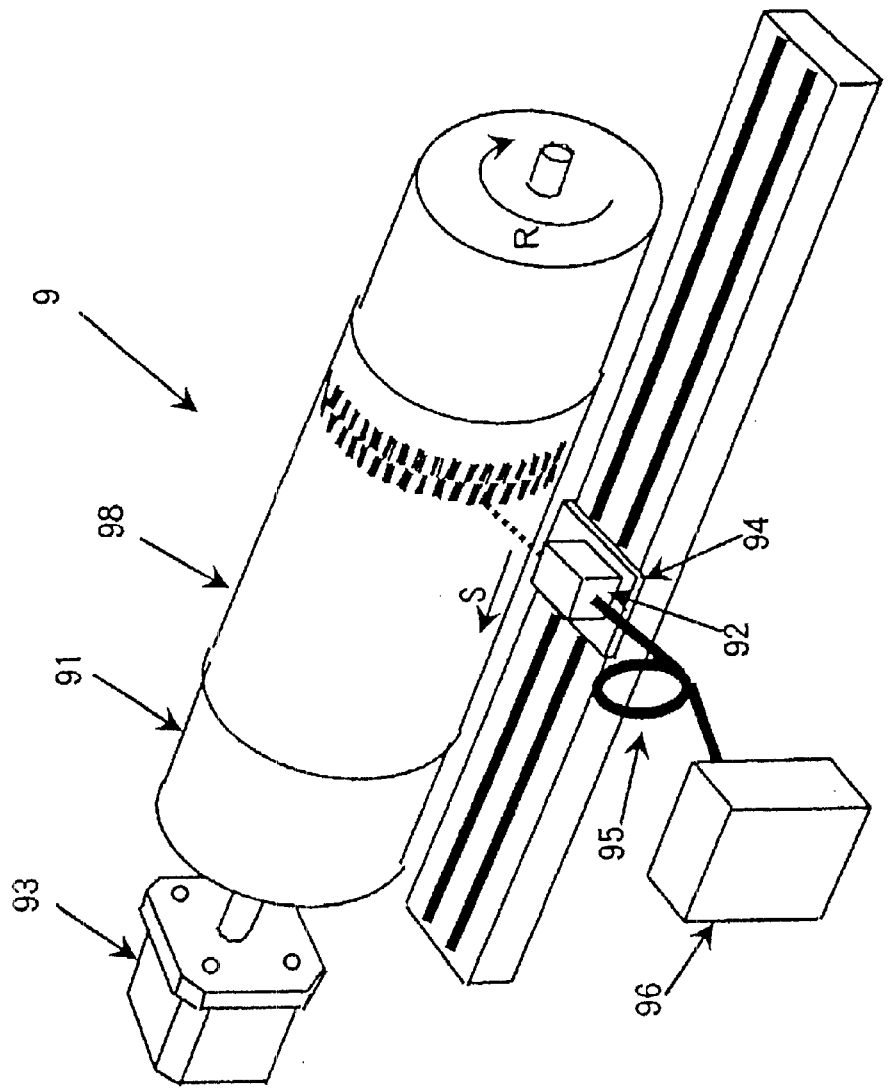
FIG. 61 is a schematic view of a conventional imaging apparatus.
Figure 63A:
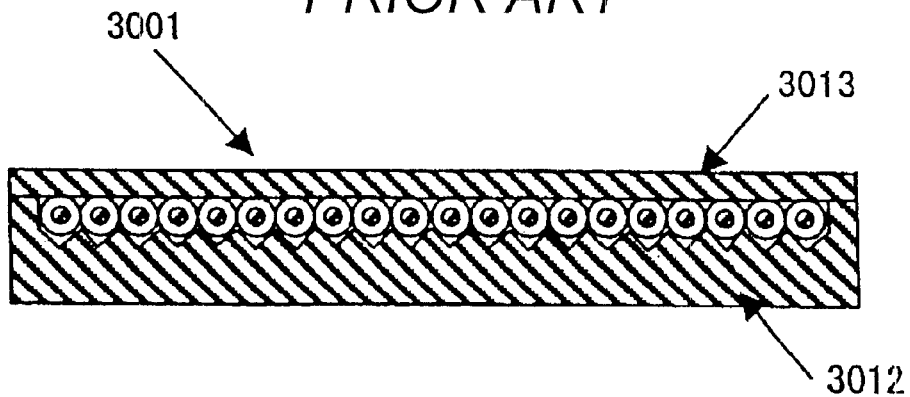
FIGS. 63A and 63B are views showing a manufacturing method of an optical fiber array of prior art.
Figure 63B:
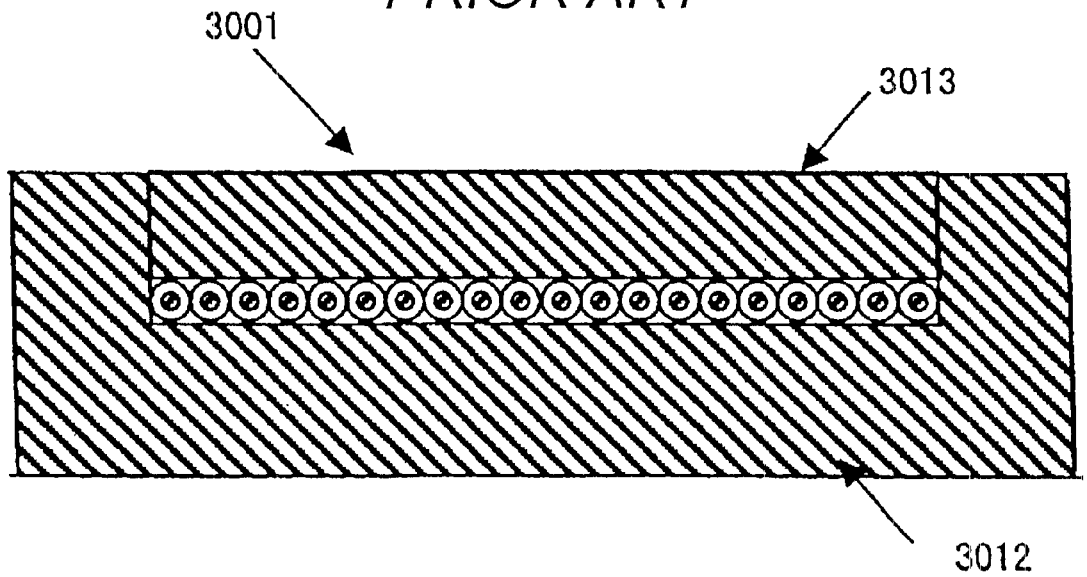
Figure 64A:
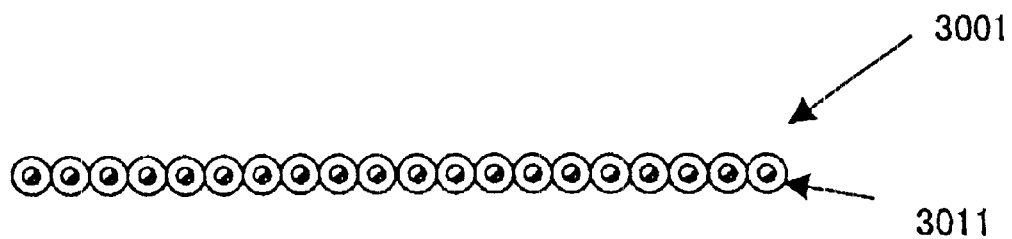
FIGS. 64A and 64B are views showing an arrangement of optical fiber emission ends of an optical fiber array apparatus of prior art.
Figure 64B:
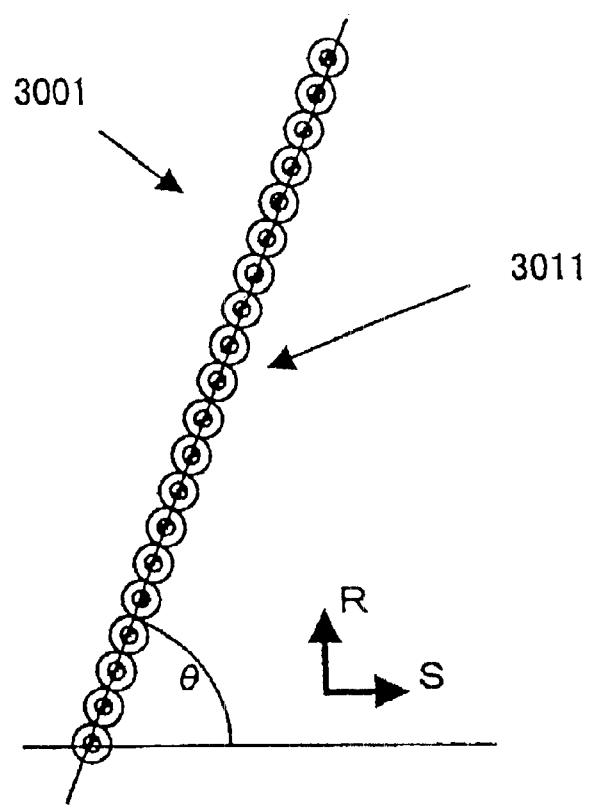
Figure 65A:
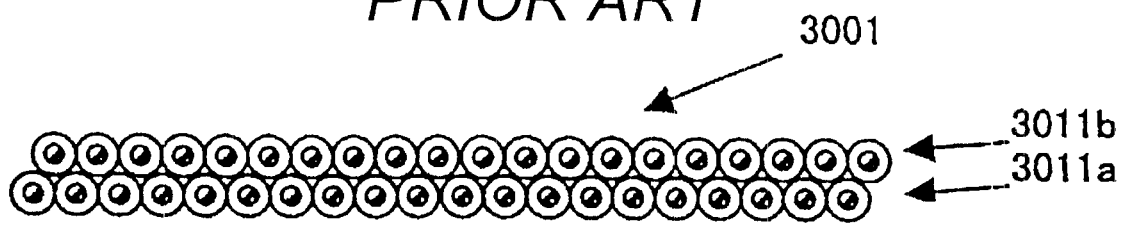
FIGS. 65A and 65B are views showing an arrangement of optical fiber emission ends of an optical fiber array apparatus of prior art.
Figure 65B:
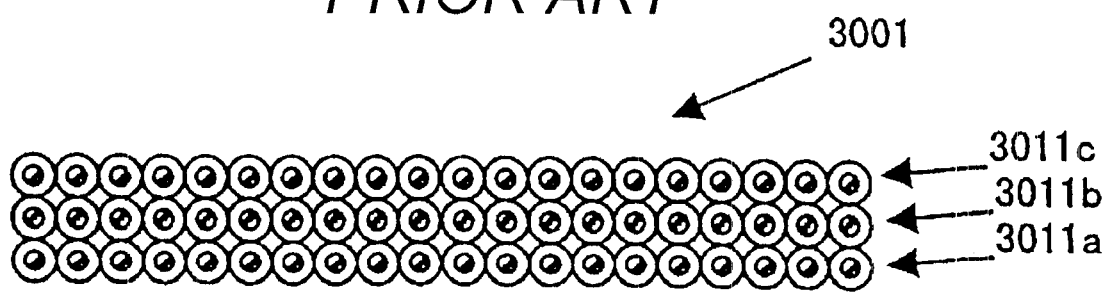
Figure 66A:
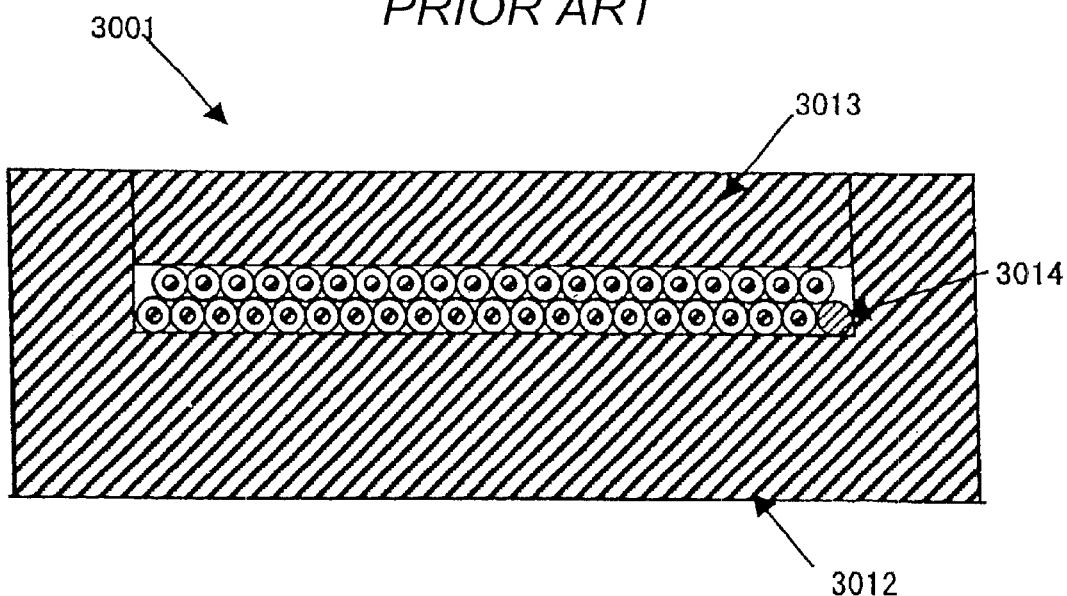
FIGS. 66A and 66B are views showing a manufacturing method of an optical fiber array of prior art.
Figure 66B:
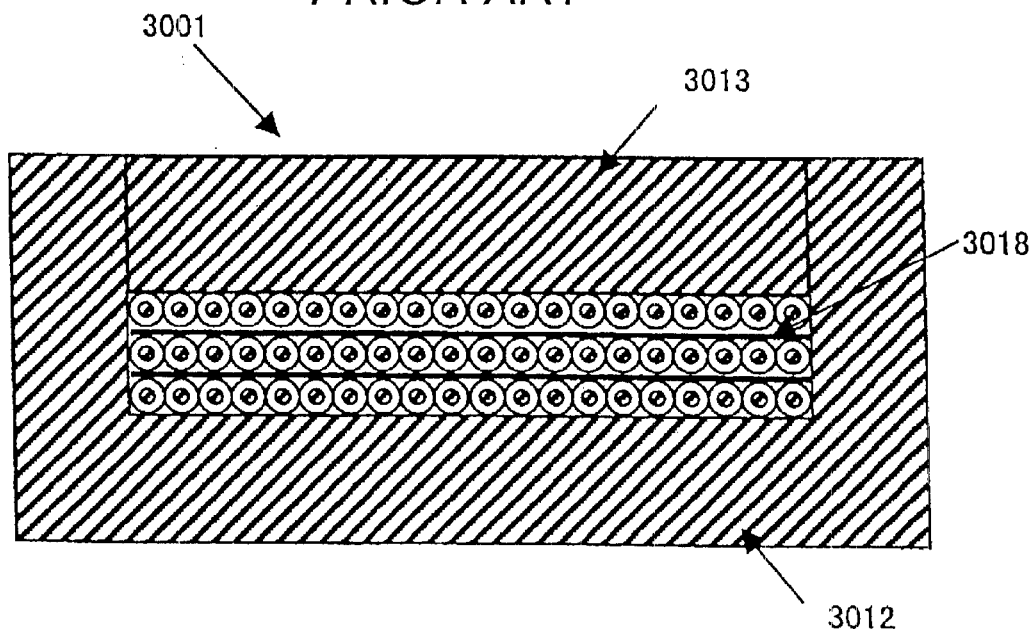

FIG. 17 is a schematic view showing one example of the embodiment of the imaging apparatus of the present invention. Note that the same reference numerals are added to the portions common to prior art of FIG. 61, and the explanation of the common portions is omitted.

The imaging apparatus 9 of this embodiment comprises an opening portion 2099 through which energy beams can pass in addition to the imaging apparatus of prior art, a focal position detecting member 2034 attached to a portion around which an imaging medium 98 of a medium support drum 91 is not wound, and measuring means (not shown) for measuring the laser beams passed through the opening portion 2099.

The positional relationship between the opening portion 2099 and the imaging medium 98 is as follows. More specifically, the distance between the opening portion 2099 and the imaging head 92 when the imaging head 92 is opposite to the opening portion 2099 is placed at a position to which the focus of the imaging medium 98 should be adjusted when the imaging head 92 is opposite to the imaging medium 98. Namely, in the case of the imaging head 98 in the heat mode, there is established the positional relationship in which the distance between the opening portion 2099 and the imaging medium 98 is equal to the distance between the position of the heat-sensitive layer and the imaging head 92.

Figure 18:
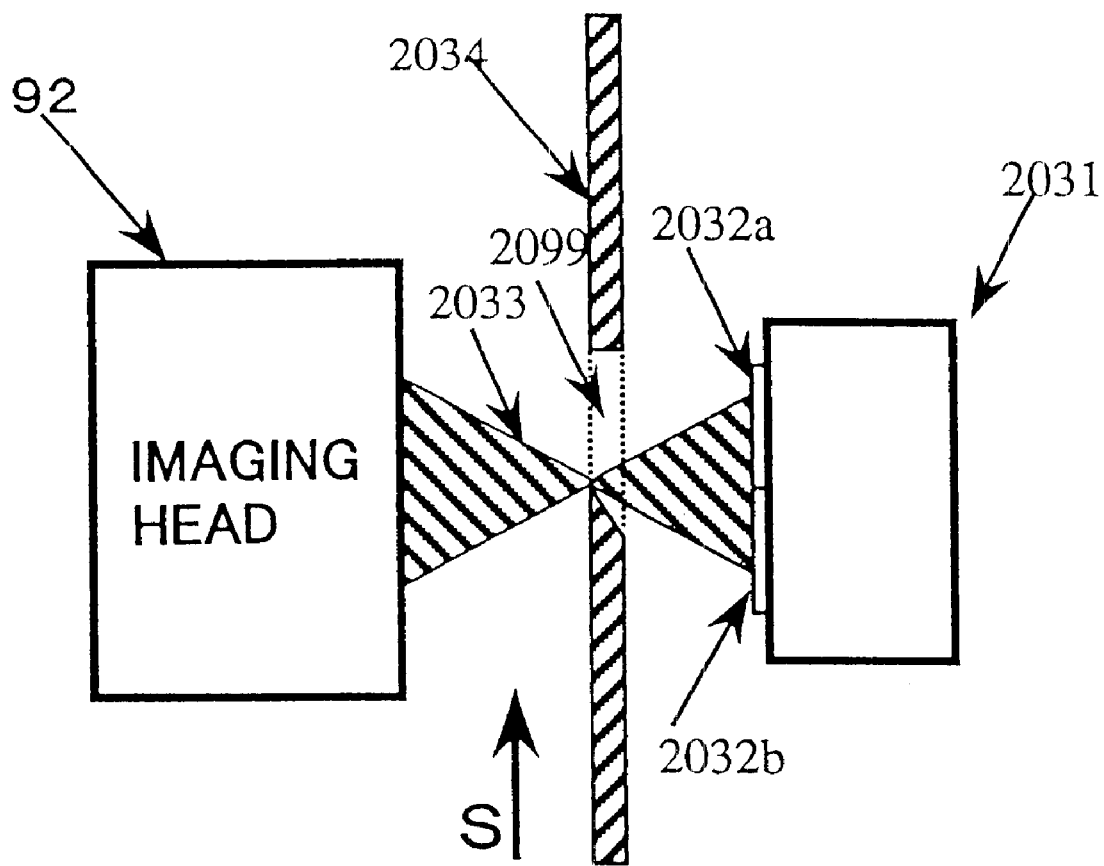
FIG. 18 is a schematic view showing a focal adjusting method of one embodiment of an imaging apparatus of the present invention.

The basic principle of detecting the focal position in the imaging apparatus 9 of this embodiment is a general knife edge method. For actually performing the focus adjustment, the imaging head 92 is moved to a position facing to the measuring means through the opening portion 2099 as shown by broken lines of FIG. 17. FIG. 18 shows a cross-sectional view at a surface including the imaging head 92, the focal position detecting member 2034, the central axis of the energy beam of the measuring means, and the shaft of the medium support drum 91 at this time.

Measuring means 2031 has light receiving elements 2032a and 2032b divided in the sub-scanning direction S in a state that a central axis of an energy beam 2033 is used as a reference. Then, the measuring means 2031 can detect the outputs of the energy beams incident upon the respective light receiving elements, individually. In this figure, a lower end of an opening portion 2099 on paper serves as a knife-edge. FIG. 18 shows a state in which focus is achieved. The energy beams 2033 emitted from the imaging head 92 pass through the opening portion 2099 of the focal position detecting member 2034, and most of the energy beams are incident upon the light receiving elements 2032a and 2032b. At this time, a signal, which is obtained by subtracting the output signal of the light receiving element 2032b from the output signal of the light receiving element 2032a, becomes substantially zero. This signal hereinafter is referred to as a focus signal.

Figure 19:
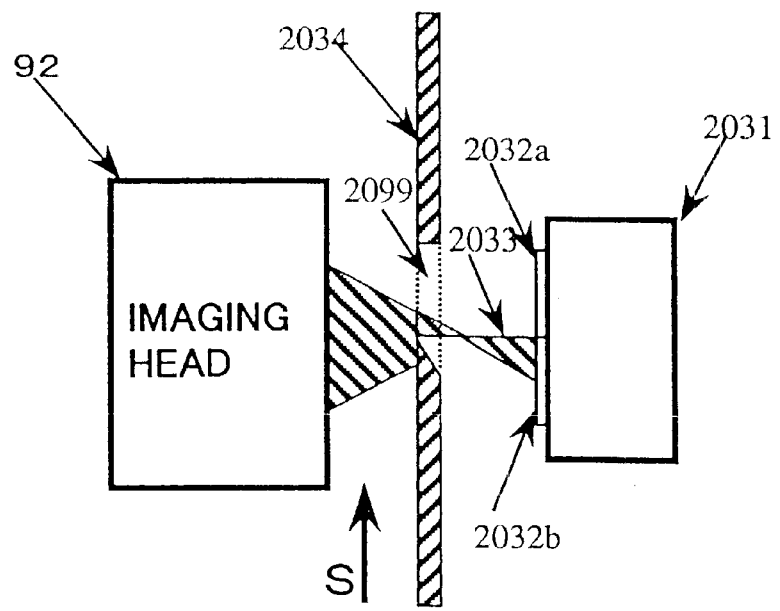
FIG. 19 is a schematic view showing a focal adjusting method of one embodiment of an imaging apparatus of the present invention.

Next, FIG. 19 shows a case in which the imaging head 92 and the medium support drum 91 are too close to each other. At this time, a part of the energy beams 2033 is blocked by the knife edge at the lower end of the opening portion 2099, and the energy beams 2033 are hardly made incident upon the light receiving element 2032a. At this time, the above focus signal becomes a negative value.

Figure 20:
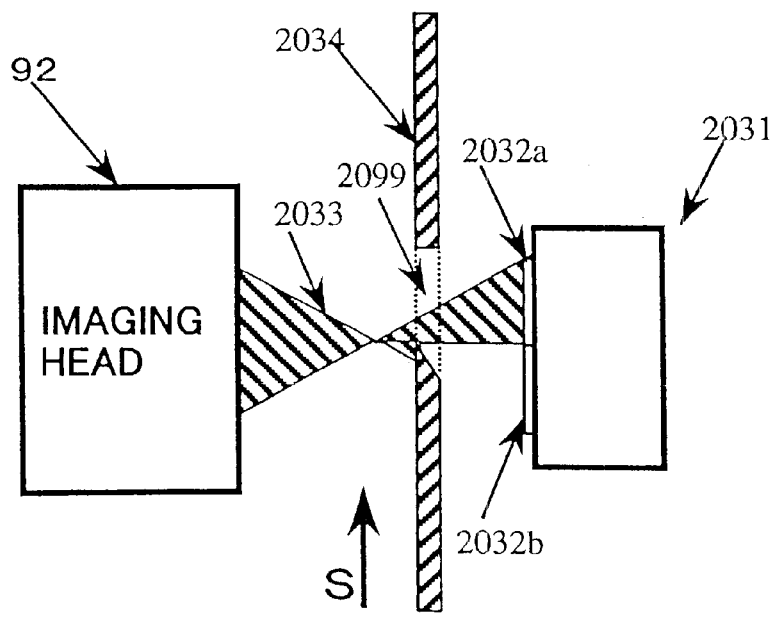
FIG. 20 is a schematic view showing a focal adjusting method of one embodiment of an imaging apparatus of the present invention.

Conversely, FIG. 20 shows a case in which the imaging head 92 and the medium support drum 91 are too far from each other. At this time, a part of the energy beams 2033 is also blocked by the knife edge at the lower end of the opening portion 2099, and the energy beams 2033 are hardly made incident upon the light receiving element 2032b. At this time, the above focus signal becomes a positive value.

Thus, the signal obtained by subtracting the output signals of the light receiving element 2032b from the output signals of the light receiving element 2032a, that is, the focus signal is detected. Thereby, it is possible to know whether or not the focus is achieved. Also, it is possible to know which direction the position of the current imaging head 92 is shifted from the focal position. Then, the focus signal is monitored and the focal adjusting means is operated to adjust an absolute value of the focus signal to be smaller.

In this case, the focal adjusting means is an X-stage 2051 with a micrometer as shown in FIG. 21. Then, the imaging head 92 is fixed to the sub-scanning means, that is, the linear stage 94 through the X-stage 2051. At a focal adjusting time, an adjusting knob 2052 having the micrometer of the X-stage 2051 is rotated. Thereby, the imaging head 92 is moved in the direction of an arrow of the figure, and the distance between the imaging head 92 and the opening portion 2099 of the focal position detecting member 2034 attached to the medium support drum 91 is adjusted.

Though the manual focal adjusting means is shown in the embodiment, an automatic adjustment may be executed using the X-stage with a stepping motor or a linear motor to move the imaging head for the focus adjustment. This focal adjusting operation is carried out at an apparatus initial adjusting time, a focal position confirming time after a long rest, after replacing a part such as the imaging head, and a readjusting time when the thickness of the imaging medium is changed.

When the thickness of the imaging medium is changed, the focal position detecting member must be replaced in accordance with the change in the imaging medium. It is of course possible to provide a focal position detecting member at the blanking portion of the imaging medium support drum and to execute the focal position adjustment at real time at the time of the imaging operation.

In the above embodiment, the lower end serves as the knife edge in FIG. 18. An upper end (on paper) of the opening portion 2099 may be set to serve as the knife edge. At this time, the code of the focus signal is inverted. Also, a plurality of opening portions 2099 is provided in the circumferential direction, the amount of data of the focus signals, which can obtained during one turn of the drum, is increased, and the accuracy of the focal adjustment is improved.

Moreover, in the above embodiment, it is possible to detect the change in a periodical focus state due to eccentricity. Therefore, the periodical adjustment of the focal position during the imaging is executed based on the detection result, thereby making it possible to obtain a good focus state even in the drum with eccentricity. The above embodiment explained the drum shaped imaging medium support means, but imaging medium support means of a flat bed type may be used. Even if the medium support means is the flat bed type, the method for confirming the focus state is the same as the case of the drum shaped imaging medium support means.

Figure 22:
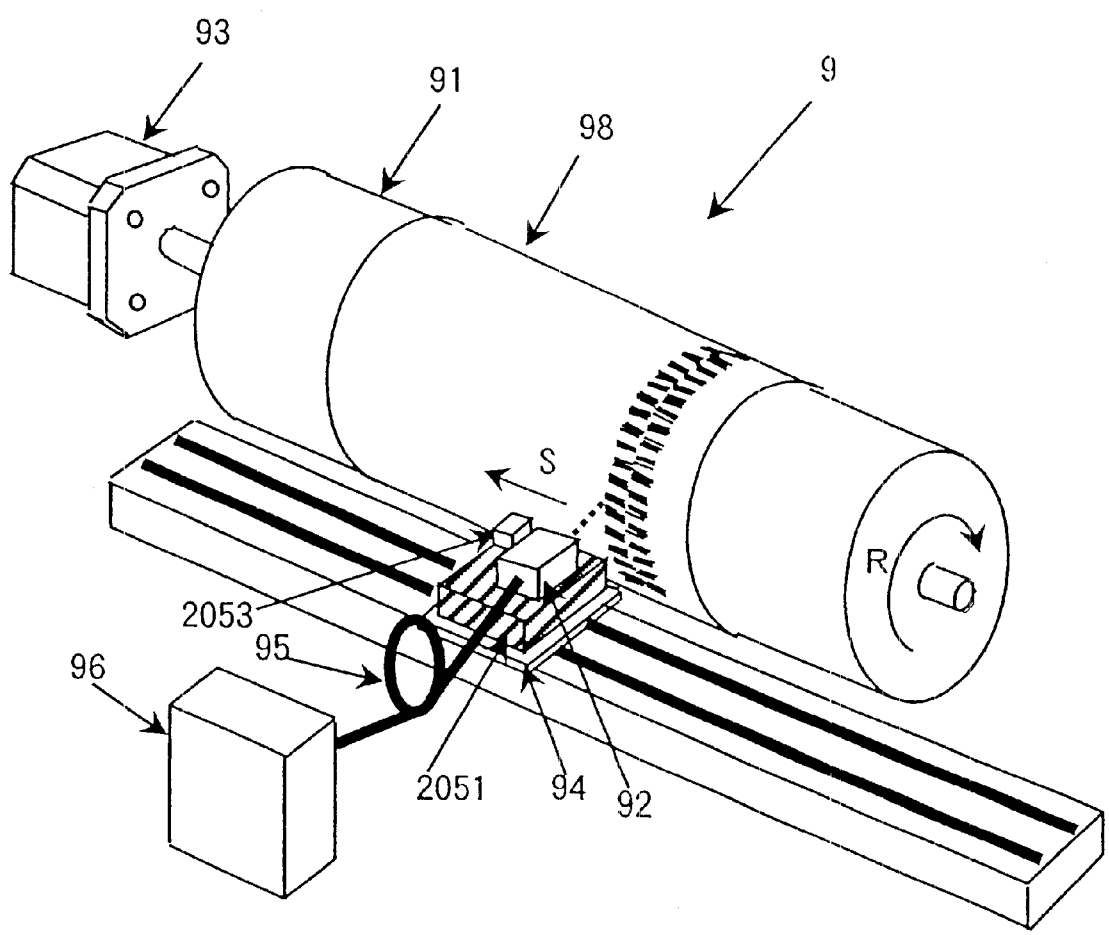
FIG. 22 is a schematic view of one embodiment of an imaging apparatus of the present invention.

FIG. 22 is a schematic view showing one example of another embodiment of the imaging apparatus of the present invention. Note that the same reference numerals are added to the portions common to prior art of FIG. 61, and the explanation of the common portions is omitted.

Figure 23:
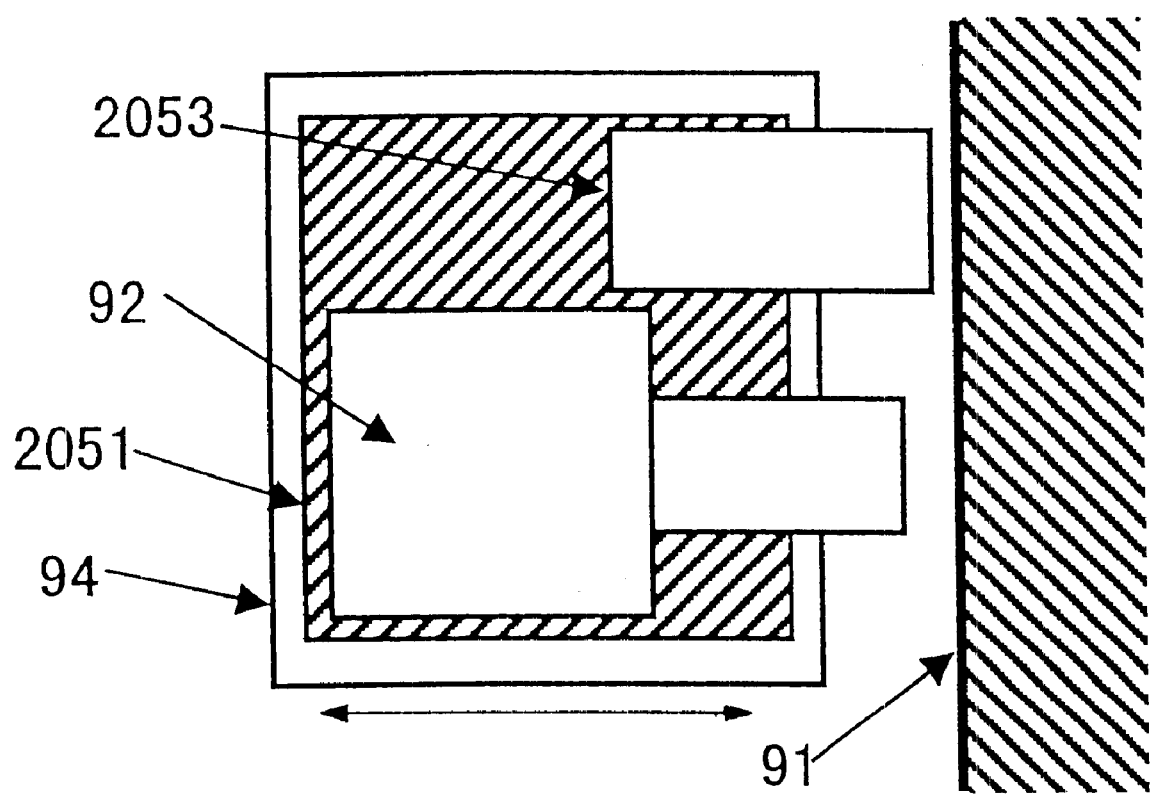
FIG. 23 is a schematic view of a linear stage section of one embodiment of an imaging apparatus of the present invention.

In the imaging apparatus 9 of this embodiment, in addition to the imaging apparatus of prior art, the imaging head 92 and focal position detecting means 2053 are fixed to the linear stage 94 through the X-stage 2051, and the focal position detecting means 2053 moves with the imaging head 92 as one unit. FIG. 23 shows a view of the linear stage portion seeing from the upper portion.

A displacement sensor of e.g., an optical type, an eddy current type, an electrostatic capacitance type, is incorporated into the focal position detecting means 2053, thereby detecting the distance between the focal position detecting means 2053 and the medium support drum 91. The distance between the imaging head 92 and the imaging medium 98 can be calculated as follows. Specifically, a positional difference in a direction perpendicular to both the main scanning direction and the sub-scanning direction between the imaging head 92 and-the focal position detecting means 2053 is added to the distance between the focal position detecting means 2053 and the medium support drum 91 obtained by the displacement sensor incorporated into the focal position detecting means 2053. Then, the thickness of the imaging medium 98 is subtracted from the resultant value.

The focal adjusting means is the X-stage 2051, which is driven by the linear motor, and the imaging head 92 and the focal position detecting means 2053 are fixed to the sub-scanning means, that is, the linear stage 94 through the X-stage 2051.

Then, at the focal adjusting time, the linear motor of the X-stage 2051 is driven to move the imaging head 92 and the focal position detecting means 2053 in the direction of an arrow in the figure. Then, the distance between the imaging head 92 and the imaging medium 98 attached to the medium support drum 91 is adjusted.

The above embodiment showed the automatic focal adjusting means using the linear motor. However, it is possible to use the stepping motor to move the imaging head for the focus adjustment, or the manual adjustment using the X-stage with a micrometer may be executed.

This focal adjusting operation is carried out at an apparatus initial adjusting time, a focal position confirming time after a long rest, after replacing a part such as the imaging head, and a readjusting time when the thickness of the imaging medium is changed. When the thickness of the imaging medium is changed, the signal level showing the focal position may be shifted by a value corresponding to the change in the thickness of the imaging medium. It is of course possible to operate the focal position detecting means at a suitable timing during the imaging so as to execute the focal position adjustment at real time.

Figure 24:
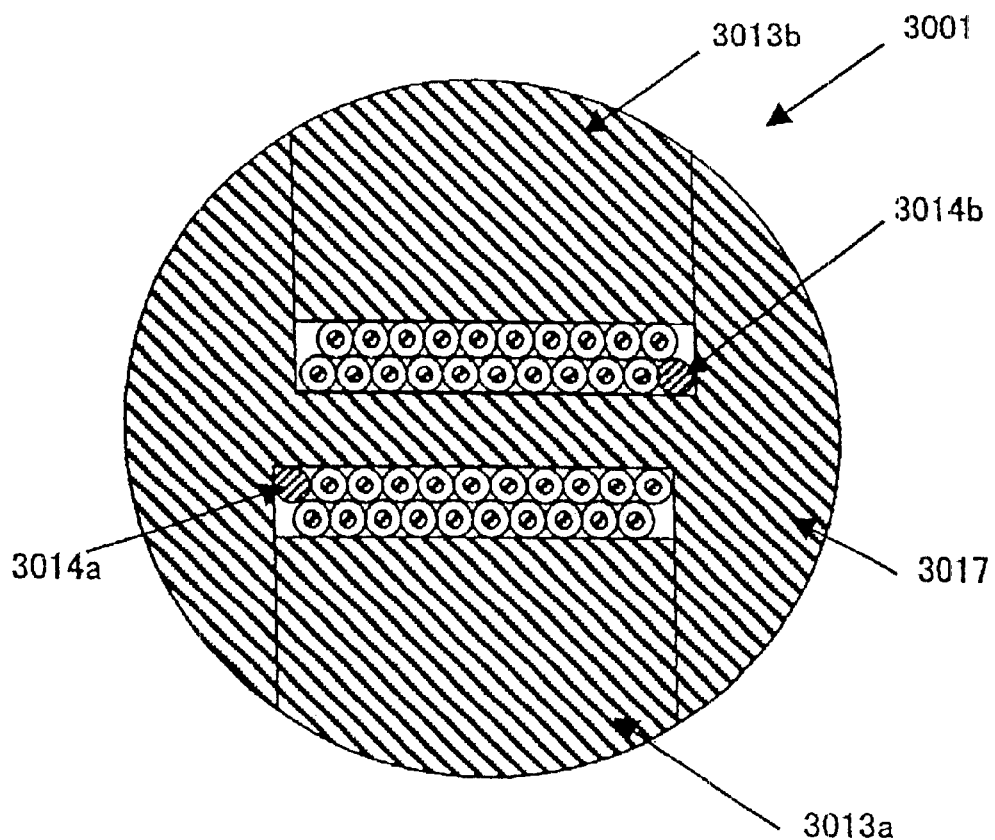
FIG. 24 is a schematic view of one embodiment of an optical fiber array apparatus of the present invention.
Figure 25:
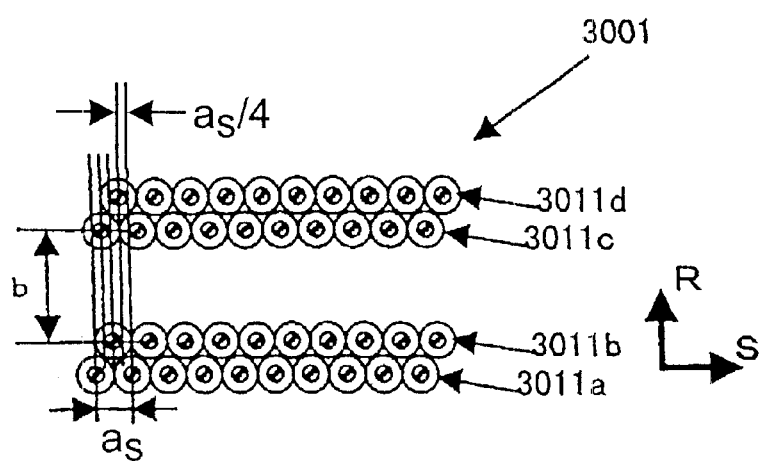
FIG. 25 is a view showing the arrangement of optical fiber emission ends of one embodiment of an optical fiber array apparatus of the present invention.

Next, the following will explain the optical fiber array apparatus of a multi-stage piling type, which is used in the imaging apparatus of the present invention and which has a good positional accuracy. FIG. 24 shows an example of the optical fiber array apparatus of the present invention. FIG. 25 shows the arrangement of the optical fiber emission ends.

An optical fiber array apparatus 3001 comprises four optical fiber rows (3011a to 3011d) in which 10 optical fiber emission ends are arranged in a straight line. In this arrangement, an optical fiber double row 3011ab having the optical fiber rows 3011a, 3011b, and an optical fiber double row 3011cd having the optical fiber rows 3011c, 3011d, are structured to have the array of two rows (like a barrel piling), respectively.

In each optical fiber row, 10 optical fiber emission ends are arranged in a straight line with a distance of $a_s$. The array direction of the optical fiber emission ends included in each optical fiber row is provided to be parallel to the sub-scanning direction (a projection direction to the main scanning direction forms 90° to the array direction).

If the position of the optical fiber row 3011a is used as a reference, the optical fiber row 3011b is shifted by $\sqrt{3}a_s/2$ in the main scanning direction and $a_s/2$ in the sub-scanning direction. The optical fiber row 3011c is shifted by $\sqrt{3}a_s/2+b$ in the main scanning direction and $a_s/4$ in the sub-scanning direction. The optical fiber row 3011d is shifted by $\sqrt{3}a_s+b$ in the main scanning direction and $3a_s/4$ in the sub-scanning direction. In this case, b is about 3 to 5 times as large as $a_s$. In this embodiment, the number of optical fibers emission ends of one optical fiber row is 10. However, if the number of optical fibers emission ends is two or more, any number is possible. The favorable range is 8 to 32.

In the case of using the above arrangement of the optical fiber emission ends, the entire imaging area can be imaged without inclining the optical fiber array apparatus with respect to the sub-scanning direction as shown in FIG. 6. In such an arrangement, the good image area, which is required for the optical system, can be reduced to an extent that the length of one optical fiber row is sufficiently included as compared with the case in which all optical fiber emission ends are arranged in a straight line and the case in which the optical fiber emission ends are arranged in two rows. Therefore, a large amount of optical fiber emission ends can be arranged without increasing the cost of the optical system and the size thereof.

Since the shift amount of the optical fiber emission ends in the main scanning direction can be reduced to $\sqrt{3}a_s+b$, many optical fiber emission ends can be arranged without complicating the electric circuit for controlling timing of imaging with the shift or without increasing the manufacturing cost. In this case, contrivance of the sub-scanning method and the rearrangement of data are not necessarily needed. Moreover, in the array like a barrel piling, the positional deviation in the array direction between one optical fiber row and the other optical fiber rows can be accurately and easily set to be 0. 5 times as large as the optical fiber pitch.

Next, the following will explain the method for manufacturing the optical fiber array apparatus with a good positional accuracy of the optical fiber emission ends . The manufacturing process will be shown in FIGS. 26A to 26E.

Figure 26A:
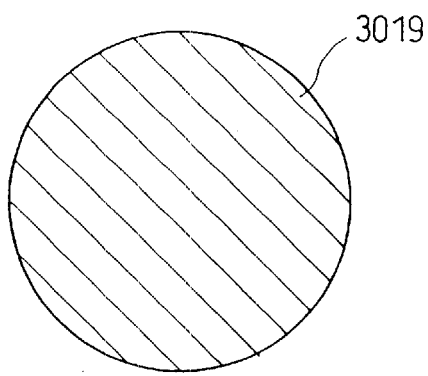
FIGS. 26A to 26E are views showing the manufacturing process of one embodiment of an optical fiber array apparatus of the present invention.
Figure 26B:
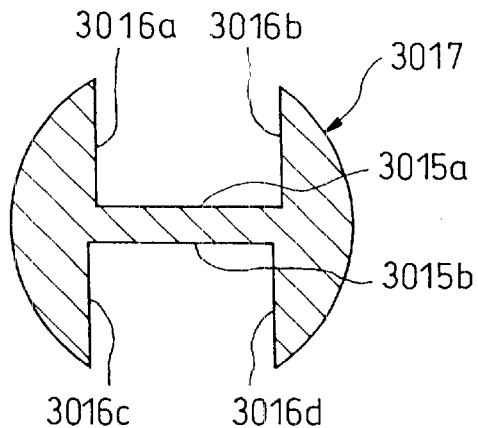

First, as shown in FIG. 26A, a columnar material 3019, made of stainless and so on for forming an optical fiber support member, is prepared. Next, as shown in FIG. 26B, a fiber fixing groove, having a width where (n+1) optical fibers are arranged, is formed in upper and lower portions by wire discharge process etc., so as to manufacture an optical fiber support member 3017.

In the explanation hereinafter, the material 3019 uses all the same material.

At the time of positioning the optical fibers, the bottom surfaces serve as parallel portions 3015a and 3015b, and side surfaces serve as restricting portions 3016a to 3016d. For this reason, the parallel portions 3015a and 3015b are precisely processed to be parallel to each other. And, the restricting portions 3016a to 3016d are precisely processed such that the shift of the optical fiber array direction between the restricting portions 3016a and 3016c and the shift of the optical fiber array direction between the restricting portions 3016b and 3016d are $3a_s/4$.

Figure 26C:
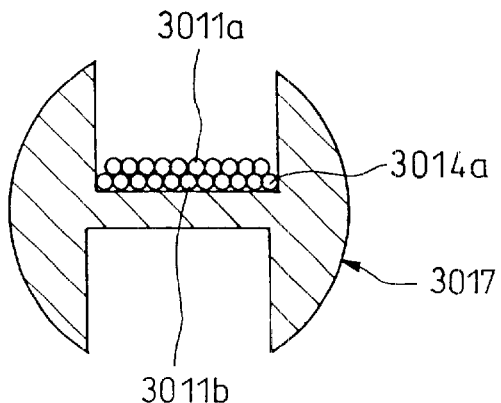

Next, as shown in FIG. 26C, the optical fiber row 3011b having n optical fibers and one dummy fiber 3014a whose diameter is equal to the optical fiber serving as the light source are arranged as follows. More specifically, they are arranged in the parallel portion 3015a such that the optical fiber positioned at the left edge is closely in contact with the restricting portion 3016a and the right edge of the dummy fiber 3014a is closely in contact with the restricting portion 3016b.

Figure 26D:
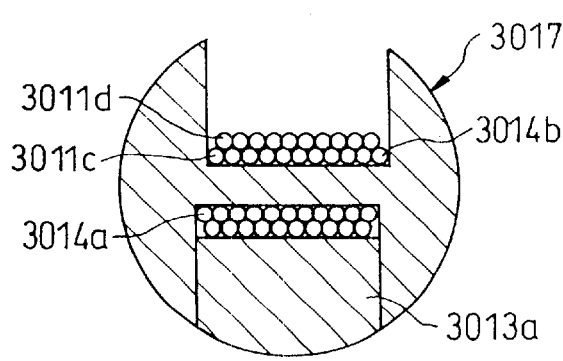

The optical fiber row 3011a having n optical fibers is arranged on the optical fiber row 3011b having n optical fibers and one dummy fiber 3014a in a barrel-piling manner. A pressing member 3013a is pressed thereon, and upper and lower portions are inverted as shown in FIG. 26D.

Figure 26E:
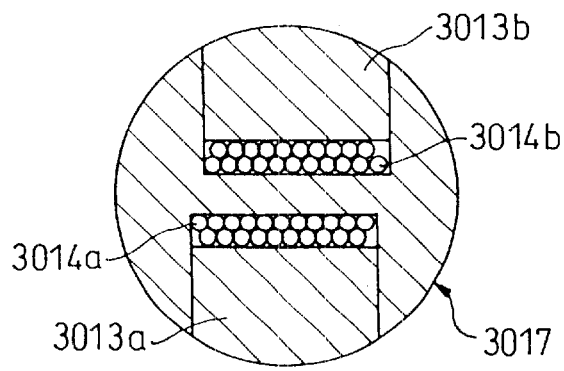

Thereafter, the optical fiber row 3011c having n optical fibers and one dummy fiber 3014b are arranged, and the optical fiber row 3011d having n optical fibers is arranged thereon in the same manner as shown in FIG. 26C. Finally, as shown in FIG. 26E, a pressing member 3013b is pressed thereon, and the space is filled with adhesive to be hardened so that the above mentioned members are combined into one.

Figure 27:
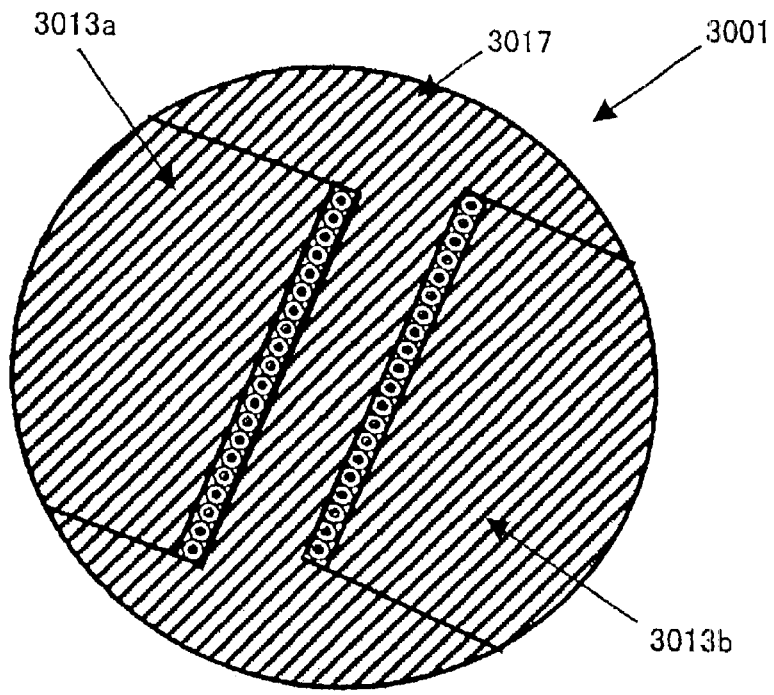
FIG. 27 is a schematic view of one embodiment of an optical fiber array apparatus of the present invention.
Figure 28:
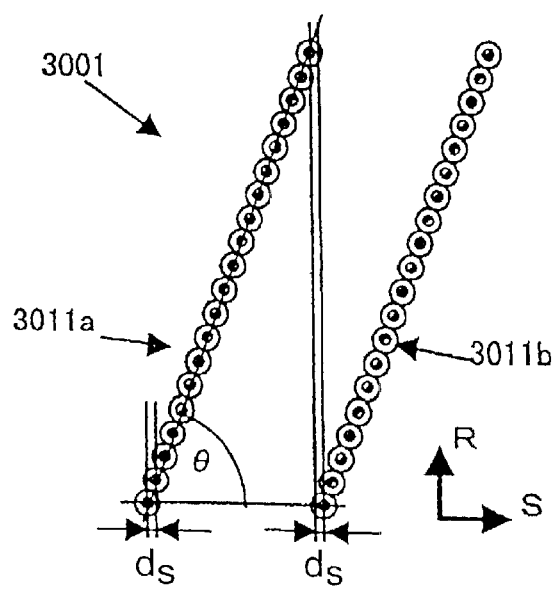
FIG. 28 is a view showing the arrangement of optical fiber emission ends of one embodiment of an optical fiber array apparatus of the present invention.

Another example of the optical fiber array apparatus of the present invention is shown in FIG. 27. The array of the optical fiber emission ends is shown in FIG. 28.

The optical fiber array apparatus 3001 comprises two optical fiber rows (3011a and 3011b) in which 20 optical fiber emission ends are arranged in a straight line.

In each optical fiber row, 20 optical fiber emission ends are arranged in a straight line with a distance of $a_s$. The array direction of the optical fiber emission ends included in each optical fiber row is provided to have a predetermined angle θ with respect to the sub-scanning direction S (an angle to be formed with respect to the array direction of the projection direction is (90°−θ)). The angle θ is defined as in equation (1).

If the position of the optical fiber row 3011a is used as a reference, the optical fiber 3011b is shifted by 0 in the main direction and 20 $d_s$ in the sub-scanning direction. In this embodiment, the number n of optical fibers emission ends of one optical fiber row is 20. However, if the number of optical fibers emission ends is two or more, any number is possible. The favorable range is 8 to 32.

In such an arrangement, the good image area, which is required for the optical system, can be reduced to an extent that the length of one optical fiber row is sufficiently included as compared with the case in which all optical fiber emission ends are arranged in a straight. Therefore, a large amount of optical fiber emission ends can be arranged without increasing the cost of the optical system and the size thereof. Since the shift amount of the optical fiber emission ends in the main scanning direction can be reduced to a half, many optical fiber emission ends can be arranged without complicating the electric circuit for controlling timing of imaging with the shift or without increasing the manufacturing cost.

The method for manufacturing the optical fiber array apparatus 3001 with a good positional accuracy of the optical fiber emission ends is basically the same as the manufacturing process shown in FIGS. 26A to 26E. The differences therebetween are the formation of only one optical fiber row in one fiber fixing groove and the positional relationship between the parallel portions and the restricting portions. The fiber fixing groove has a width where n optical fibers can be arranged. The distance between the parallel portions is precisely processed to be $a_s(n \sin \theta \cos \theta - 1)$, and the shift between the restricting portions is also precisely processed to be $a_s \cos^2 \theta$.

Figure 29:
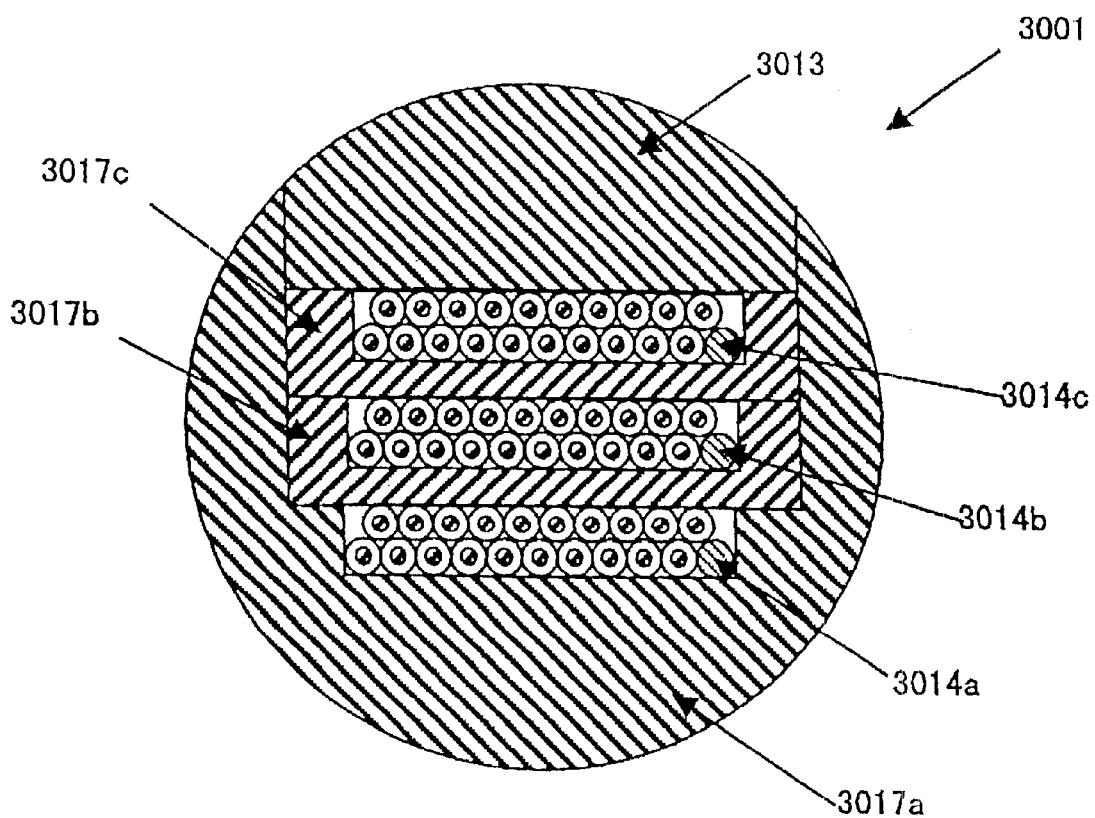
FIG. 29 is a schematic view of one embodiment of an optical fiber array apparatus of the present invention.
Figure 30:
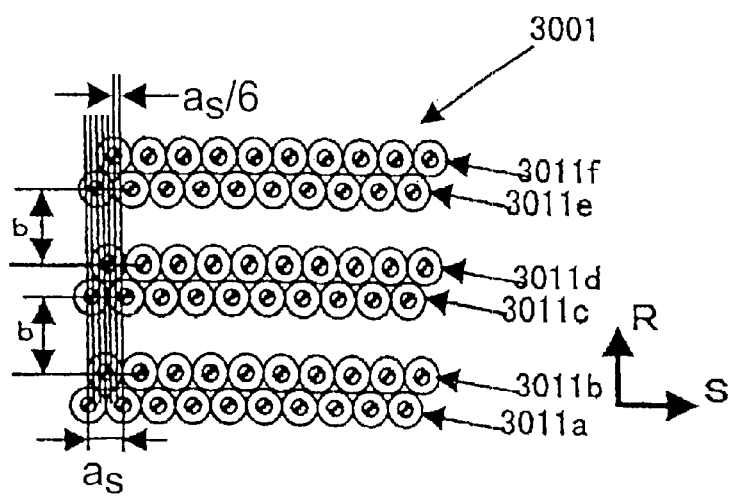
FIG. 30 is a view showing the arrangement of optical fiber emission ends of one embodiment of an optical fiber array apparatus of the present invention.

Another example of the optical fiber array apparatus of the present invention is shown in FIG. 29. The array of the optical fiber emission ends is shown in FIG. 30.

The optical fiber array apparatus 3001 comprises six optical fiber rows (3011a and 3011f) in which 10 optical fiber emission ends are arranged in a straight line.

In each optical fiber row, 10 optical fiber emission ends are arranged in a straight line with a distance of $a_s$. The array direction of the optical fiber emission ends included in each optical fiber row is formed to be parallel to the sub-scanning direction.

If the position of the optical fiber row 3011a is used as a reference, the optical fiber row 3011b is shifted by $\sqrt{3}a_s/2$ in the main scanning direction and $a_s/2$ in the sub-scanning direction. The optical fiber row 3011c is shifted by $\sqrt{3}a_s/2+b$ in the main scanning direction and $a_s/6$ in the sub-scanning direction. The optical fiber row 3011d is shifted by $\sqrt{3}a_s+b$ in the main scanning direction and $2a_s/3$ in the sub-scanning direction. The optical fiber row 3011e is shifted by $\sqrt{3}a_s+2b$ in the main scanning direction and $a_s/3$ in the sub-scanning direction. The optical fiber row 3011f is shifted by $3\sqrt{3}a_s/2+2b$ in the main scanning direction and $5a_s/6$ in the sub-scanning direction. In this case, b is about 1 to 5 times as large as $a_s$.

In this embodiment, the number n of optical fibers emission ends of one optical fiber row is 10. However, if the number of optical fibers emission ends is two or more, any number is possible. The favorable range is 8 to 32.

In the case of using the above arrangement of the optical fiber emission ends, the entire imaging area can be imaged without inclining the optical fiber array apparatus as shown in FIG. 6. In such an arrangement, the good image area, which is required for the optical system, can be reduced to an extent that the length of one optical fiber row is sufficiently included as compared with the case in which all optical fiber emission ends are arranged in a straight line and the case in which the optical fiber emission ends are arranged in two rows. Therefore, a large amount of optical fiber emission ends can be arranged without increasing the cost of the optical system and the size thereof.

The shift amount of the optical fiber emission ends in the main scanning direction can be reduced to $3\sqrt{3}a_s/2+2b$. For this reason, many optical fiber emission ends can be arranged without complicating the electric circuit for controlling timing of imaging with the shift or without increasing the manufacturing cost. In this case, contrivance of the sub-scanning method and the rearrangement of data are not necessarily needed.

Next, the following will explain the method for manufacturing the optical fiber array apparatus 3001 with a good positional accuracy of the optical fiber emission ends . The manufacturing process will be shown in FIGS. 31A to 31E.

First, as shown in FIG. 31A, the columnar material 3019 for forming an optical fiber support member is prepared. Next, as shown in FIG. 31B, a two-stage groove is formed by wire discharge process etc., so as to manufacture an optical fiber support member 3017a. In this case, the two-stage groove is formed such that a bottom portion has a width where (n+1) optical fibers can be arranged and an opening portion has a width equal to the widths of optical fiber arranging members 3017b and 3017c. The optical fiber arranging members 3017b and 3017c have fiber fixing grooves each having a width where (n+1) optical fibers can be arranged.

The optical fiber support member 3017a and the optical fiber arranging members 3017b and 3017c are combined into one to be described later, and function as an optical fiber support member. The bottom surface of the groove of the support member 3017a functions as the parallel portion 3015a and the bottom surfaces of the fiber fixing grooves of the arranging member 3017b and 3017c function as the parallel portions 3015b and 3015c. Also, the side surface of the groove of the support member 3017a functions as restricting portions 3016a and 3016b, and the side surfaces of the grooves of the optical fiber arranging members 3017b and 3017c function as restricting portions 3016c to 3016f.

For this reason, the parallel portions 3015a to 3015c are precisely processed to be parallel to each other. And, the respective portions 3016a to 3016f are precisely processed such that the shift of the optical fiber array direction between the restricting portions 3016a, 3016c, 3016e and the restricting portions 3016b, 3016d, 3016f is a pitch of $a_s/6$.

Next, as shown in FIG. 31C, the optical fiber row 3011a having n optical fibers and one dummy fiber 3014a whose diameter is equal to the optical fiber serving as the light source are arranged as follows. More specifically, they are arranged in the parallel portion 3015a such that the optical fiber positioned at the left edge is closely in contact with the restricting portion 3016a and the dummy fiber 3014a is closely in contact with the restricting portion 3016b.

The optical fiber row 3011b having n optical fibers is arranged on the optical fiber row 3011a having n optical fibers and one dummy fiber 3014a in a barrel-piling manner.

Next, as shown in FIG. 31D, the optical fiber arranging member 3017b is pressed thereon, the optical fiber row 3011c having n optical fibers and one dummy fiber 3014b whose diameter is equal to the optical fiber serving as the light source are arranged in the parallel portion 3015a. Then, the optical fiber positioned at the left edge is closely in contact with the restricting portion 3016c and the dummy fiber 3014b is closely in contact with the restricting portion 3016d. Moreover, the optical fiber row 3011d having n optical fibers is arranged on these optical fibers in a barrel-piling manner.

Thereafter, the optical fiber arranging member 3017c, the optical fiber row 3011e having n optical fibers and one dummy fiber 3014c are arranged, and the optical fiber row 3011f having n optical fibers is arranged thereon in the same manner as shown in FIG. 31D. Finally, as shown in FIG. 31E, the pressing member 3013 is pressed thereon, and the space is filled with adhesive to be hardened so that the above members are combined into one.

Figure 32:
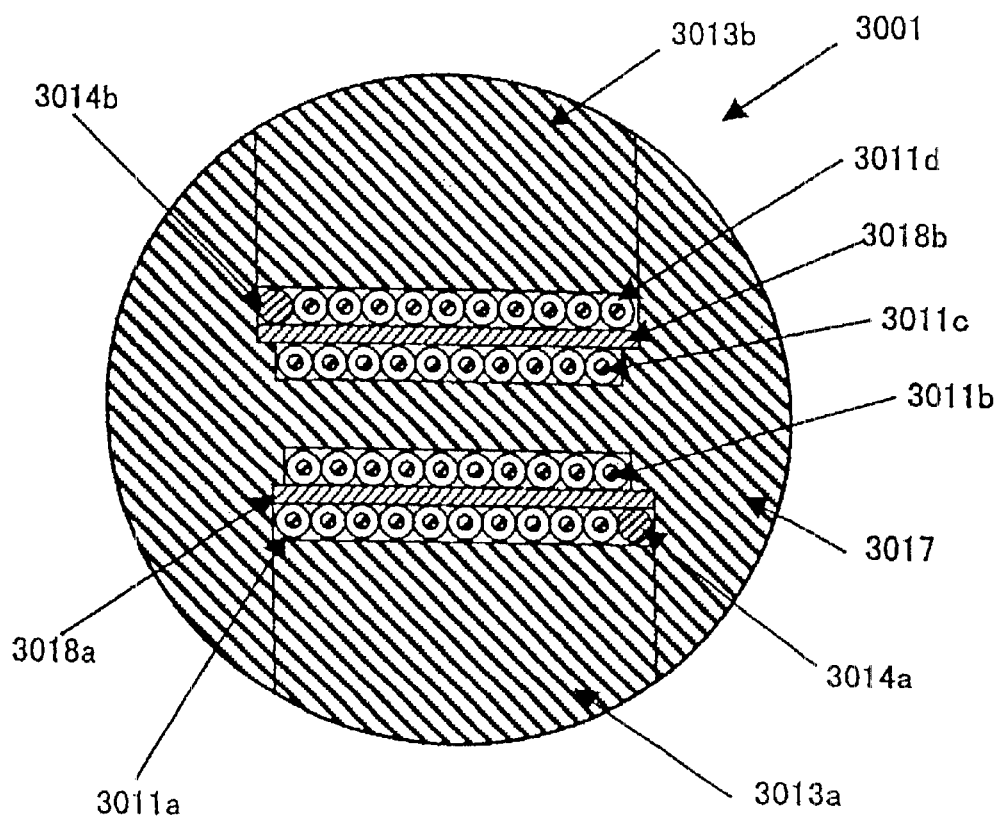
FIG. 32 is a schematic view of one embodiment of an optical fiber array apparatus of the present invention.
Figure 33:
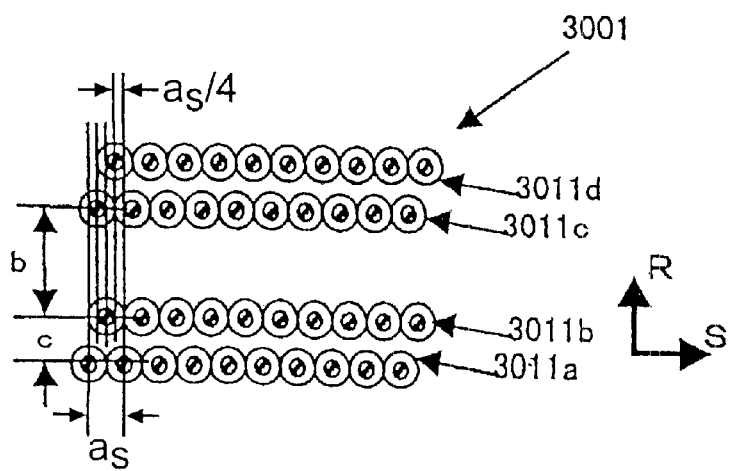
FIG. 33 is a view showing the arrangement of optical fiber emission ends of one embodiment of an optical fiber array apparatus of the present invention.

Another example of the optical fiber array apparatus of the present invention is shown in FIG. 32. The array of the optical fiber emission ends is shown in FIG. 33.

The optical fiber array apparatus 3001 comprises four optical fiber rows (3011a and 3011d) in which 10 optical fiber emission ends are arranged in a straight line. Spacers 3018a and 3018b each having a predetermined thickness are provided between the optical fiber rows 3011a and the 3011b and between the optical fiber rows 3011c and 3011d, respectively.

In each optical fiber row, 10 optical fiber emission ends are arranged in a straight line with a distance of $a_s$. The array direction of the optical fiber emission ends included in each optical fiber row is formed to be parallel to the sub-scanning direction.

If the position of the optical fiber row 3011a is used as a reference, the optical fiber row 3011b is shifted by c in the main scanning direction and $a_s/2$ in the sub-scanning direction. The optical fiber row 3011c is shifted by c+b in the main scanning direction and $a_s/4$ in the sub-scanning direction. The optical fiber row 3011d is shifted by 2c+b in the main scanning direction and $3a_s/4$ in the sub-scanning direction. In this case, b is about 3 to 5 times as large as $a_s$, and c is a sum of the clad diameters of the fibers and the thickness of the spacers.

In this embodiment, the number of optical fibers emission ends of one optical fiber row is 10. However, if the number of optical fibers emission ends is two or more, any number is possible. The favorable range is 8 to 32.

In the case of using the above arrangement of the optical fiber emission ends, the entire imaging area can be imaged without inclining the optical fiber array apparatus as shown in FIG. 6. In such an arrangement, the good image area, which is required for the optical system, can be reduced to an extent that the length of one optical fiber row is sufficiently included as compared with the case in which all optical fiber emission ends are arranged in a straight line and the case in which the optical fiber emission ends are arranged in two rows. Therefore, a large amount of optical fiber emission ends can be arranged without increasing the cost of the optical system and the size thereof.

The shift amount of the optical fiber emission ends in the main scanning direction can be reduced to 2c+b. For this reason, many optical fiber emission ends can be arranged without complicating the electric circuit for controlling timing of imaging with the shift or without increasing the manufacturing cost. In this case, contrivance of the sub-scanning method and the rearrangement of data are not necessarily needed.

Next, the following will explain the method for manufacturing the optical fiber array apparatus with a good positional accuracy of the optical fiber emission ends. The manufacturing process will be shown in FIGS. 34A to 34E.

Figure 34A:
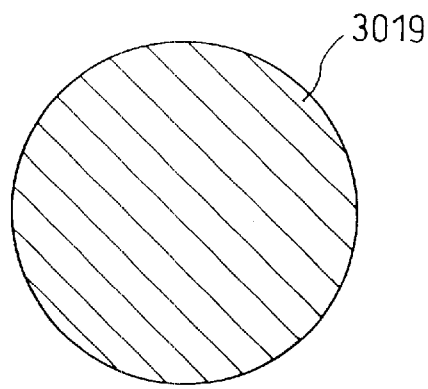
FIGS. 34A to 34E are views showing the manufacturing process of one embodiment of an optical fiber array apparatus of the present invention.
Figure 34B:
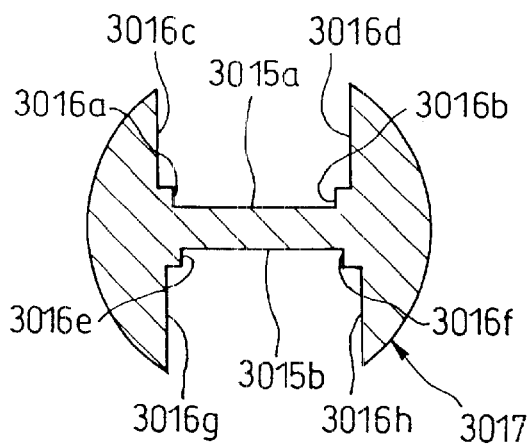

First, as shown in FIG. 34A, the columnar material 3019 for forming an optical fiber support member is prepared. Next, as shown in FIG. 34B, a two-stage fiber fixing groove is formed in upper and lower portions by wire discharge process etc., so as to manufacture an optical fiber support member 3017. In this case, a width of the first-stage of the two-stage fiber fixing groove is such that n optical fibers can be arranged, and a width of the second-stage thereof is such that (n+1) optical fibers can be arranged.

At the time of positioning the optical fibers, the bottom surface of the fiber fixing groove functions as the parallel portions 3015a and 3015b. Also, the first-stage side surfaces 3016a, 3016b, 3016e, 3016f and the second-stage side surfaces 3016c, 3016d, 3016g, 3016h function as restricting portions. For this reason, the parallel portions 3015a and 3015c are precisely processed to be parallel to each other. And, the restricting portions 3016a to 3016h are precisely processed such that the shift of the optical fiber array direction among the restricting portions 3016a 3016c, the restricting portions 3016b, 3016d, the restricting portions 3016e and 3016g, and the restricting portions 3016f and 3016h are set to $a_s/2$ and that the shift of the optical fiber array direction between the restricting portions 3016a, 3016e and the restricting portions 3016b, 3016f is set to $a_s/4$.

Figure 34C:
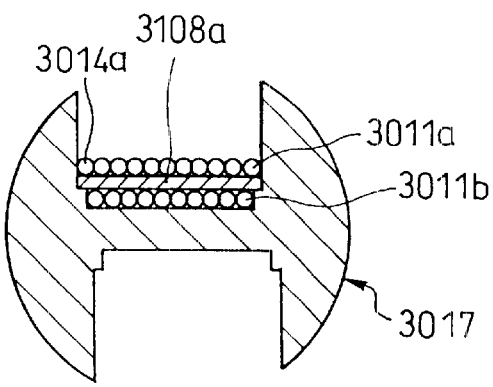

Next, as shown in FIG. 34C, the optical fiber row 3011b having n optical fibers is arranged in the parallel portion 3015a such that the optical fiber positioned at the left edge is closely in contact with the restricting portion 3016a and the optical fiber positioned at the right edge is closely in contact with the restricting portion 3016b. Then, a spacer 3018a is mounted on the optical fiber row 3011b having n optical fibers. Then, the optical fiber row 3011a having n optical fibers and one dummy fiber 3014a whose diameter is equal to the optical fiber serving as the light source are arranged such that the left edge of the dummy fiber 3014*a* is closely in contact with the restricting portion 3016*c* and the optical fiber positioned at the right edge is closely in contact with the restricting portion 3016*d*.

Figure 34D:
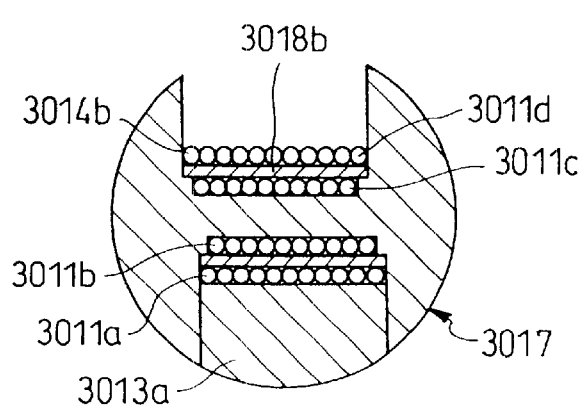
Figure 34E:
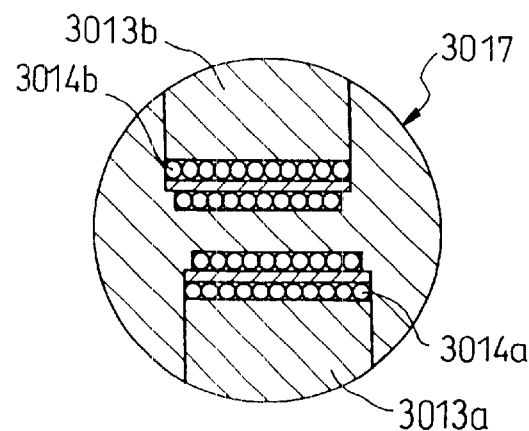

Next, the pressing member 3013*a* is pressed thereon, and upper and lower portions are inverted as shown in FIG. 34D. Thereafter, the optical fiber row 3011*c* having n optical fibers, the spacer 3018*b* are arranged, and the optical fiber row 3011*d* having n optical fibers and one dummy fiber 3014*b* are arranged thereon in the same manner as shown in FIG. 34C. Finally, as shown in FIG. 34E, the pressing member 3013*b* is pressed thereon, and the space is filled with adhesive to be hardened so that the above members are combined into one.

Figure 35:
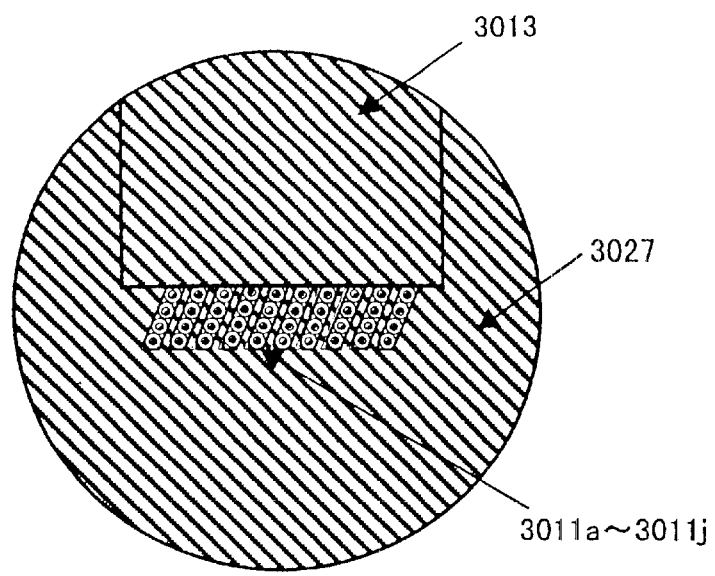
FIG. 35 is a schematic view of one embodiment of an optical fiber array apparatus of the present invention.
Figure 36:
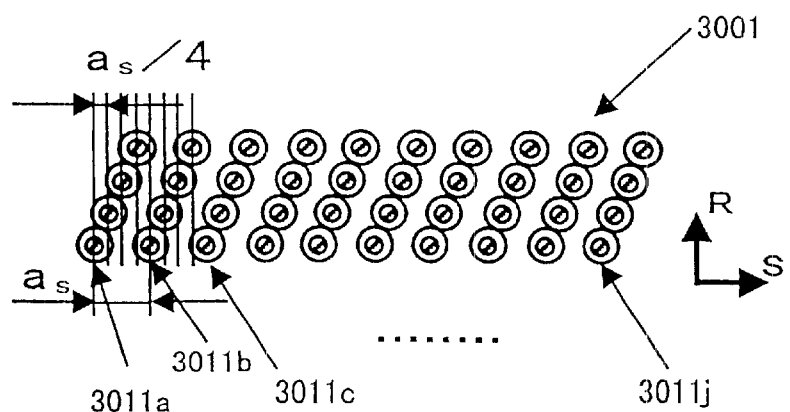
FIG. 36 is a view showing the arrangement of optical fiber emission ends of one embodiment of an optical fiber array apparatus of the present invention.

Another example of the optical fiber array apparatus of the present invention is shown in FIG. 35. The array of the optical fiber emission ends is shown in FIG. 36.

The optical fiber array apparatus 3001 comprises 10 optical fiber rows (3011*a* and 3011*j*) in which four optical fiber emission ends are arranged in a straight line. In each optical fiber row, four optical fiber emission ends are arranged in a straight line to have a distance and an angle such that the projection in the sub-scanning direction becomes $a_s/4$.

If the position of the optical fiber row 3011*a* is used as a reference, the optical fiber row 3011*b* is shifted by $a_s$ in the sub-scanning direction. The optical fiber row 3011*c* is shifted by $2a_s$ in the sub-scanning direction. The optical fiber row 3011*d* is shifted by $3a_s$ . . . , and the optical fiber row 3011*j* is shifted by $9a_s$ in the sub-scanning direction.

In this embodiment, the number of optical fiber emission ends of one optical fiber row is four. Actually, two to eight optical fiber emission ends are practically used, and the most favorable number of optical fiber emission ends is four.

In the case of using the above arrangement of the optical fiber emission ends, the entire imaging area can be imaged without inclining the optical fiber array apparatus as shown in FIG. 6. In such an arrangement, the good image area, which is required for the optical system, can be reduced to an extent that the length of one optical fiber row is sufficiently included as compared with the case in which all optical fiber emission ends are arranged in a straight line and the case in which the optical fiber emission ends are arranged in two rows. Therefore, a large amount of optical fiber emission ends can be arranged without increasing the cost of the optical system and the size thereof.

The shift amount of the optical fiber emission ends in the main scanning direction can be reduced to be below three times as large as the clad diameter of the fiber. For this reason, many optical fiber emission ends can be arranged without complicating the electric circuit for controlling timing of imaging with the shift or without increasing the manufacturing cost. In this case, contrivance of the sub-scanning method and the rearrangement of data are not necessarily needed. Since the array of the optical fiber emission ends can be made compact in the above-mentioned embodiments, a good image range necessary for a lens can be minimized.

In the above embodiment, the optical fiber single row is inserted to each slit of the comblike optical fiber support member, but the optical fiber double row may be inserted. In this case, there is a case in which attention should be paid to the distance between the optical axes of the respective optical fibers in a predetermined projecting direction.

Figure 37:
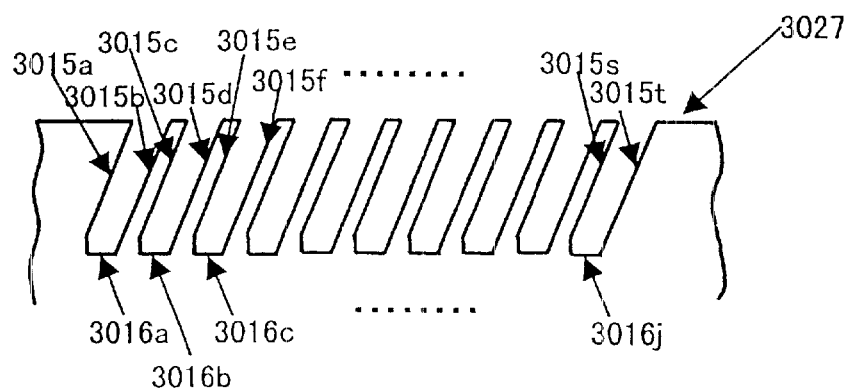
FIG. 37 is an enlarged view of a fiber support portion of one embodiment of an optical fiber array apparatus of the present invention.

Next, FIG. 37 shows an enlarged view of the fiber support portion of a comblike optical fiber support member 3027, which makes it possible to manufacture the optical fiber array apparatus with a good accuracy of the optical fiber emission ends .

As shown in FIG. 37, comblike grooves are formed in the fiber support portion of the comblike optical fiber support member 3027. More specifically, the comblike grooves are formed by wire discharge process so as to have a width where one optical fiber can arranged and a depth corresponding to the number of fiber emission ends of one fiber row. The number of comblike grooves corresponds to that of fiber rows. At the time of positioning the optical fibers, the bottom surface of the fiber fixing groove functions as the restricting portions 3016*a*, 3016*b*, 3016*c* , . . . , 3016*j*. Then, the side surface functions as parallel portions 3015*a*, 3015*b*, 3015*c* , . . . , 3015*t*. For this reason, the parallel portions 3015*a*, 3015*b*, 3015*c* , . . . , 3015*t* are precisely processed so as to be all parallel to each other. The restricting portions 3016*a* to 3016*j* are precisely processed such that the shift in the main scanning direction becomes 0, and that the distance between the adjacent restricting portions in the sub-scanning direction becomes $a_s$, and that the width of the groove ranges 1.012 to 1.020 times as large as the optical fiber diameter.

The actual manufacturing method is as follows. More specifically, 40 fibers are closely arranged at the fiber support portion of the comblike fiber support member 3027, and the pressing member 3013 is pressed thereon. Then, the space is filled with adhesive to be hardened so that the above members are combined into one, thereby the manufacture of the comblike fiber support member can be realized.

The comblike fiber support member 3027 can provide a pair of parallel portions substantially closely contacting both sides of each optical fiber row. Therefore, the position of the direction intersecting at right angles with the parallel portions of the respective optical fibers can be restricted, so that the positioning can be extremely easily carried out.

In the above embodiment, the comblike fiber support member 3027 is formed as one body. However, the comblike fiber support member 3027 can be formed by alternatively stacking branch-like members having a different length on top of each other.

The imaging head apparatus of the present invention can be realized as the:imaging head 92 having the optical fiber array 3001 as explained above.

EXAMPLES

The following will explain an imaging apparatus of a drum outer surface recording type of a specific example of the present invention.

Example 1

Measures Against Trouble

Figure 38:
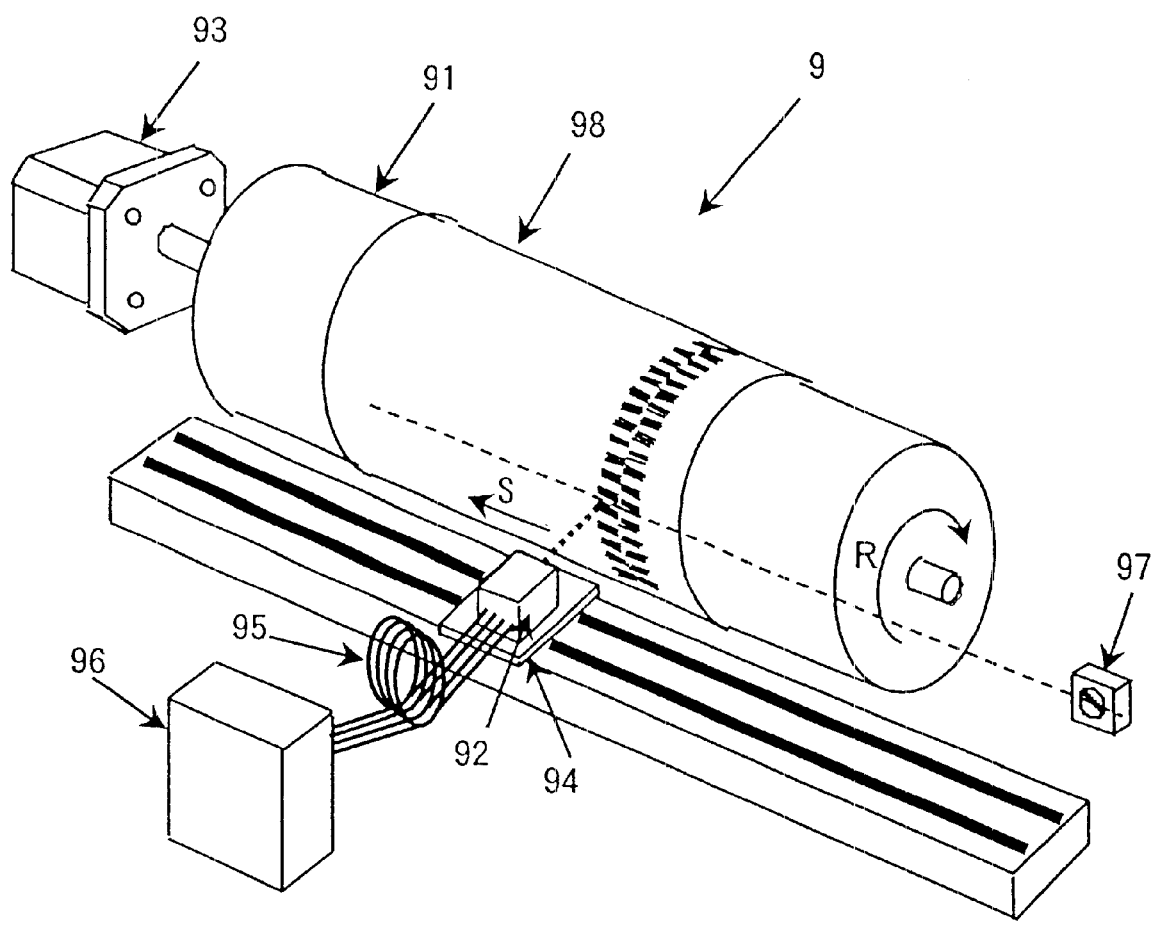
FIG. 38 is a schematic view of one embodiment of an imaging apparatus of the present invention.

FIG. 38 is a schematic view of the imaging apparatus. In this figure, the same reference numerals are added to the portions common to prior art of FIG. 61.

The imaging apparatus 9 comprises the medium support drum 91 for winding an imaging medium 98 around its outer surface, an imaging head 92 including the beam irradiation sources and an optical system for condensing beams from the beam irradiation sources, the beam irradiation source control unit 96 having a beam irradiation source driving device, and cables 95*a* to 95*d* for connecting the imaging head 92 to the beam irradiation source control unit 96. The cables are connectable in a light source block unit to be described later.

The imaging medium 98 is fixed by clamping means (not shown) provided in the medium support drum 91, and the medium support drum 91 has a blank portion where no imaging medium 98 is wound. In the imaging head 92, there are provided 32 beam irradiation sources, which can be individually driven, are divided into four light source blocks including eight beam irradiation sources. The detailed specification of these beam irradiation sources and the array method will be described later.

The optical system for condensing the beams emitted from these beam irradiation sources is arranged and adjusted such that all beams are similarly condensed on the imaging medium 98. The medium support drum 91 is supported by the frame of the imaging apparatus 9, and rotated in a direction of an arrow R in the figure by the standard motor 93. The angle position is always monitored by an encoder (not shown). The imaging head 92 is fixed to the standard linear stage 94 for realizing the parallel movement, and moves in parallel to the direction of an arrow S in the figure. As the linear stage, either one of the linear motor typed linear stage, which is directly driven by the linear motor, or the ball screw typed linear stage using the ball screw typed linear guide may be used.

The block diagram of the imaging apparatus 9 is shown in FIG. 1. In the imaging apparatus shown in FIG.1, the imaging head 14 includes four light source blocks A to D (15a to 15d), and each block comprises eight beam irradiation sources (not shown). The light source blocks are connected to the beam irradiation source driving devices A to D (13a to 13d), respectively, and eight beam irradiation source driving circuits are included in each beam irradiation source driving device. Moreover, each beam irradiation source driving device and the memory 12 for storing the imaging data are connected to the main control device 11.

Next, the actual imaging method using the imaging apparatus 9 of the above example will be explained.

When power is turned on, the linear stage 94 on which the imaging head 92 is loaded is moved to the position where the beams can be focused on a light receiving element 97. The light receiving element 97 is provided at the position corresponding to the focal distance in winding the imaging medium 98 around the medium support drum 91. The light receiving element 97 receives the beams and outputs a signal corresponding to the optical output to the main control device 11.

As a result, the signals for controlling the beam irradiation sources are transmitted to the beam irradiation source driving devices A to D from the main control device 11. The beam irradiation sources are turned on one by one. At this time, the optical outputs of all beam irradiation sources are sequentially adjusted to be a predetermined value with reference to the signal of the light receiving element 97. In this case, the predetermined value is an output enough to generate a change in an imaging characteristic such as projections and depressions according to two-dimensional imaging data or a change in solubility to solvent on the surface of the imaging medium 98.

When the above-mentioned initial output adjustment operation is thus ended and the command of starting the imaging is input to the main control device, the rotation of the medium support drum 91 is first started. Then, after the rotation of the medium support drum 91 achieves the stable rotation speed necessary for the imaging state, timing of imaging is adjusted for each beam irradiation source. More specifically, timing of imaging is adjusted to justify the positions of the lines of the respective beam irradiation sources to be imaged in the main scanning direction based on the reference position signal of the main scanning direction output from the encoder.

At this time, the main control device 11 transmits the signals to switch the respective beam irradiation sources in accordance with imaging data with reference to imaging data stored in the memory 12 for storing imaging data. By this operation, the imaging for 32 lines (4 blocks×8 beams) in the main scanning direction is completed. In the case of using the linear motor typed linear stage, the linear stage 94 on which the imaging head 92 is mounted moves as follows. More specifically, the linear stage 94 moves to the position where the imaging for next 32 lines in the direction of an arrow S in the figure can be executed before the imaging for next 32 lines is started, that is, while the imaging head 92 passes through the blank portion of the medium support drum 91. In the case of using the ball screw typed linear stage, the linear stage 94 moves as follows. More specifically, the linear stage 94 moves to the position where the imaging for next 32 lines in the direction of an arrow S in the figure can be executed while the medium support drum 91 rotates one time.

The above series of operations are repeated until the imaging head 92 reaches the end of the imaging area in the sub-scanning direction. As a result of the imaging operation, a two-dimensional change in an imaging characteristic such as projections and depressions or a change in solubility to solvent according to imaging data is generated on the imaging medium 98.

Next, the following will shows an example of the array of the beam irradiation sources in the imaging head 92 of the imaging apparatus 9. As general means for realizing the plurality of beam irradiation sources, the laser diode array and the fiber array are used, and each means will be explained as follows.

(a) Laser diode array

Figure 39:
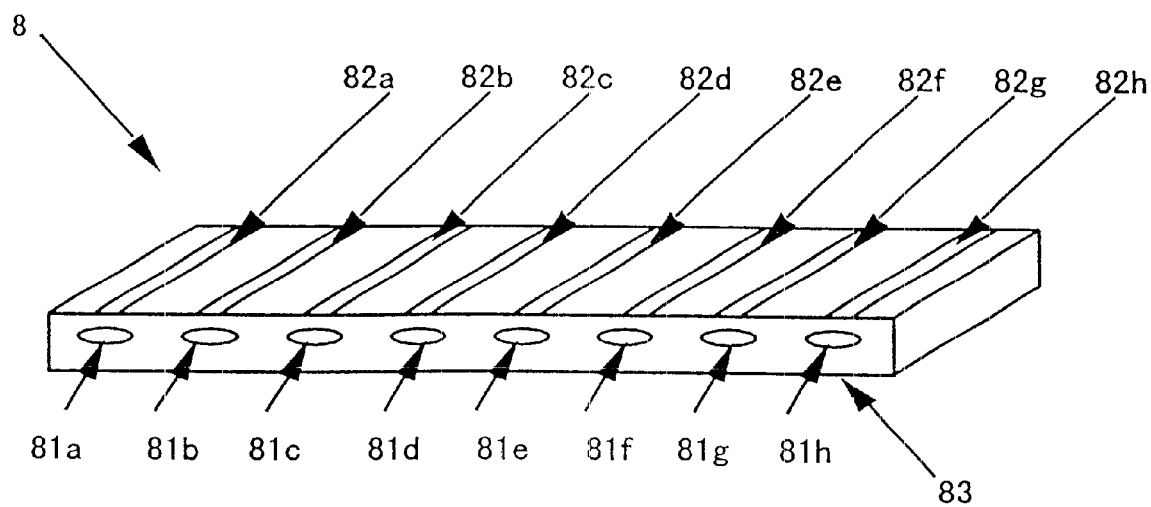
FIG. 39 is an outline view of a laser diode array of one embodiment of an imaging apparatus of the present invention.

The beam irradiation sources are formed in the laser diode array 8 as shown in FIG. 39. The laser diode array 8 is formed of a GaAs compound semiconductor. Specifically, eight laser diodes, which can be independently driven, are formed in one chip. The laser diodes have laser beam emission ends 81a to 81h, drive side electrodes 82a to 82h, and the rear face common electrode 83 for all laser diodes, respectively. The laser beam emission ends are used as beam irradiation sources.

The number of laser diodes included in the laser diode chip is generally referred to as a channel number. By the flow of a predetermined current to the drive side electrodes 82a to 82h, the laser beams of the infrared area having outputs of about 0.4 to 1.0 W and wavelengths of about 780 to 960 nm are emitted from the corresponding laser beam emission ends 81a to 81h. In this case, the predetermined current means a current value of more than a threshold value at which the laser diode starts the laser oscillation. More specifically, the threshold current is about 0.2 to 0.6 A, and the actual operation current is about 0.7 to 1.3 A. The widths of the respective laser beam emission ends are about 80 to 120 μm and the distance therebetween is about 150 to 250 μm. The distance between the electrodes on the driving side is the same extent as the above. The widths of the laser beam emission ends are the sizes, which are necessary for obtaining the above extent of high outputs. The distance between the laser beam emission ends and the distance between the electrodes on the driving side are the distance, which is necessary for selectively supplying the current when the laser diodes are operated.

The typical array methods of the beam irradiation sources will be explained.

The first array method is as follows. More specifically, all beam irradiation sources are formed in the same semiconductor chip, and the light source blocks are arrayed in the same direction as the direction where the beam irradiation sources of the block are arranged, and the structure as shown in FIG. 2 is formed. In the laser diode array 8 of FIG. 39, eight beam irradiation sources are included in one semiconductor chip. In the above case, 32 beam irradiation sources are prepared in one chip, and divided into four light source blocks A to D (15*a* to 15*d*). In this case, eight beam irradiation sources are included in one light source block.

In incorporating the laser diode array to the imaging head, the laser diode array is inclined by a predetermined angle θ as shown is FIG. 6. If imaging resolution is 2540 dpi, the dot distance $d_p$ on the imaging medium is 10 μm. If the magnification of the optical system is ⅕, the dot distance $d_s$ at the light source surface is 50 μm, and the distance $a_s$ between the beam irradiation sources is 200 μm. Then, the angle θ becomes 75.5° from equation (1).

As shown in FIG. 3, when one of the beam irradiation sources in the block A (15*a*) is out of order, the block A (15*a*) and the beam irradiation source driving device A (13*a*) are separated from each other. Then, software for outputting imaging data of the main control device 11 is changed from software for all four blocks to one for three blocks, and blocks B to D (15*b* to 15*d*) are used. This reduces the imaging speed to ¾, but the imaging operation can be continued without stopping the apparatus.

At this time, the optical system incorporated into the imaging head is designed such that the beams sent from all light source blocks can be condensed in the same manner so as to condense the beams emitted from the beam irradiation sources onto the imaging medium. For this reason, the mechanical readjustment of the optical system is not needed. Also, the feed amount of the linear stage in the sub-scanning direction at the time of imaging operation may be changed from 320 μm (10 μm×32) for four blocks to 240 μm (10 μm×24) for three blocks.

Also, in consideration of the cost reduction, the imaging head using the above array can be applied to the imaging apparatus in which the imaging speed is restrained. More specifically, as shown in FIG. 4, if only one beam irradiation source driving device is connected in order to use the block A of four blocks, the imaging head can be directly applied. At this time, the number of expensive beam irradiation driving devices may be one, the electric circuit of the main control device and the software can be simplified, so that the cost reduction can be realized.

Moreover, if the beam irradiation source of the block in use is out of order, another normal light source block is connected to the beam irradiation driving device, thereby easily making it possible to reproduce the imaging apparatus having the same specification. At this time, the optical system incorporated into the imaging head is designed such that the beams sent from all light source blocks can be condensed in the same manner so as to condense the beams emitted from the beam irradiation sources onto the imaging medium. For this reason, if software for compensating for the position of each beam irradiation source is prepared, the mechanical readjustment of the optical system, which takes much time, is not needed.

At the imaging head manufacturing stage, even if a part of the beam irradiation sources in the light source block becomes defective, the beam irradiation source can be used if the beam irradiation sources of the other light source blocks are normal. Namely, the beam irradiation source can be used as an imaging apparatus whose imaging speed is restrained in consideration of the above-mentioned cost reduction. Now suppose that the yield of one beam irradiation source is 90%. In this case, the yield of the light source block having eight beam irradiation sources becomes 43%.

As a result, the array appearing rate with respect to the using condition is shown as Table 1. Then, if the using condition is limited, about 90% of the beam irradiation source can be used.

TABLE 1

| Using Condition | Rate (%) |
|---|---|
| All Blocks Usable | 3.4 |
| Continuous Three Blocks Usable | 9.1 |
| Continuous Two Blocks Usable | 27.1 |
| Continuous One Block Usable | 49.9 |
| Total | 89.5 |

The calculation of the above Table is applied to the case in which the laser diodes of the laser diode array are regularly divided into blocks from the edge in order. However, the block division is flexibly set in accordance with the position having a defectiveness, thereby making it possible to obtain much higher yield.

The connection between the laser diode array and the beam irradiation source driving device is carried out in accordance with the above-set block division. The typical example in which the above method is useful will be explained.

It is assumed that the laser diode array having 16 channels is divided into four blocks each having four channels. If the first, sixth, eleventh, sixteenth laser diodes are defective, all blocks become defective in the method in which the laser diodes are regularly divided into blocks from the edge in order. However, the use of the second to fifth, seventh to tenth, and twelfth to fifteenth laser diodes makes it possible to use three light source blocks.

The second array method is as follows. More specifically, the respective light source blocks are arrayed in the same direction as the direction where the beam irradiation sources of the block are arrayed to have a predetermined angle, and the structure as shown in FIG. 5 is formed. Similar to the laser diode array of FIG. 39, eight beam irradiation sources are included in one semiconductor chip. One laser diode array corresponds to the light source block. This laser diode array is sequentially shifted in the sub-scanning direction by ¼ of the distance $a_s$=200 μm between the beam irradiation sources, that is, 50 μm so as to be mounted on the imaging head. One example of the above mounting method will be described later. If the laser beams emitted from the beam irradiation sources are condensed on the imaging medium by the optical system having the magnification of ⅕ with respect to the laser diode bonding surface, the imaging can be executed with resolution of 2540 dpi.

In the above-mentioned arrangement, the good image area parallel to the bonding surface of the laser diodes, which is required for the optical system, can be reduced to an extent that a size corresponding to one block is sufficiently included, that is, 1.6 mm (distance (200 μm) between the beam irradiation sources×the number of beam irradiation sources (8)). This value is much smaller than the case of 6.4 mm in which all beam irradiation sources are arranged in a straight line. Therefore, the reduction in the manufacturing cost of the optical system and the miniaturization can be realized.

Also, in the above-mentioned arrangement of the beam irradiation sources, when the beam irradiation source of the block A (15*a*) is out of order, two alternative operations explained set forth below can be carried out.

The first alternative operation is that the feed amount of the imaging head in the sub-scanning direction (normally 320 µm) and software for outputting image data are changed in accordance with the position of the troubled beam irradiation source.

It is assumed that the troubled portions of the beam irradiation sources are third and fourth beam irradiation sources of the light source block A as shown in FIG. 7. Software is changed to such software as switches the feed amount to 80 µm, 240 µm, 80 µm, 240 µm, . . . 80 µm, 240 µm, and outputs data in accordance with the change in the feed amount. In this case, the imaging speed is reduced to ½ but the imaging operation can be continued without stopping the apparatus.

On the other hand, suppose that the troubled portions of the beam irradiation sources are third to sixth beam irradiation sources of the light source block A as shown in FIG. 8. Software is changed to such software as switches the feed amount to 80 µm, 80 µm, 160 µm, 80 µm, 80 µm, 160 µm, . . . 80 µm, 80 µm, 160 µm and outputs data in accordance with the change in the feed amount. In this case, the imaging speed is reduced to ⅓ but the imaging operation can be continued without stopping the apparatus. In this case, the readjustment of the position of the beam irradiation sources is not required. Note that the first alternative operation can be realized when the linear motor typed linear stage is used.

The second alternative operation will be explained as follows. More specifically, as shown in FIG. 9, the block A (15a) and the beam irradiation source driving device A (13a) are separated from each other. Also, a block C (15c) and a beam irradiation source driving device C (13c) are separated from each other. Moreover, a block D (15d) and a beam irradiation source driving device D (13d) are separated from each other. Then, the software for outputting imaging data of the main control device 11 is changed from one for all four blocks to one for one block. The light source blocks of the imaging head are inclined by a predetermined angle, and only block B (15b) is used. As a result, the imaging speed is reduced to ¼, but the imaging operation can be continued without stopping the imaging apparatus. Any block may be, of course, used if blocks C and D are normal. At this time, the predetermined angle is $\cos^{-1}$ (¼)=75.5° in order to maintain the same resolution. Note that the second alternative operation can be realized when either one of the linear motor typed linear stage and the ball screw typed linear stage is used.

Next, the mounting method for arraying the laser diode as shown in FIG. 5 will be explained. One example of the mounting method will be shown in FIGS. 40 and 41.

A laser diode array mounting unit 5 comprises a heat diffusion member 51 of thermal conductivity for escaping heat generated in the laser diode array to a heat sink of an outer unit, a main mounting plate 52, sub-mounting plate adjusting screws 53a to 53d, sub-mounting plates 54a to 54d, a terminal fixing plate 55, and electrode extracting terminals 56a to 56h, 57a to 57h, 58a to 58h, 59a to 59h.

Figure 40:
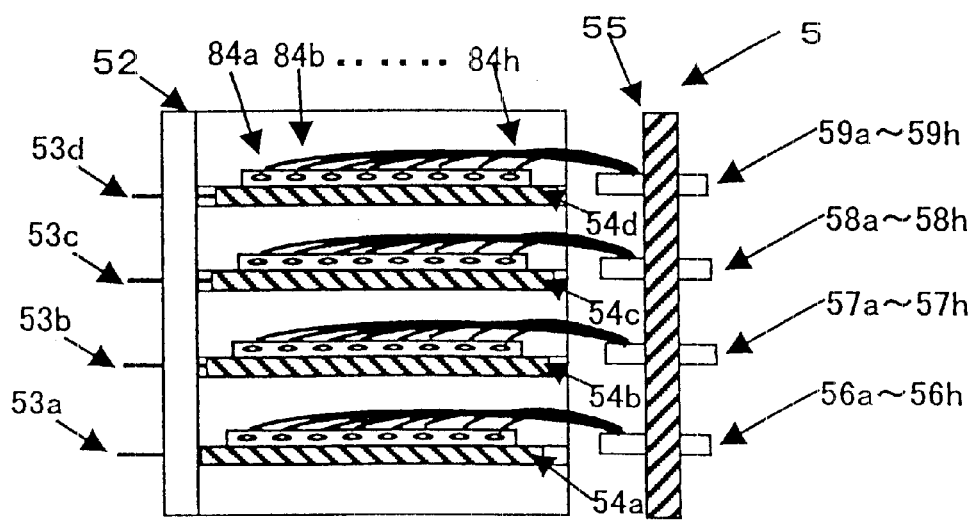
FIG. 40 is an outline view showing an example in which the laser diode array of one embodiment of an imaging apparatus of the present invention is arranged.
Figure 41:
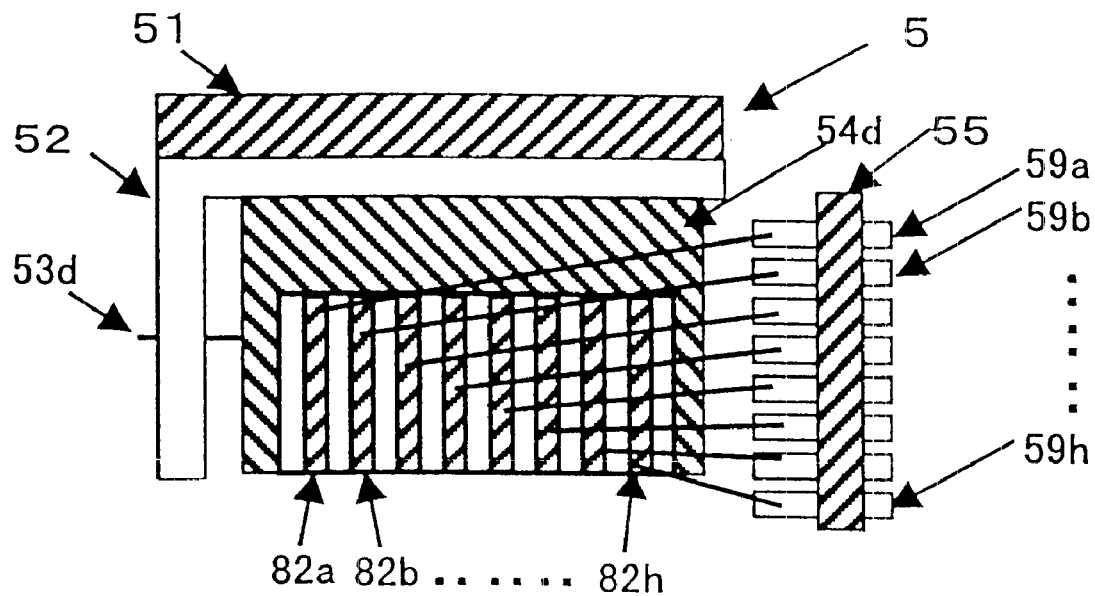
FIG. 41 is an outline view showing an example in which the laser diode array of one embodiment of an imaging apparatus of the present invention is arranged.

FIG. 40 is a view seeing from a direction of the emission ends of the laser beam source, and FIG. 41 is a view seeing from the drive electrode side of the laser diode array. These figures show only the sub-mounting plate adjusting screw 53d, the sub-mounting plate 54d, and the electrode extracting terminals 56a to 56h, which are provided at an uppermost portion. The sub-mounting plate adjusting screws 53a to 53c, the sub-mounting plates 54a to 54c, and the electrode extracting terminals 56a to 56h, 57a to 57h, 58a to 58h, 59a to 59h are provided at the similar position of the lower portion. As shown in FIGS. 40 and 41, the main mounting plate 52 is L-shaped. Also, the main mounting plate 52 has a groove for fixing the sub-mounting plates 54a to 54d such that the position of the beam irradiation sources of the laser array in the main scanning direction is set to have a predetermined space (e.g., 1 mm). Moreover, the sub-mounting plate adjusting screws 53a to 53d are provided therein.

First, the laser diode array is die-bonded to the sub-mounting plates 54a to 54d formed of material having a good thermal conductivity and electrical conductivity such that the back face common electrode ohmic-contacts. Next, the sub-mounting plate 54a to which the laser diode array is die-bonded is set to the main mounting plate formed of material having a good thermal conductivity and electrical conductivity.

Then, the conductive electrode extracting terminals 56a to 56h are set to the insulating terminal fixing plate 55. Then, the drive side electrode 82a of the laser diode array 8 and the electrode extracting terminal 56a the drive side electrode 82b and the electrode extracting terminal 56b, . . . and the drive side electrode 82h and the electrode extracting terminal 56h are wire-bonded by wires 84a to 84h, respectively. Next, the sub-mounting plate 54b to which the laser diode array is die-bonded is set to the main mounting plate.

At this time, the position of the beam irradiation sources on the sub-mounting plate 54b in the sub-scanning direction is slightly adjusted so as to be $a_s/4=50$ µm with respect to the position of the beam irradiation sources on the sub-mounting plate 54a in the sub-scanning direction by use of the sub-mounting plate adjusting screw 53b. Then, similarly to the sub-mounting plate 54a the drive side electrode and the electrode extracting terminal are wire-bonded.

The similar work is subjected to the sub-mounting plate 54c and 54d. Finally, the heat diffusion member 51 is fixed to the main mounting plate 52. As a result, the laser diode array mounting unit 5 shown in FIG. 41 is completed.

In this example, the laser diodes of edge surface emission are layered so as to realize the two-dimensional array of the beam irradiation sources. However, the similar two-dimensional array can be realized by use of a surface emission laser.

Figure 46:
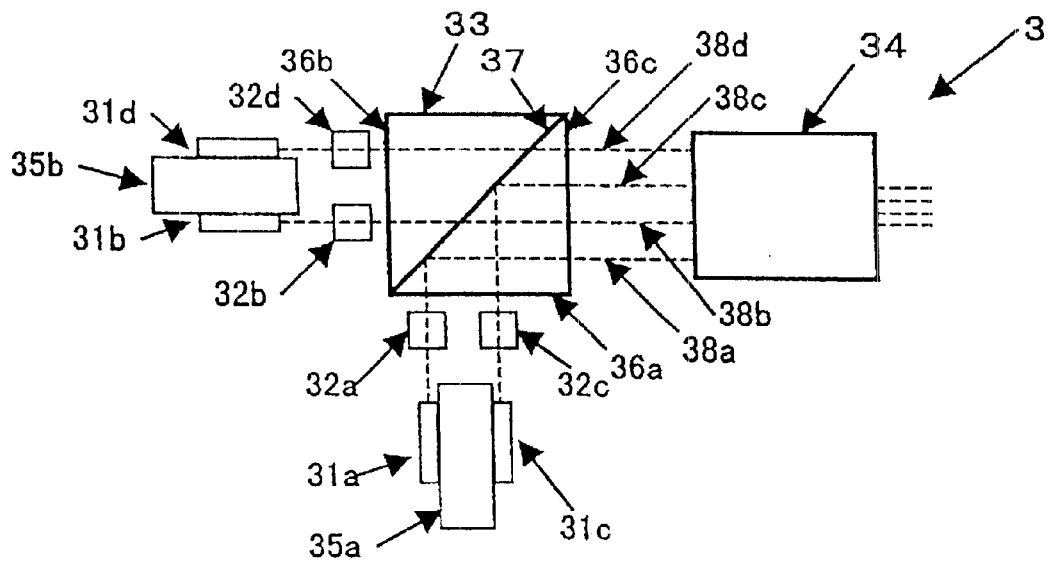
FIG. 46 is a view showing an arranging method of beam irradiation sources by an optical system of one embodiment of an imaging apparatus of the present invention.

The array of the beam irradiation sources of the present invention can be realized by the optical system using optical parts such as a prism. One example is shown in FIG. 46. An imaging head 3 comprises four laser diode arrays 31a to 31d including eight laser diodes, four individual optical systems 32a to 32d for carrying out a conversion of emission light of each laser diode array to parallel light and a slight adjustment of the laser beam position, a polarizing prism 33 having a surface 37 whose reflectance and transmittance are largely different depending on S polarization and P polarization in its interior, a miniature optical system 34, and two heat diffusion members 35a to 35b.

The respective laser diode arrays 31a to 31d have the structure as shown in FIG. 39, and the distance between the laser diodes therein is 200 µm. Among the laser diode arrays 31a to 31d, the laser diode arrays 31a and 31c are mounted on the heat diffusion member 35a such that the emission ends of the respective laser diodes are arranged in a direction perpendicular to paper as shown in FIG. 41. A predetermined current is made to flow to each driving side electrode, so that the laser beam of S polarization is emitted to the surface 37. Similarly, the laser diode arrays 31b and 31d are mounted on the heat diffusion member 35b. Then, a predetermined current is made to flow to each driving side electrode, so that the laser beam of P polarization is emitted to the surface 37.

Figure 47:
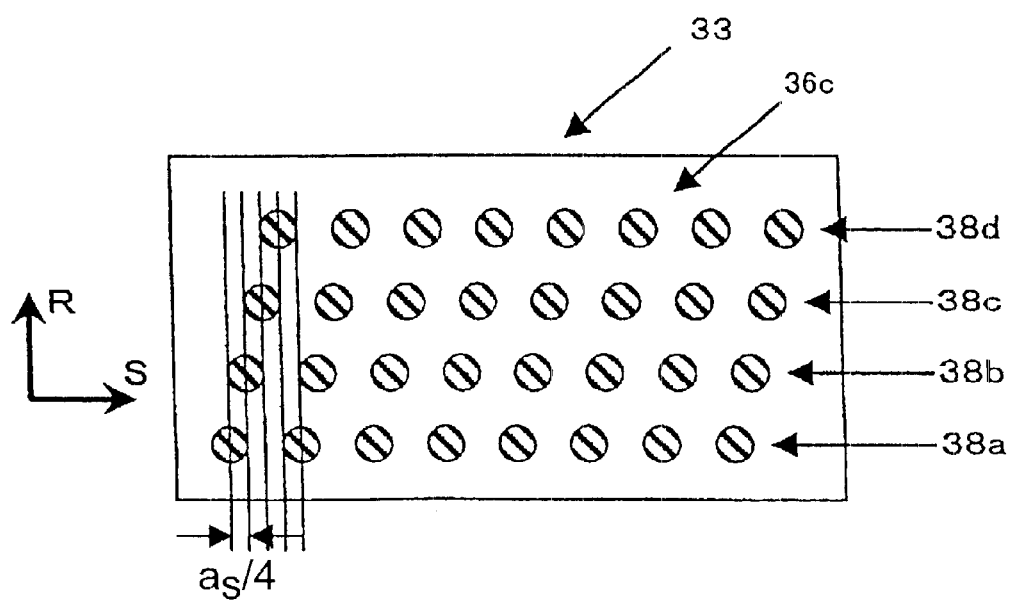
FIG. 47 is a view showing the array of the laser beams of one embodiment of an imaging apparatus of the present invention.

The laser beams emitted from the laser diode arrays 31a and 31c are converted to parallel light by the individual optical systems 32a and 32c, and the parallel light enters the interior of the prism from a surface 36a of the polarizing prism 33. Also, the laser beams emitted from the laser diode arrays 31b and 31d are converted to parallel light by the individual optical systems 32b and 32d, and the parallel light enters the interior of the prism from a surface 36b of the polarizing prism 33. Among these laser beams, the laser beams of S polarization, that is, the laser beams emitted from the laser diode arrays 31a and 31c are reflected at the surface 37 of the prism. On the other hand, the laser beams of P polarization, that is, the laser beams emitted from the laser diode arrays 31b and 31d are transmitted through the surface 37 of the prism, and are finally emitted to the outer unit from the surface 36c. The positions of the laser beams 38a to 38d at the surface 36c are shown in FIG. 47.

Actually, the individual optical systems 32a to 32d are controlled such that the laser beams 38a to 38d are arranged such that the shift in the sub-scanning direction S becomes ¼ of the distance between the laser diodes, that is, 50 μm. Moreover, the distance between these laser beams in the sub-scanning direction S becomes 10 μm by the miniature optical system 34 with a magnification ⅕. As a result, the imaging head, which is capable of imaging with 2540 dpi, is realized.

Moreover, another effect of the present invention will be explained in a case where a series of imaging apparatus having a different specification and price is provided using one kind of laser diode array chip. This is the method in which a suitable block division and the number of beam irradiation driving devices are selected in accordance with the restrictions of performance and cost resultant from the usage of the imaging apparatus, that is, requirements of the size of the imaging area, resolution, imaging time, level of reliability, the cost of the imaging head including the beam irradiation source driving devices.

For example, in the case of the laser diode array chip with 72 channels, it is possible to select the laser diode array chip from 72 channels×1 block, 36 channels×2 blocks, 24 channels×3 blocks, 18 channels×4 blocks, 12 channels×6 blocks, and 9 channels×8 blocks. Thus, the use of one kind of common laser diode array chip in a series of imaging apparatus results in the restraint on the developing cost of the laser diode array chip, which is a key device, and the semiconductor process cost. As the same time, there are industrial merits in the manufacture of the imaging apparatus, and the repairement.

(b) Fiber array

Figure 42:
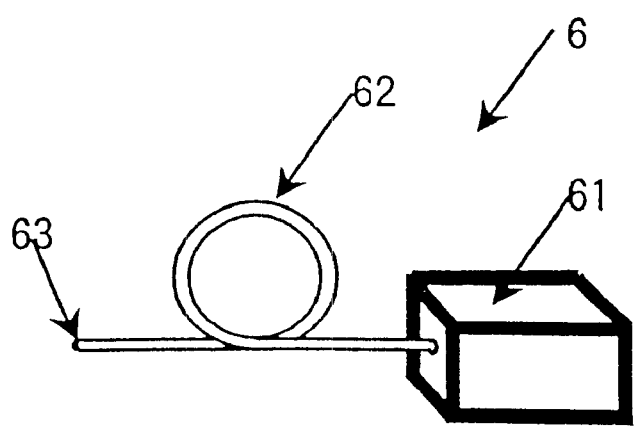
FIG. 42 is an outline view of a fiber output laser diode of one embodiment of an imaging apparatus of the present invention.

FIG. 42 is an outline view of a laser apparatus for a fiber output. The laser apparatus 6 comprises a package portion 61 and an optical fiber 62. The package portion 61 contains the laser diode chip and the optical system for making the laser beams incident onto the optical fiber from the laser diode. The optical fiber 62 guides the laser beam to the outer unit. Then, the laser beam is emitted from a fiber emission end 63. Then, the fiber array is formed by arranging the plurality of fiber emission ends 63 in an array form using the plurality of laser apparatus for a fiber output. The beam irradiation sources in the present invention indicate the emission ends 63.

Next, the following will explain the way of arranging the fiber array.

Figure 43:
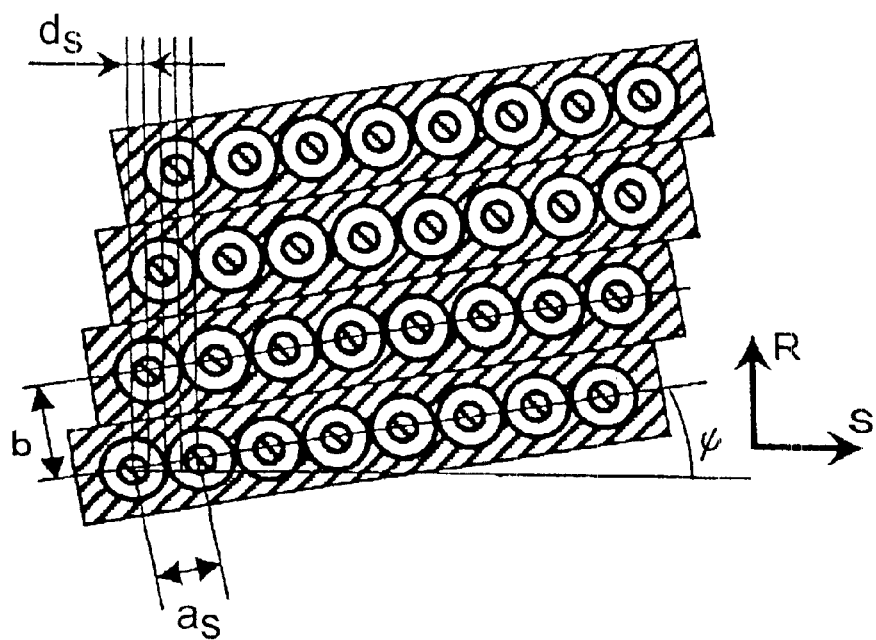
FIG. 43 is a view showing the arrangement of beam irradiation sources of one embodiment of an imaging apparatus of the present invention.
Figure 44:
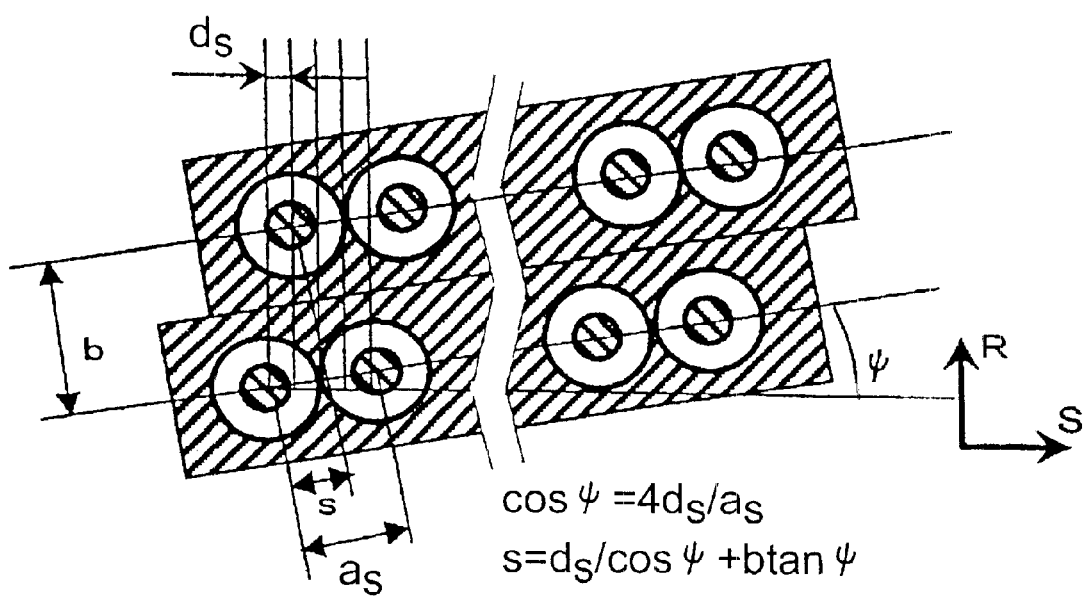
FIG. 44 is an enlarged view showing the arrangement of beam irradiation sources of one embodiment of an imaging apparatus of the present invention.

The first array method is shown in FIG. 43. The light source blocks are arranged to be inclined by ψ from the sub-scanning direction S. It is assumed that the distance $a_s$ between the fibers of the light source block is 125 μm, and the distance b between the respective light source blocks is 150 μm, and the magnification of the optical system is ⅓. In this case, $d_s$ for realizing resolution of 2540 dpi is 30 μm. As being obvious from FIG. 44 enlarging a part of FIG. 43, ψ becomes about 16.3° since there is the relationship of cos ψ=4$d_s$/$a_s$. Here, number 4 corresponds to the number of light source blocks. Also, the shift amount s of the light source blocks becomes about 75 μm since there is the relationship of the following equation (6) from FIG. 44.

$$s=d_s/\cos \psi+\tan \psi \qquad (6)$$

In the case of the above arrangement, the good image area, which is required for the optical system, can be reduced to an extent that a size corresponding to one block is sufficiently included, that is, 1 mm (distance (125 μm) between the beam irradiation sources×the number of beam irradiation sources (8)). This value is much smaller than the case of 4 mm in which all beam irradiation sources are arranged in a straight line. Therefore, the reduction in the manufacturing cost of the optical system and the miniaturization can be realized. Also, the simplification of the electric circuit for controlling the imaging timing to justify the dot position in the main scanning direction and the cost reduction thereof are possible.

Also, in the above-mentioned arrangement of the beam irradiation sources, when the beam irradiation source of the block A (15a) is out of order, two alternative operations set forth below can be carried out.

The first alternative operation is that the feed amount of the imaging head in the sub-scanning direction (normally 320 μm) and software for outputting image data are changed in accordance with the position of the troubled beam irradiation source.

It is assumed that the troubled portions of the beam irradiation sources are third and fourth beam irradiation sources of the light source block A. Software is changed to such software as switches the feed amount to 80 μm, 240 μm, 80 μm, 240 μm, . . . 80 μm, 240 μm, and outputs data in accordance with the change in the feed amount. In this case, the imaging speed is reduced to ½ but the imaging operation can be continued without stopping the apparatus.

On the other hand, suppose that the troubled portions of the beam irradiation sources are third to sixth beam irradiation sources of the light source block A as shown in FIG. 8. Software is changed to such software as switches the feed amount to 80 μm, 80 μm, 160 μm, 80 μm, 80 μm, 160 μm, . . . 80 μm, 80 μm, 160 μm and outputs data in accordance with the change in the feed amount. In this case, the imaging speed is reduced to ⅓ but the imaging operation can be continued without stopping the apparatus. In this case, the readjustment of the position of the beam irradiation sources is not required. Note that the first alternative operation can be realized when the linear motor typed linear stage is used.

The second alternative operation will be explained as follows. More specifically, as shown in FIG. 9, the block A (15a) and the beam irradiation source driving device A (13a) are separated from each other. Also, a block C (15c) and a beam irradiation source driving device C (13c) are separated from each other. Moreover, a block D (15d) and a beam irradiation source driving device D (13d) are separated from each other. Then, the software for outputting imaging data of the main control device 11 is changed from one for all four blocks to one for one block. The light source blocks of the imaging head are inclined by a predetermined angle and only block B (15b) is used. As a result, the imaging speed is reduced to ¼, but the imaging operation can be continued without stopping the imaging apparatus. Any block may be, of course, used if blocks C and D are normal. At this time, the predetermined angle is $\cos^{-1}(30/125)=76.1°$ in order to maintain the same resolution. Note that the second alternative operation can be realized when either one of the linear motor typed linear stage and the ball screw typed linear stage is used.

The second array method will be shown in FIG. 10. In each block, eight beam irradiation sources are arranged in a straight line to have a distance of $a_s=120 \mu m$. The respective light source blocks are arranged such that the array direction of the beam irradiation sources included therein is parallel to the sub-scanning direction. The distance b between the blocks B and C is 300 $\mu m$. Since ds is 30 $\mu m$ and the magnification of the optical system is 1/3, resolution is 2540 dpi. If the position of the light source block A (15a) is used as reference, the light source block B (15b) is shifted by 69 $\mu m$ in the main scanning direction and 60 $\mu m$ in the sub-scanning direction. The light source block C (15c) is shifted by 369 $\mu m$ in the main scanning direction and 30 $\mu m$ in the sub-scanning direction. The light source block B (15d) is shifted by 438 $\mu m$ in the main scanning direction and 90 $\mu m$ in the sub-scanning direction.

In the case of using the above arrangement of the fiber array, the entire imaging area can be imaged without inclining the array in the sub-scanning direction as shown in FIG. 6. Also, the good image area, which is required for the optical system, can be reduced to an extent that a size corresponding to one block is sufficiently included, that is, 0.96 mm (distance (120 $\mu m$) between the beam irradiation sources×the number of beam irradiation sources (8)) as compared with the case in which all beam irradiation sources are arranged in a straight line. Therefore, this value is much smaller than the case of 3.84 mm in which all 32 beam irradiation sources are arranged in a straight line. The reduction in the manufacturing cost of the optical system and the miniaturization can be realized. Also, the simplification of the electric circuit for controlling the imaging timing to justify the dot position in the main scanning direction and the cost reduction thereof are possible.

When the beam irradiation source of the block A (15a) is out of order, two alternative operations set forth below can be carried out.

The first alternative operation is that the feed amount of the imaging head in the sub-scanning direction (normally 320 $\mu m$) and software for outputting image data are changed in accordance with the position of the troubled beam irradiation source. This is the same as the operation explained in the fist array method.

The second alternative operation will be explained as follows. More specifically, as shown in FIG. 11, the block A (15a) and the beam irradiation source driving device A (13a) are separated from each other. Also, a block B (15b) and a beam irradiation source driving device B (13b) are separated from each other. Then, the software for outputting imaging data of the main control device 11 is changed from one for all four blocks to one for two blocks. The light source blocks of the imaging head are inclined by a predetermined angle θ as shown in FIG. 12 and only blocks C and D (15c and 15d) are used. As a result, the imaging speed is reduced to ½, but the imaging operation can be continued without stopping the imaging apparatus.

At this time, the predetermined angle is $\cos^{-1}(½)=60°$, so that the same resolution can be maintained. Note that the second alternative operation can be realized when either one of the linear motor typed linear stage and the ball screw typed linear stage is used.

Figure 45:
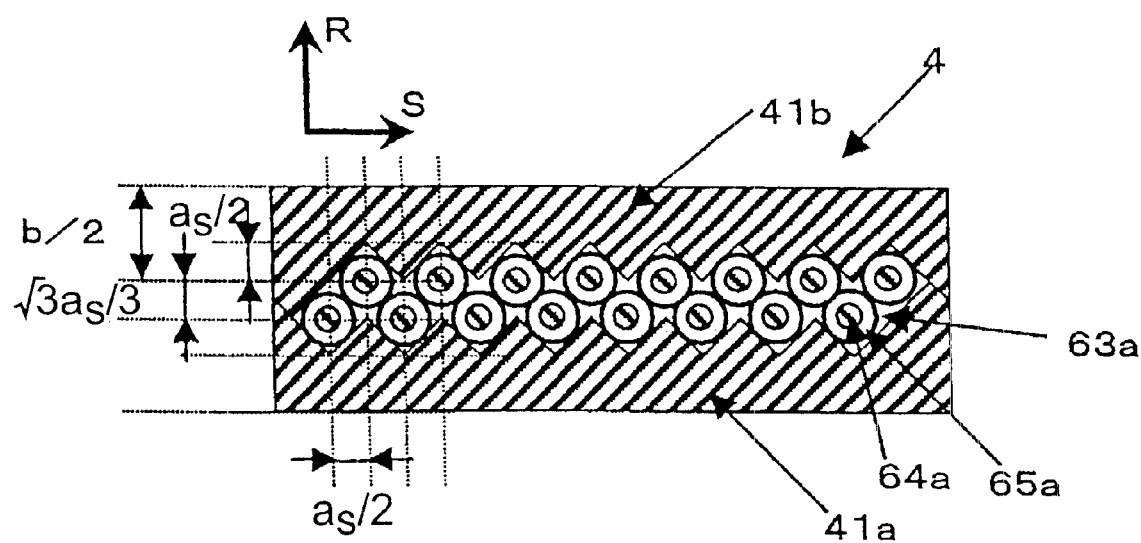
FIG. 45 is a view showing an example in which the fiber array of one embodiment of an imaging apparatus of the present invention is arranged.

Next, the following will explain the mounting method of the fiber array to array the fiber array as shown in FIG. 10. One example of the mounting method will be shown in FIG. 45.

A fiber array mounting unit 4 has 16 fiber emission ends sandwiched between fiber fixing members 41a and 41b. In the case of this array method, one light source block is formed of eight fiber emission ends in the horizontal direction with respect to paper surface. The diameter of a fiber core portion 64a is 50 $\mu m$, and the diameter of a clad portion 65a is 90 $\mu m$. The fiber fixing members 41a and 41b are designed such that the distance $a_s$ between the fiber emission ends is 120 $\mu m$, the central position of the light source block from the edge of upper or lower member is b/2=150 $\mu m$, and the block distance between the upper and lower light source blocks is 69 $\mu m$.

The fiber array manufacturing method will be explained as follows. First, eight fiber emission ends are arranged on the valley portions of the fiber fixing member 41a so as to be temporarily fixed. Next, further eight fiber emission ends are arranged to be placed between the temporarily fixed eight fibers. Then, the fiber fixing member 41b is mounted thereon and fixed.

As a result, the fiber array mounting unit 4 in which the light blocks A and B of FIG. 10 are combined is completed. The light source blocks C and D can be manufactured in completely the same manner as the light source blocks A and B.

Next, two mounting units 4 of the light source blocks A and B and the light source blocks C and D are shifted by as/4 =30 $\mu m$, and are bonded to each other, thereby realizing the fiber array arrangement shown in FIG. 10.

Example 2
Improvement of Imaging Speed

In the imaging apparatus of this example, the size of the imaging area corresponds to an A3 size, and resolution is 2540 dpi. The imaging area corresponding to the A3 size means that a press plate, which can be used for printing on a final recording medium such as paper having a size of 297 mm×420 mm, can be manufactured. In consideration of preparing a register mark used in positioning, the imaging area, which is larger than the size of the final recording medium, is needed. The explanation of this example is based on the imaging area having the size of 330 mm×460 mm.

Figure 48:
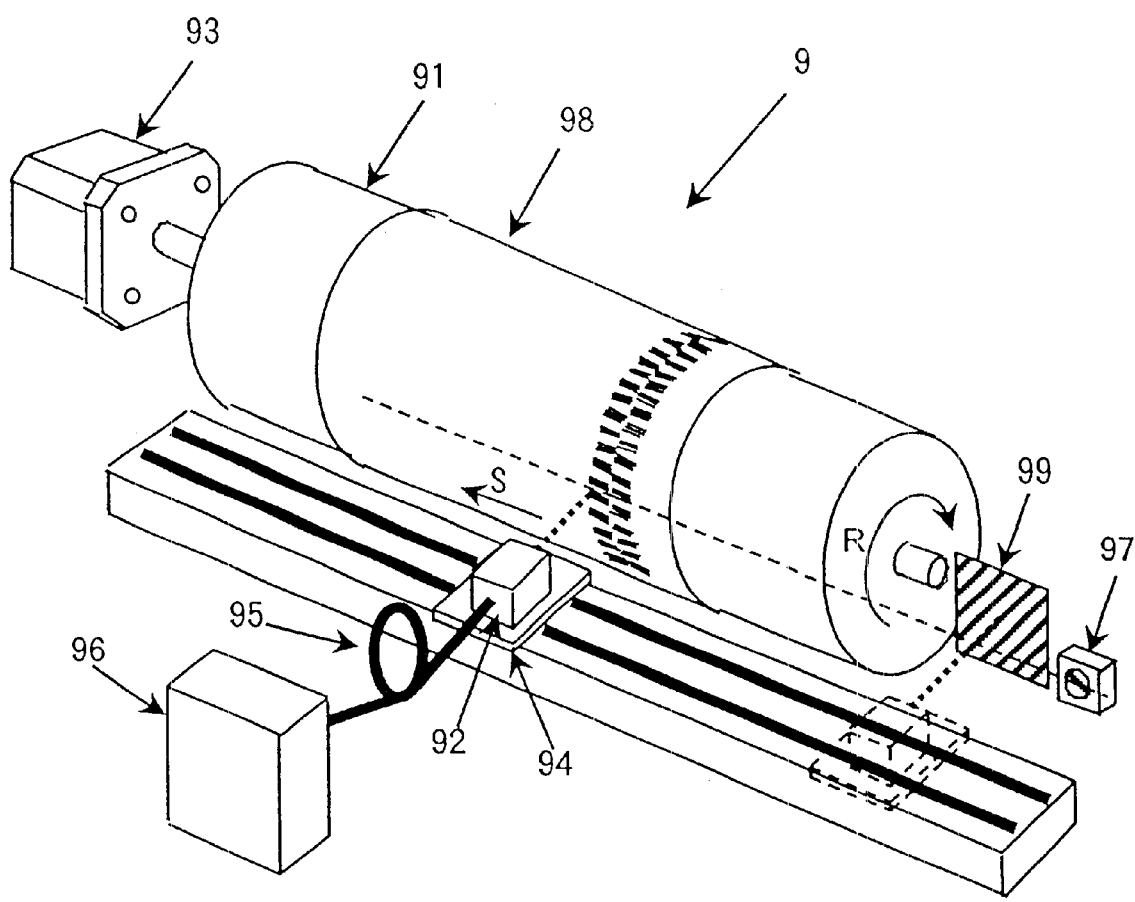
FIG. 48 is a schematic view of one embodiment of an imaging apparatus of the present invention.

FIG. 48 is a schematic view of the imaging apparatus. In this figure, the same reference numerals are added to the portions common to prior art of FIG. 61.

The imaging apparatus 9 comprises the medium support drum 91 having a diameter of 190 mm for winding an imaging medium 98 around its outer surface, an imaging head 92 including laser beam sources and an optical system for condensing beams from the laser beam sources, the laser beam source control unit 96 having a laser beam source driving device, and the cable 95 for connecting the imaging head 92 to the laser beam source control unit 96.

The imaging medium 98 having a sensitivity threshold value of $E_{th}$ [J/m$^2$] is wound around the medium support drum 91 such that the longitudinal direction conforms to the sub-scanning direction by clamping means (not shown) provided in the medium support drum 91 using an automatic detaching apparatus or an manual jig. The sensitivity threshold value $E_{th}$ of the imaging medium 98 in the heat mode is favorably about 2000 to 6000 [J/m$^2$] (200 to 600 [$\mu$J/cm$^2$]).

The medium support drum 91 has a blanking portion in which a non-imaged portion having only 267 mm in a circumferential direction is prepared. In the imaging head 92, n laser beam sources, which can be individually driven, are provided. These laser beam sources are fiber emission ends of the fiber output laser apparatus in which a maximum optical output is Pmax[W], a wavelength is λ[nm], and a beam diameter is 1s[$\mu$m]. For imaging the imaging medium in the heat mode, the optical output of 400 to 2000 mW, the wavelength of near infrared range from 760 to 1100 nm, and the beam diameter of about 20 to 80 μm are preferably set.

Similar to the case of FIG. 16A, the fiber emission ends form the fiber array of k X two rows, and the rows of the k laser beam sources are parallel to the sub-scanning direction. The distance between the light sources at the emission ends is $d_s$ [μm]. The optical system for condensing the beams emitted from these laser beam sources is arranged and adjusted such that all beams can be condensed on the imaging medium in the same manner with a magnification of m and a transmittance of T. Therefore, on the imaging medium, the beam diameter is $1s=m1_s$[μm], the distance between the light sources is $a=md_s$[μm], and the maximum optical output is Tpmax[W].

When the beam diameter at the fiber emission ends is 60 μm, the magnification may be about ⅓ in order to condense the beams with the beam diameter of about 20 μm on the imaging medium. At this time, if the beam diameter at the emission ends is 120 μm, the beam diameter on the imaging medium is 40 μm. Also, if the maximum optical output at the fiber emission ends is 600 mW, the transmittance is about 90% and the maximum optical output on the imaging medium is about 540 mW.

On the other hand, the medium support drum 91 is supported by the frame of the imaging apparatus 9, and is rotated by the standard motor 93 in the direction of an arrow R in the figure. The angle position is always monitored by an encoder (not shown). The imaging head 92 is fixed onto the standard linear stage 94 for realizing the parallel movement so as to be moved in parallel in the direction of an arrow S in the figure. The block diagram of the imaging head is shown in FIG. 49.

Figure 49:
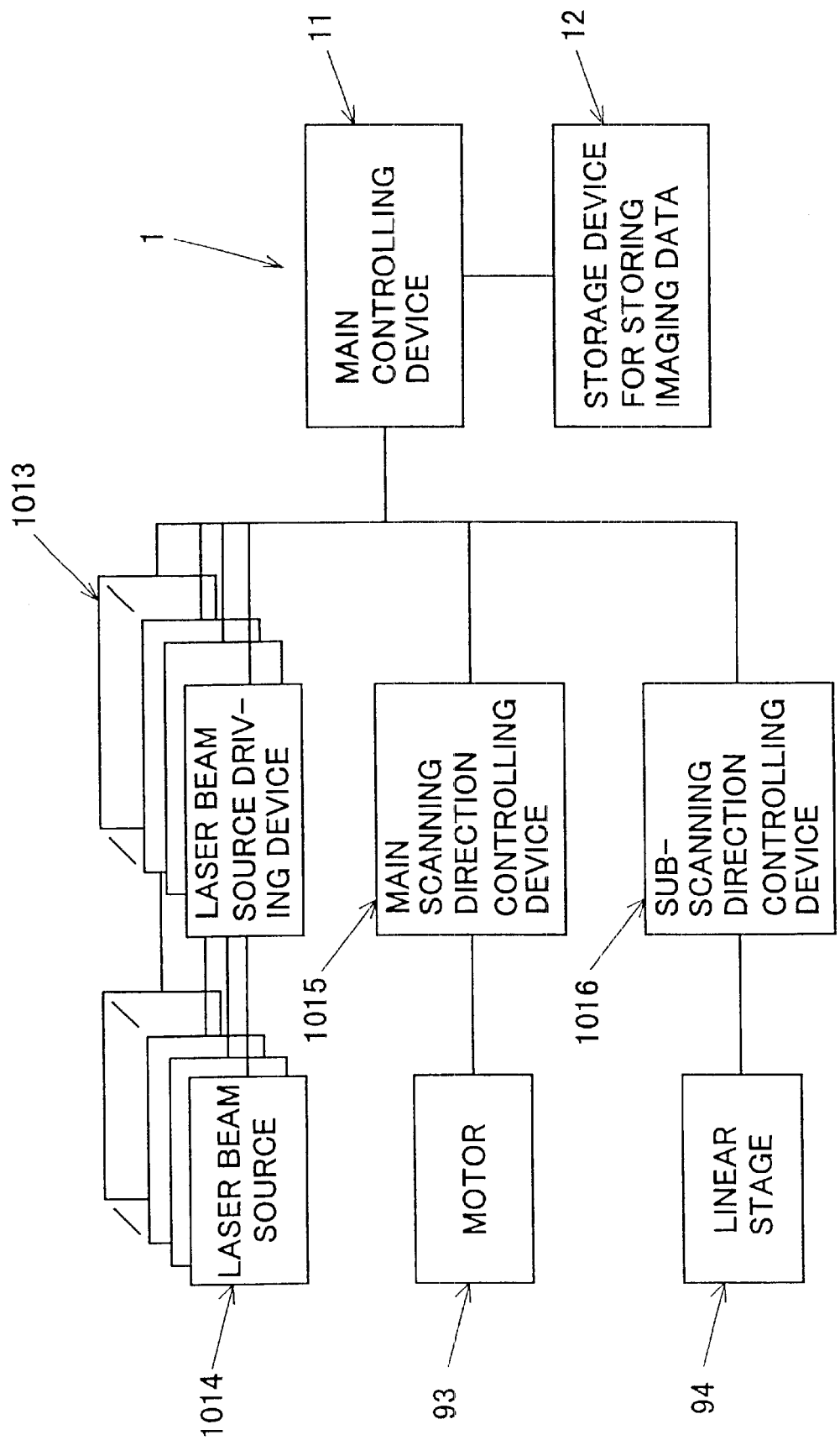
FIG. 49 is a block diagram of one embodiment of an imaging apparatus of the present invention.

The imaging apparatus 1 of FIG. 49 comprises the main control device 11, the memory 12 for storing data, 2k laser beam source driving device 1013, 2k laser beam sources 1014, a main scanning direction controlling device 1015, a motor 95 for rotating the medium support drum and realizing the maim scanning, a sub-scanning direction controlling device 1016, and the linear stage 94 for moving the imaging head in parallel and realizing the sub-scanning.

The memory 12 for storing data, 2k laser beam source driving device 1013, the main scanning direction controlling apparatus 1015 and the sub-scanning direction controlling apparatus 1016 are connected to the main controlling apparatus 11. A control signal is transmitted to each unit from the main control device 11. Moreover, the corresponding laser beam source 1014 is connected to each laser beam source driving device 1013, the motor 93 is connected to the main scanning direction controlling device 1015, and the linear stage 94 is connected to the sub-scanning direction controlling device 1016. Then, the signal for driving each device is transmitted.

Next, the actual imaging method using the imaging apparatus of the above example will be explained. When power is turned on, the linear stage 94 on which the imaging head 92 is loaded is moved to the position where the beams can be condensed on the light receiving element 97. The light receiving element 97 is provided at the position corresponding to the focal distance in winding the imaging medium 98 around the medium support drum 91. The light receiving element 97 receives the beams and outputs a signal corresponding to the optical output to the main control device 11.

As a result, the signals for controlling the laser beam sources are transmitted to the laser beam source driving device 1013 from the main control device 11. The laser beam sources are turned on one by one. At this time, the optical outputs of all laser beam sources are sequentially adjusted with reference to the signal of the light receiving element 97. This adjustment sets the two-stage optical outputs.

One is an optical output $P_{on}$ corresponding to the imaging data present state such that exposure energy density of a predetermined imaging area to be imaged becomes larger than the sensitivity threshold value $E_{th}$ of the imaging medium. The other is an optical output $P_{off}$ corresponding to the imaging data absent state such that exposure energy density of a predetermined imaging area becomes smaller than the sensitivity threshold value $E_{th}$ of the imaging medium over the entire surface of the laser irradiation region. Also, the optical output $P_{on}$ is an output enough to generate a two-dimensional change in an imaging characteristic according to imaging data on the imaging medium surface. The optical output $P_{off}$ is an output, which does not sufficiently generate a two-dimensional change in an imaging characteristic according to imaging data on the imaging medium surface.

The following will explain the actual way of setting the outputs $P_{on}$ and $P_{off}$. As shown in FIG. 14, there is introduced a coordinate system in which the central position of the beam 1021a at time t=0 is an origin, the sub-scanning direction is an x-axis, and the main scanning direction is a y-axis. It is assumed that the optical output on the imaging medium is P[W], the beam radius is r[m], the moving speed of the beam is v[m/s], lighting time of laser corresponding to one imaging dot is Δt[s]. In this case, the beam 1021b at time t=Δt[s] moves by vΔt[m] in the main scanning direction R (normal direction of y-axis).

When the moving distance is 10 μm, the resolution in the main scanning direction becomes 2540 dpi. As an example of the specific numeral values satisfying the condition, r=10 μm, Δt=5 μs, v=2 m/s can be used.

When the distribution function of the optical output is the step function as shown in equation (4), the overlapping portion 1022 of the beam 1021a at time t=0 shown in FIG. 14 and the beam 1021b at time t=Δt[s] is always irradiated with the optical output of $P/\pi r^2$ [W/m²]. For this reason, the exposure energy density of the overlapping portion 1022 becomes maximum in the portion irradiated with the laser beams, and the exposure energy density of $P\Delta t/\pi r^2$ [J/m²] can be obtained from equation (2).

Then, when imaging data is absent, $P=P_{off}$ is established, and a condition in which no imaging is executed becomes $1.6 \times 10^4$ $P_{off} < E_{th}$ when r=10 μm, Δt=5 μs. Then, when $E_{th}$=4000[J/m²](400[μJ/cm²]), $P_{off}$<250 mW is established. On the other hand, when imaging data is present, $P=P_{on}$ is established. Then, if $1.6 \times 10^4$ $P_{on} \geq E_{th}$ where r=10 μm, Δt =5 μs, an imaging area whose size is more than the overlapping portion 1022 is formed.

Here, if $1.6 \times 10^4$ $P_{on}=\alpha E_{th}$ ($1.5 \leq \alpha \leq 2.5$), the imaging area having substantially same size as the laser beam as shown in FIG. 15, is formed. When $E_{th}$=4000 [J/m²], $P_{on}$=375 to 625 mW is established.

Also, it is assumed that the optical output by which the imaging area is formed on the imaging medium at time Δt is set to $P_0$ when the laser beams do not move. $P_0=E_{th}\pi r^2/\Delta t$ is established, and the above condition can be expressed as $P_{on}=\alpha P_0$ ($1.5 \leq \alpha \leq 2.5$), $P_{off}<P_0$. When Δt=5 μs and $E_{th}$=4000 [J/m²], $P_0$=250 mW is established.

In the conventional imaging apparatus in which the closest lines are simultaneously imaged in the main scanning direction, if $P_{off}$ is set to a value close to $P_0$, there is possibility that the closest lines will be erroneously imaged even at the position where no imaging data is present.

In the imaging apparatus of the present example, however, the closest lines in the main scanning direction are imaged with a time interval corresponding to one turn of the imaging medium support drum. Therefore, it is possible to set $P_{off}$ to a value close to $P_0$ of about $P_{off}=\beta P_0$ ($0.7 \leq \beta \leq 0.9$). When $P_0=250$ mW, $P_{off}$ is 175 to 225 mW.

Figure 50:
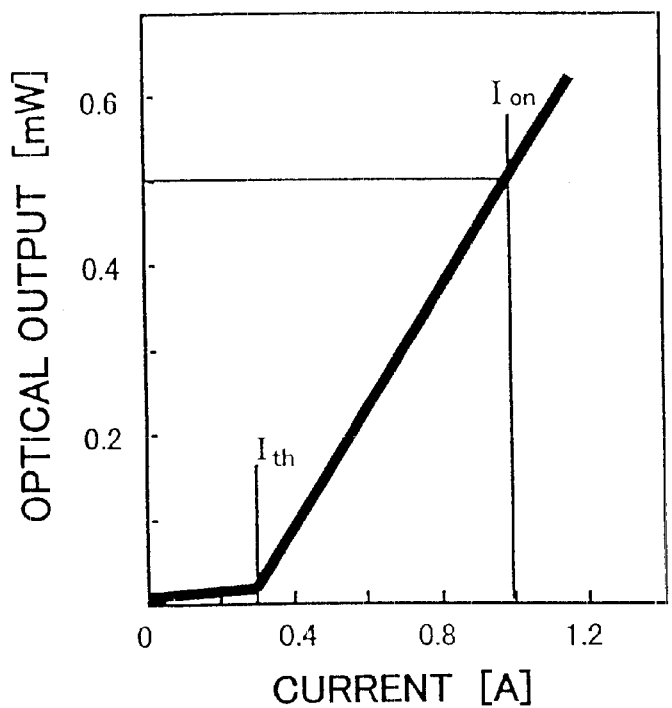
FIG. 50 is a view showing an optical output-current characteristic of the laser diode of one embodiment of an imaging apparatus of the present invention.

In this case, the current value corresponding to each optical output is $I_{on}=1.0$ A, $I_{off}=0.6$ A based on the optical output-current characteristic shown in FIG. 50, and the difference in the current value between on/off is 0.4 A. Then, time δt required for switching can be reduced to about ½ of the conventional imaging apparatus. In the conventional imaging apparatus shown in FIG. 62, the optical output is $P_{on}=500$ mW, $P_{off}=0$ mW, the current value corresponding to each optical output is $I_{on}=1.0$ A, $I_{off}=0.3$ A and the difference in the current value between on/off is 0.7 A.

When the above initial output adjusting operation is ended, the imaging head 92 moves to the standby position shown by a broken line of FIG. 48.

When the command of the imaging start is input to the main control device, the rotation of the medium support drum 91 is started. Then, after the rotation reaches a predetermined stable rotation speed necessary for the imaging state, all lasers are turned on to obtain the optical output of $P_{off}$. A slow rotation state corresponds to a relatively high exposure energy state. For this reason, if all lasers are turned on before the rotation reaches the predetermined stable rotation speed necessary for the imaging state, there is possibility that an unwanted portion will be imaged at the time when the imaging medium 98 is irradiated with the laser beams in this state.

At this time, if the moving speed of the laser beams in the main scanning direction is 2 m/s, time required for one rotation of the medium support drum 91 having a diameter of 190 mm is 0.298 s, and the predetermined rotation speed becomes about 201 rpm. During one turn of the medium support drum 91, the blanking portion is 267 mm, and blanking time is 0.134 s. The standby position is within a beam irradiation allowable portion of the beam irradiation sources. Then, an energy beam heat discharge member 99 is provided at a position where irradiation beam density is ⅒ or less than the irradiation energy density of the focal position. Even if the laser is turned on, there is no problem. Then, the imaging head 92 is moved to the imaging start position by the linear stage 94.

Timing of the imaging is adjusted for each laser beam source based on the reference position signal of the main scanning direction output from the encoder to justify the position of the lines to be imaged by the laser beam sources in the main scanning direction. Thus, the imaging operation is carried out. At this time, as shown in FIG. 49, the main controlling apparatus 11 transmits the signal for switching the respective laser beam sources in accordance with imaging data to the laser beam source driving device 1013 with reference to imaging data stored in the memory 12 for storing imaging data. The switching state is shown in FIG. 13.

The current value is changed to $I_{on}/I_{off}$ in accordance with the on/off of the control signal, and the optical output is changed to $P_{on}/P_{off}$ in accordance with the change in the current value. As a result, the change in the imaging characteristic according to imaging data is generated. By this operation, imaging for 2k in the main scanning direction is completed. Then, during the blanking time 0.134 s, the linear stage 94 is moved to the position where next imaging for 2k can be executed in the direction of an arrow S in the figure as shown in FIG. 48.

The laser beam sources of this example are arranged such that k laser beam sources for two rows are parallel to the sub-scanning direction, similar to FIG. 16A. At this time, the distance $a_p$ converted on the imaging medium of the laser beam sources is twice as large as the dot distance necessary for obtaining a predetermined resolution. If resolution is 2540 dpi, $a_p=20$ μm is established. At this time, the moving distance is half of the dot distance $a_p$ in the sub-scanning direction at an odd-numbered rotation time. At an even-numbered rotation time, the moving distance is a value, which is obtained by subtracting odd-numbered move amount $a_p/2$ from 2k-times as large as the dot distance $a_p$ in the sub-scanning direction, that is, $(4k-1) a_p/2$. In the case of k=20 and $a_p=20$ μm, the odd-numbered move amount is $a_p=10$ μm, and the even-numbered move amount is $a_p=790$ μm.

These series of operations are repeated until the imaging head 92 reaches the edge of the imaging area in the sub-scanning direction. As a result of the imaging operation, the two-dimensional change in the imaging characteristic according to imaging data is generated in the imaging area on the imaging medium 98.

In the imaging apparatus 9 of this example, the imaging length in the sub-scanning direction is 460 mm. For this reason, in the case of k=20, $a_p=20$ μm, the imaging of the entire imaging area is executed by 575 series of operations (the number of rotations of the medium support drum is 1150), and its time is about 343s. After the imaging operation is ended, all laser beam sources are completely turned off, and the rotation of the medium support drum 91 is stopped. When the automatic detaching apparatus for the imaging medium 98 is provided, the rotation of the medium support drum is reduced to a predetermined number of rotations, thereafter the imaging medium 98 is detached from the medium support drum 91 by the automatic detaching apparatus and stopped. After that, the imaging medium 98 is sent to a post processing apparatus such as a washing machine as required.

Also, as another process for turning on the laser beam sources at first, the following process may be used. More specifically, first of all, the imaging head 92 is moved to the imaging area before starting the imaging operation. Next, the rotation speed of the medium support drum 91 is stabilized to the rotation speed of the imaging operation time. Thereafter, the laser beam source is turned on in the imaging area.

The above example explained the structure using the single imaging head 92. The structure having the plurality of imaging heads may be used to improve the imaging speed.

Example 3
Focal Adjustment of Imaging Head

FIG. 17 shows a schematic view of the other imaging apparatus of the present invention for performing the focal adjustment. In this figure, the same reference numerals are added to the portions common to prior art of FIG. 61, and the explanation of the common portions will be omitted.

In the imaging apparatus 9 of this example, the fiber array using the semiconductor laser apparatus with 40 fiber outputs is used as-beam irradiation sources. The laser beam source has an infrared range having a wavelength of 815 nm to 845 nm, the optical output of about 450 to 550 mW at the fiber emission ends, and the beam diameter of the laser beam of about 60 μm at the fiber emission ends.

In addition to the imaging apparatus of prior art, the imaging apparatus 9 comprises the light receiving element 97 for controlling the laser beam output, the focal position detecting member 2034, having the opening portion 2099 through which the laser beams can pass, being attached to a portion around which the imaging medium 98 of a medium support drum 91 is not wound, and measuring means (not shown) for measuring the laser beams passed through the opening portion 2099. Though the various shapes of the opening portion 2099 can be considered, the details of the shapes will be described later.

Similar to prior art, the imaging head 92 is fixed onto the linear stage 94 through the focal adjusting means (not shown) such as the X-stage with a micrometer for making it possible to slightly adjusting the distance between the medium support drum 91 and the imaging head 92. The distance between the imaging head 92 and the imaging medium 98 is adjusted by the focal position adjusting method to be described later such that the laser beams are condensed on the imaging medium surface. When the focus is thus achieved, the distance between the optical system and the imaging medium, that is, a working distance, is about 10 mm. Since the optical system has the magnification of ⅓ and the transmittance of 90%, the laser beam diameter on the imaging head is about 20 μm and the optical output is about 400 mW to 500 mW.

At the actual focal position adjusting time, the imaging head 92 is moved to the position facing to the measuring means through the opening portion 2099 as shown in the broken line of FIG. 17. Thereafter, one laser beam source 1014, which is the closest to the optical axis of the optical system, is turned on. Then, the signal output from the measuring means is monitored, and the adjusting knob of the X-stage with a micrometer is rotated. Thereby, the X-stage is moved and the focal position is adjusted. Since the optical system of the imaging head is designed such that all laser beam sources are condensed in the same manner, the focal adjustment may be executed by one of these laser beam sources.

Next, the following will explain the actual imaging method using the imaging apparatus of this example. The adjusting work of the optical outputs of the laser beam sources after power-supply is the same as the second example. After the output adjustment, the focal position is confirmed.

The imaging head 92 is moved to the position facing to the measuring means through the opening portion 2099 as shown in the broken line of FIG. 17. One laser beam source 1014, which is the closest to the optical axis of the optical system, is turned on to confirm whether or not the focus is achieved using the signal output from the measuring means. When the focus is not achieved at this stage, the adjusting knob of the X-stage with a micrometer is rotated to move the X-stage, thereby adjusting the focal position.

Though the imaging operation can be executed after the above-mentioned initial adjusting operation is ended, the actual imaging method is the same as the second example.

This focal adjusting operation is carried out at an initial adjusting time after assembling the apparatus, a focal position confirming time after a long rest, and after replacing a part such as the imaging head, other than the adjusting time before the starting the apparatus. In any case, the focal adjusting operation is carried out after executing the adjustment of laser power by the light receiving element 97. It is of course necessary to carry out the focal adjusting operation at a readjusting time when the thickness of the imaging medium is changed. In this case, the focal position detecting member is replaced in accordance with the thickness of the imaging medium. The thickness of the imaging medium is limited to about two to four kinds. If the thickness of the imaging medium is frequently changed and there is a space in the portion where the imaging medium of the imaging medium support drum is not attached, a plurality of focal position detecting members corresponding to the thickness of each imaging medium is attached to the imaging medium support drum in advance. This can omit time and effort for replacing the focal position detecting member.

Next, the following will explain the shapes of the opening portion, and the focal adjusting method.

(a) Rectangular opening portion

First, the focal position adjusting member having the rectangular opening portion will be explained.

In the size of the opening portion, the length in the main scanning direction is about 0.1 to 0.5 mm and the length in the sub-scanning direction is about 1 to 5 mm. The opening portion in the main scanning direction may have the length enough to detect the laser beam passed through the opening portion using the light receiving element 2032a, 2032b. In the case of the imaging medium in the heat mode, time required for executing the imaging for one dot is about 1 to 5 μs. Therefore, if resolution is 2540 dpi (one dot is 10 μm), the moving speed on the imaging medium support drum surface is about 2 to 10 m/s. If time required for detecting the laser beam passed through the opening portion using the standard light receiving element 2032a, 2032b is several 10 μs, the length of the opening portion in the main scanning direction may be about 0.1 to 0.5 mm.

On the other hand, the opening portion in the sub-main scanning direction may have such a sufficient length as the laser beam can pass through the opening portion even if the focus is shifted, for example, 1 mm or more. In view of the imaging medium support drum setting space and the convenience of preparing the focal detecting member, the preferable range of the length is about 5 mm or less. The focal adjustment using the above-shaped opening portion can be executed in both the case in which the imaging medium support drum is rotated and the case in which the imaging medium support drum is stopped at a suitable position.

FIG. 18 shows a cross-sectional view including the imaging head 92 at the focal adjusting time, the focal position detecting member 2034, a surface including the optical axis of the energy beam of the measuring means and the shaft of the medium support drum 91.

The measuring means 2031 has light receiving elements 2032a and 2032b divided in the sub-scanning direction in a state that the optical axis of the energy beam is used as a reference. Then, the measuring means 2031 can detect the outputs of the energy beams incident upon the respective light receiving elements, individually. In this figure, the lower end of the opening portion 2099 on paper serves as the knife edge. FIG. 18 shows the state in which focus is achieved. The energy beams 2033 emitted from the imaging head 92 pass through the opening portion 2099 of the focal position detecting member 2034, and most of the energy beams are incident upon the light receiving elements 2032a and 2032b.

At this time, a signal, which is obtained by subtracting a light intensity signal of the light receiving element 2032b from a light intensity signal of the light receiving element 2032a, becomes substantially zero. This signal hereinafter is referred to as a focus signal.

Next, FIG. 19 shows the case in which the imaging head 92 and the medium support drum 91 are too close to each other. At this time, a part of the energy beams 2033 is blocked by the knife edge at the lower end of the opening portion 2099, so that the energy beams 2033 are hardly made incident upon the light receiving element 2032a. At this time, the above focus signal becomes a negative value. Conversely, FIG. 20 shows the case in which the imaging head 92 and the medium support drum 91 are too far from each other. At this time, a part of the energy beams 2033 is also blocked by the knife edge at the lower end of the opening portion 2099, so that the energy beams 2033 are hardly made incident upon the light receiving element 2032b. At this time, the above focus signal becomes a positive value.

Thus, the signal, which is obtained by subtracting the output signal of the light receiving element 2032b from the output signal of the light receiving element 2032a, that is, the focus signal is detected. Thereby, it is possible to know whether or not the focus is achieved. Also, it is possible to know which direction the position of the current imaging head 92 is shifted from the focal position. Then, the focus signal is monitored and focal adjusting means is operated automatically or manually to adjust an absolute value of the focus signal to be smaller.

The above example explained the case in which the optical axis of the laser beams and the focal detecting member were perpendicular to each other. In order to detect the reflected light to confirm the focus state and to prevent light from being returned to the laser beam source, the focal detecting member may be inclined by a predetermined angle from a direction perpendicular to the optical axis of the laser beam.

(b) Circular opening portion

Next, the focal position adjusting member having the circular opening portion will be explained.

The diameter of the opening portion is preferably 0.9 to 1.1 times as large as the beam diameter at the laser beam focal position. Also, the center of the opening portion is set to be at substantially the central position of the optical axis of the laser beam. The focal adjustment using the above-shaped opening portion is preferably executed after the imaging medium support drum is stopped.

As a preparation for the above focal adjustment, first, the imaging head is moved to be placed at the position opposite to the opening portion by sub-scanning means. Next, the laser beam source is turned on, and rotates the imaging medium support drum. Then, the imaging medium support drum is stopped at the position where laser beam intensity detected by the light receiving element 2032 becomes maximum.

Figure 51:
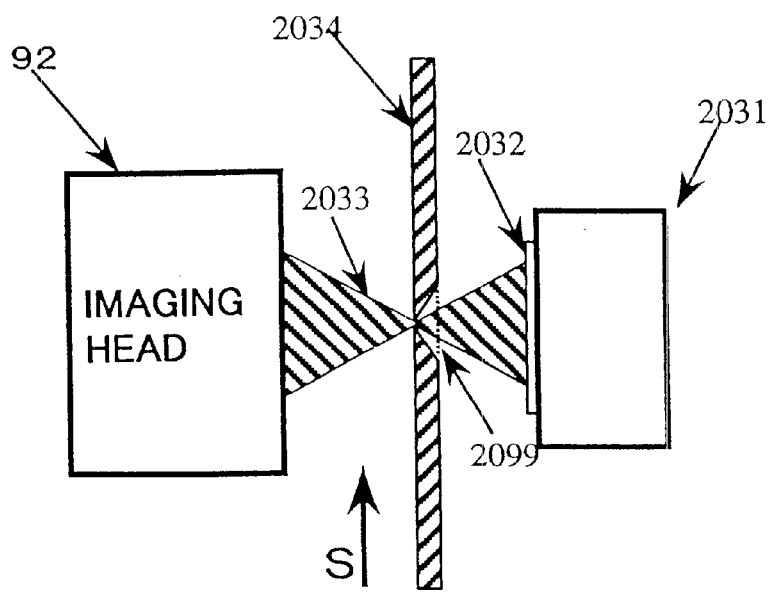
FIG. 51 is a schematic view showing a focal adjusting method of one embodiment of an imaging apparatus of the present invention.

FIG. 51 shows a cross-sectional view including the imaging head 92 at the focal adjusting time, the focal position detecting member 2034, a surface including the optical axis of the laser beam of the measuring means and the shaft of the medium support drum 91. In this case, the entire circumference of the opening portion serves as a knife edge.

The measuring means 2031 has the light receiving element 2032, which can detect intensity of incident light. FIG. 51 shows the state in which focus is achieved. The energy beams 2033 emitted from the imaging head 92 pass through the opening portion 2099 of the focal position detecting member 2034, and most of the energy beams are incident upon the light receiving element 2032. At this time, light intensity signal of the light receiving element 2032 reaches the maximum value.

Figure 52:
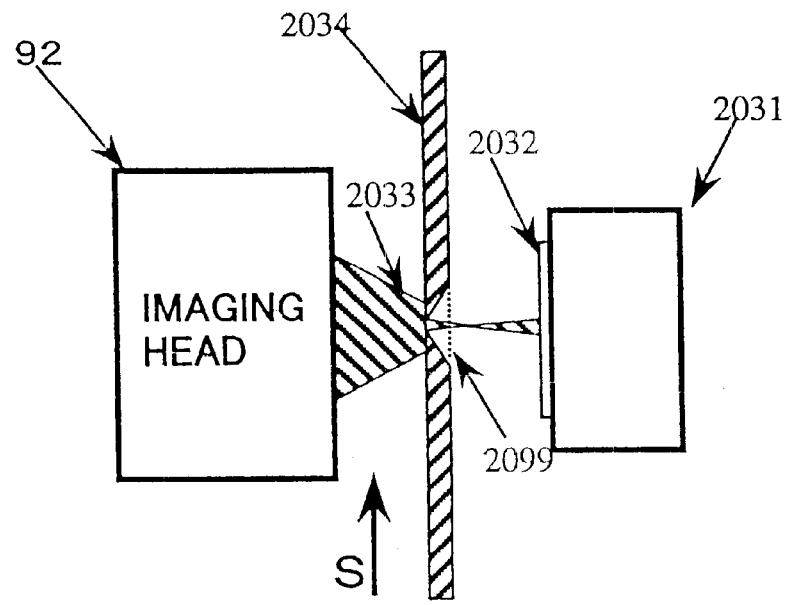
FIG. 52 is a schematic view showing a focal adjusting method of one embodiment of an imaging apparatus of the present invention.
Figure 53:
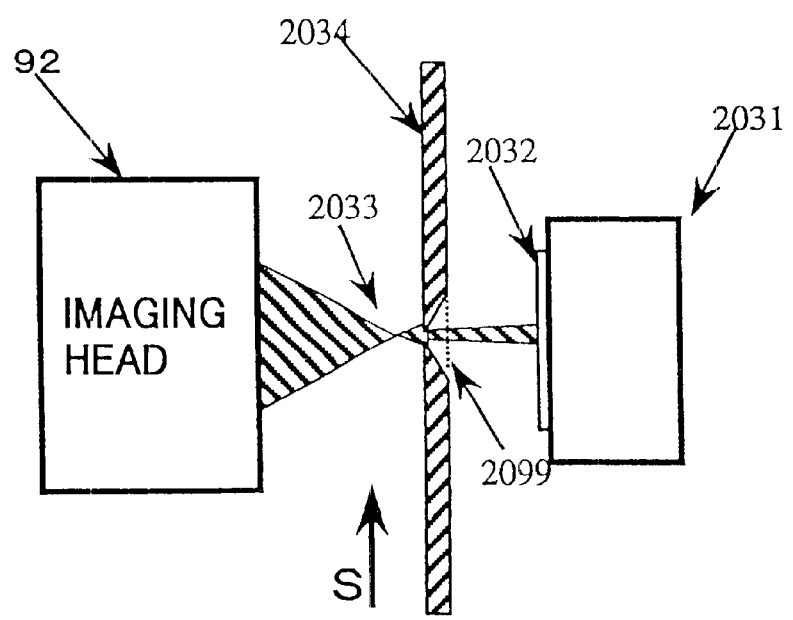
FIG. 53 is a schematic view showing a focal adjusting method of one embodiment of an imaging apparatus of the present invention.

Next, FIG. 52 shows the case in which the imaging head 92 and the medium support drum 91 are too close to each other. At this time, a part of the energy beams 2033 is blocked by the knife edge, so that the laser beams incident upon the light receiving element 2032 decreases. At this time, the absolute value of the light intensity signal becomes small as the shift from the focal position increases. Conversely, FIG. 53 shows the case in which the imaging head 92 and the medium support drum 91 are too far from each other. At this time, a part of the energy beams 2033 is also blocked by the knife edge, so that the laser beams incident upon the light receiving element 2032 decreases. At this time, the absolute value of the light intensity signal also becomes small as the shift from the focal position increases.

Thus, by the detection of the light intensity signal of the light receiving element 2032, it is possible to know whether or not the focus is achieved. Also, it is possible to know how much degree the position of the current imaging head 92 is shifted from the focal position. Then, it is detected how the signal is changed when the focal adjusting means is moved, and focal adjusting means is operated automatically or manually such that the signal reaches the maximum value.

The above-explained (a) rectangular and (b) circular opening portions are typical examples. Any shape may be used if the similar function can be achieved. Also, the mixture of these shapes may be used.

Figure 54:
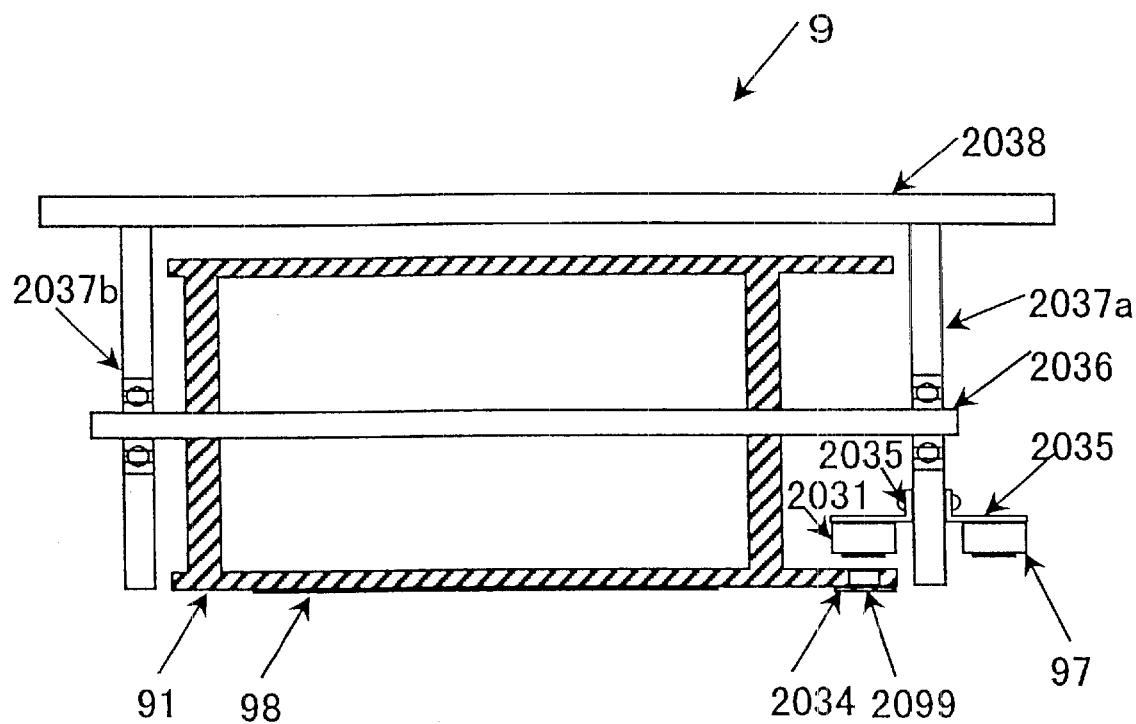
FIG. 54 is a cross-sectional view of one embodiment of an imaging apparatus of the present invention.

FIG. 54 shows a cross-sectional view of the periphery of the imaging medium at the surface including the shaft of the medium support drum and the optical axis of the laser beam when the focal adjusting member 2034 is attached to the position shown in FIG. 17.

A shaft 2036 is fixed to the medium support drum 91 of the imaging apparatus 9 of this example. The shaft 2036 is rotatably attached to an operation side support member 2037a fixed to a frame 2038 and a drive side support member 2037b. A motor (not shown) for driving the drum is attached to the drive side of the shaft 2036. Moreover, the focal position detecting member 2034 having the opening portion 2099 is attached to the portion (operation side end of the support drum) where the imaging medium of the medium support drum 91 is not wound.

A hole larger than the opening portion 2099 is formed at a portion serving as a base portion of the opening portion 2099 of the focal position detecting member 2034 of the imaging medium 91. The laser beam emitted from the imaging head reaches the opening portion 2099 of the focal position detecting member 2034. Then, light passed through the opening portion 2099 reaches the light receiving element attached to the measuring means 2031. Similar to the light receiving element 97 for adjusting the optical output, the measuring means 2031 is fixed to the operation side support member 2037a by a fixture 2035. Since the measuring means 2031 remains at rest even when the medium support drum 91 rotates, the measuring means 2031 is not easily subjected to the influence of vibration caused by the rotation of the medium support drum 91.

(c) Real time focal adjusting

Next, the following will explain the structure, which is capable of focal adjusting at real time.

Figure 55:
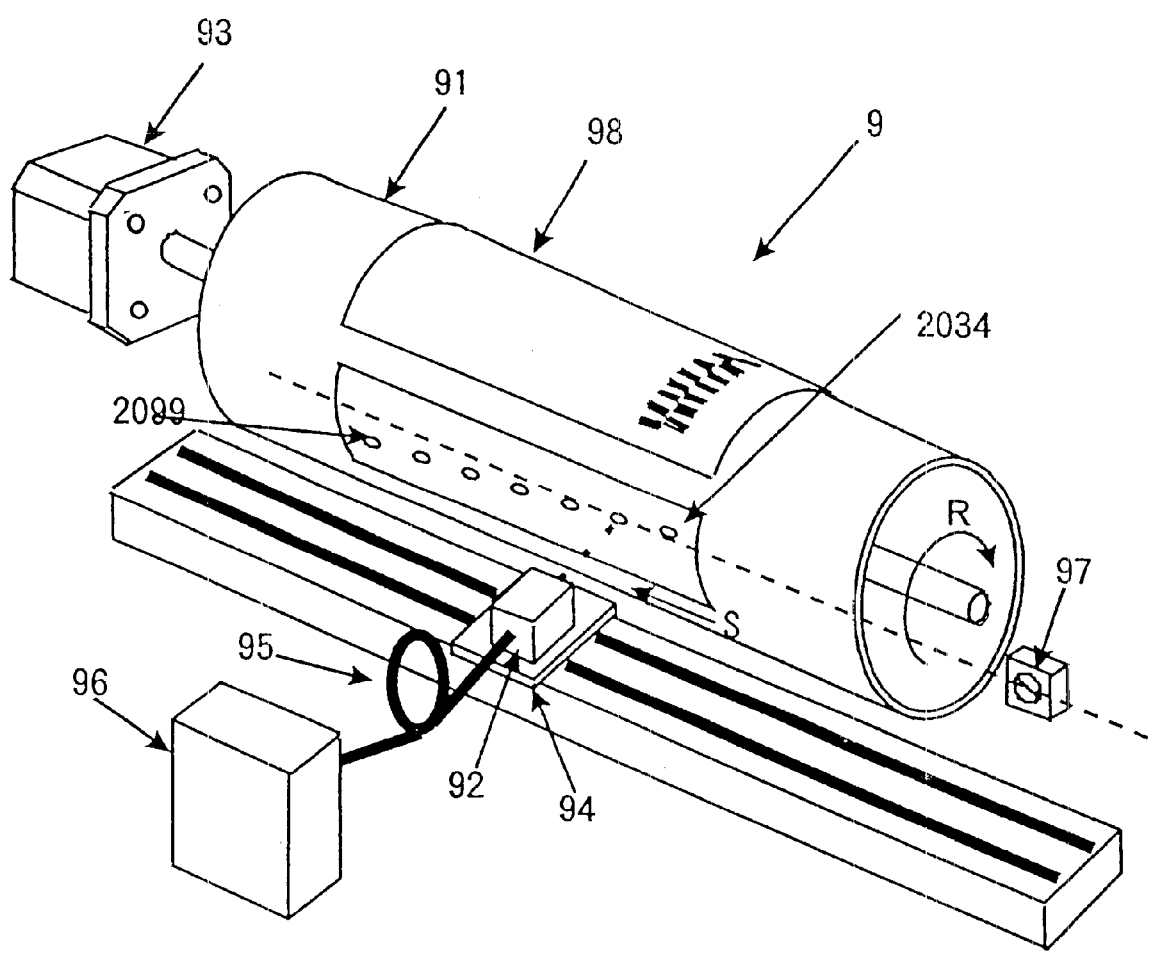
FIG. 55 is a schematic view of one embodiment of an imaging apparatus of the present invention.

FIG. 55 is a schematic view of this example showing the imaging apparatus, which is capable of focal adjusting at real time. In this figure, the same reference numerals are added to the portions common to one example of the imaging apparatus of the present invention of FIG. 17, and the explanation of the common portions will be omitted.

In the imaging apparatus 9 of this example, the focal position detecting member 2034 having the opening portion 2099 through which the laser beam can pass is attached to the blanking portion of the imaging medium 98 of the medium support drum 91. Though the shape of the opening portion 2099 is preferably rectangular, other shapes may be used if the similar function can be realized.

In the case of this example, the automatic adjustment of the focal position can be carried out during the imaging operation. The method will be explained as follows. More specifically, when the blanking portion of the medium support drum 91 reaches the position in the main scanning direction facing to the imaging head 92, the laser beam source corresponding to the position of the opening portion 2099 in the sub-scanning direction is turned on. Then, the laser beam passed through the opening portion 2099 is detected by the light receiving element (not shown), so that the confirmation of the focal position and the slight adjustment as required are executed. At this time, the suitable method using the shapes of the opening portion described in above item (a) is used in the signal process and the judgment on the focus shift caused by the signal.

The distance between the opening portions 2099 in the sub-scanning direction is about 10 to 50 mm, and this distance is large enough to execute the focal confirmation and the slight adjustment. The opening portion 2099 is shifted about 5 to 10 mm in the main scanning direction. This shift is suitable for leading the laser beam passed through the opening portion 2099 to the light receiving element (not shown) for detecting the focal state.

Figure 56:
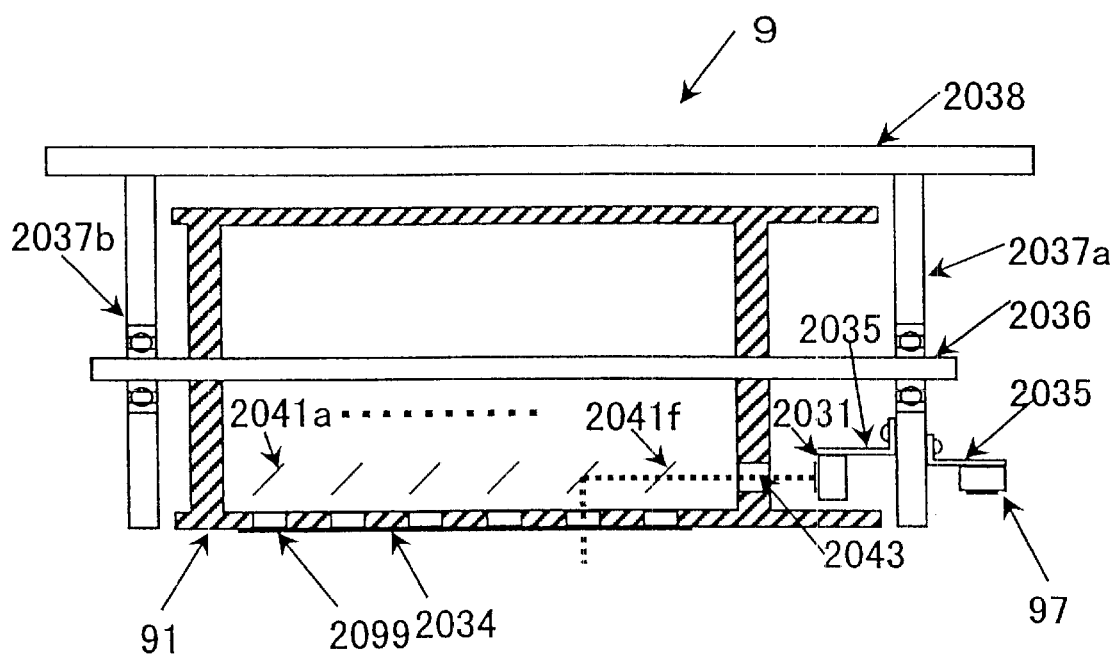
FIG. 56 is a cross-sectional view of one embodiment of an imaging apparatus of the present invention.
Figure 57:
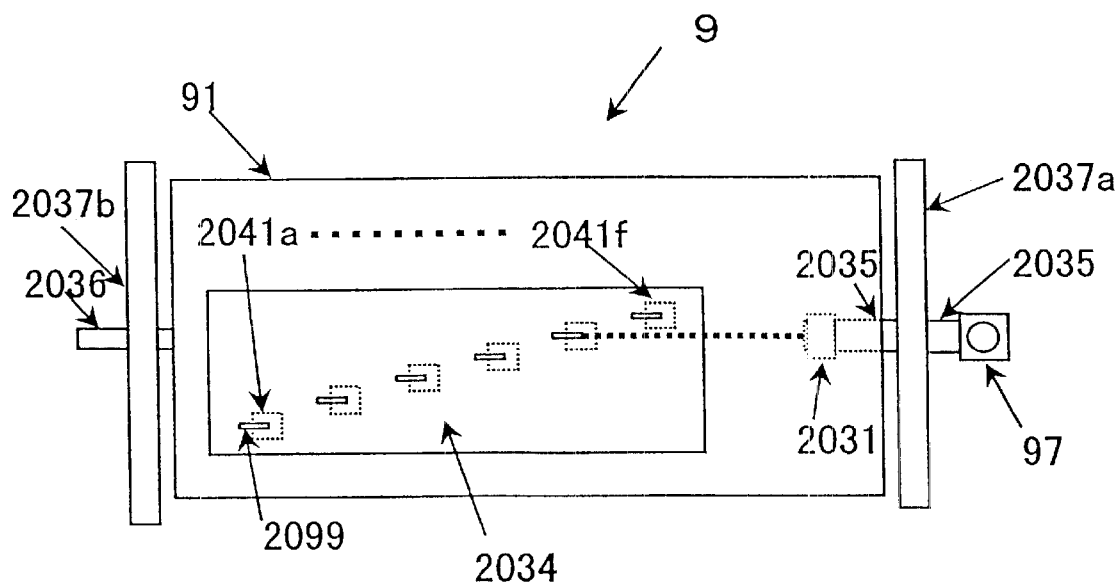
FIG. 57 is a schematic view of a focus detecting method of one embodiment of an imaging apparatus of the present invention.
Figure 58:
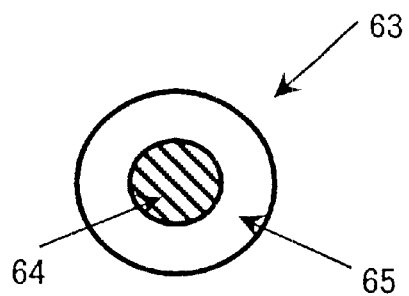
FIG. 58 is an outline view of emission ends of fiber output laser of one embodiment of an imaging apparatus of the present invention.
Figure 59:
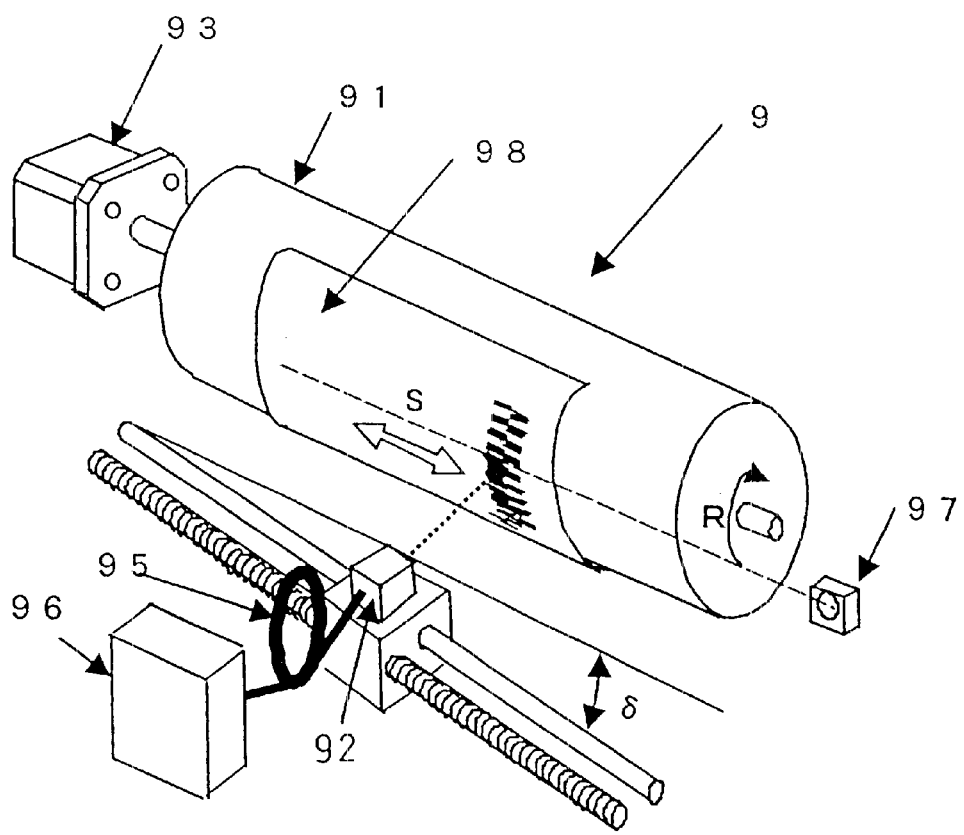
FIG. 59 is a schematic view of one embodiment of an imaging apparatus of the present invention.
Figure 60A:
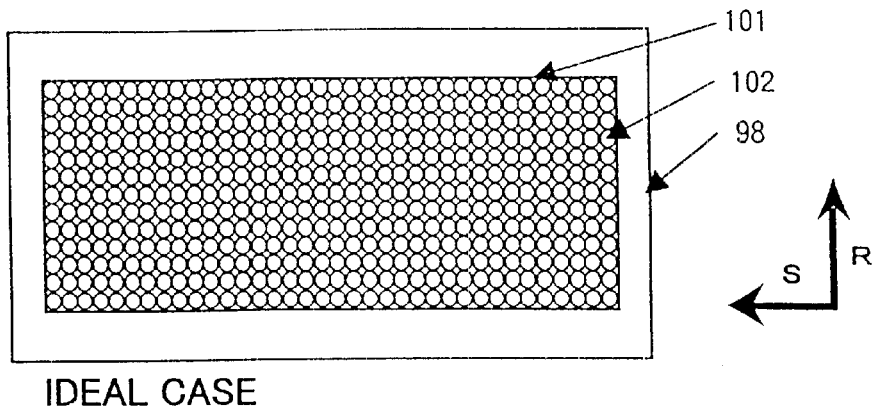
FIGS. 60A to 60C are schematic views each showing an image area to be imaged by an imaging apparatus of the present invention.
Figure 60B:
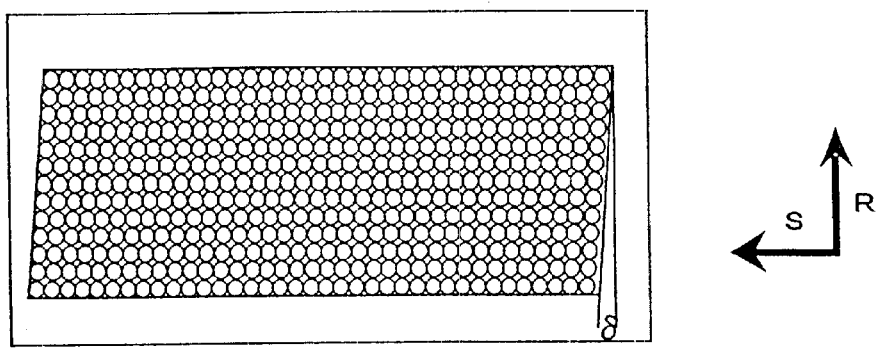
Figure 60C:
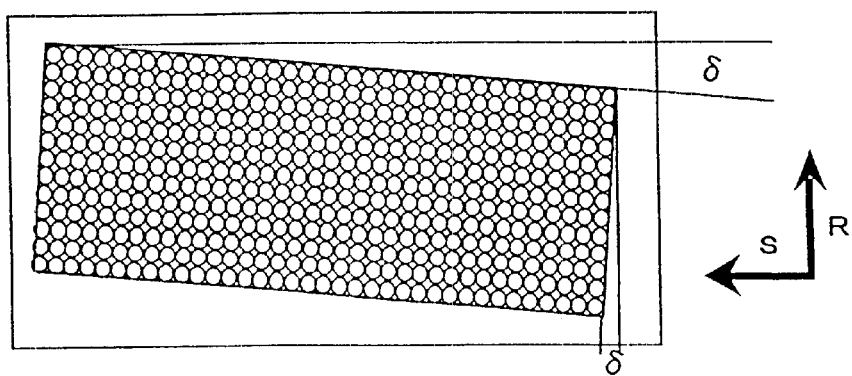

FIG. 56 is a cross-sectional view of the periphery of the imaging medium at the surface including the shaft of the medium support drum 91 and the optical axis of the laser beam when the focal adjusting member 2034 is attached to the position shown in FIG. 55. FIG. 57 is a front view of the medium support drum 91 seen from the imaging head side when the focal adjusting member 2034 reaches the position opposite to the imaging head.

In the imaging apparatus 9 of this example, the shaft 2036 is fixed to the medium support drum 91. The shaft 2036 is rotatably provided at the operation side support member 2037a fixed to the frame 2038 and the drive side support member 2037b. A motor (not shown) for driving the drum is attached to the drive side of the shaft 2036. Moreover, as shown in FIGS. 55 and 57, the focal position-detecting member 2034 having the opening portion 2099 is attached to the blanking portion of the medium support drum 91. Also, a hole larger than the opening portion 2099 is formed at a portion serving as a base portion of the opening portion 2099 of the focal position detecting member 2034 of the medium support drum 91. In the medium support drum 91, mirrors 2041a to 2041f are fixed.

Then, the laser beam emitted from the imaging head reaches the opening portion 2099 of the focal position detecting member 2034. Light passed through the opening portion 2099 is reflected by the mirrors provided in the drum and passes through a laser beam passage window 2043 of the medium support drum 91, and reaches the light receiving element attached to the measuring means 2031.

The mirror by which light is reflected is changed depending on the position of the sub-scanning direction of the imaging head. These mirrors 2041a to 2041f are shifted about 5 to 20 mm in the distance of the medium support drum 91 in the circumferential direction in order not to block the optical paths of the laser beams reflected by other mirrors. Similar to the light receiving element 97 for adjusting the optical output, the measuring means 2031 is fixed to the operation side support member 2037a by the fixture 2035. Since the measuring means 2031 remains at rest even when the medium support drum 91 rotates, the measuring means 2031 is not easily subjected to the influence of vibration caused by the rotation of the medium support drum 91.

In the above example, the number of measuring means 2031 was one and the mirrors 2041a to 2041f were used to guide the beams. However, measuring means may be provided for each opening portion 2099.

If the space of the imaging medium support drum is allowed, the focal adjustment using the focal detecting member shown in FIG. 17 and the focal adjustment using the focal detecting member shown in FIG. 55 are executed together. Thereby, a good focal state can be obtained at real time even if the drum with eccentricity is used.

FIG. 22 is a schematic view of the second example of the focal adjustment of the imaging apparatus of the present invention. In this figure, the same reference numerals are added to the portions common to prior art of FIG. 61 and the first example, and the explanation of the common portions will be omitted.

In the imaging apparatus 9 of this example, the imaging head 92 and the focal position detecting means 2053 are fixed to the linear stage 94 through the X-stage 2051, in addition to the imaging apparatus of prior art. Then, the focal position detecting means 2053 moves with the imaging head 92 as one unit. FIG. 23 shows a view of the linear stage portion seeing from the upper portion.

The displacement sensor of e.g., an optical type, an eddy current type, an electrostatic capacitance type, is incorporated into the focal position detecting means 2053. The displacement sensor can detect the distance between the focal position detecting means 2053 and the medium support drum 91. The distance between the imaging head 92 and the imaging medium 98 can be calculated as follows. Specifically, a positional difference, 5.000 mm, in a direction perpendicular to both the main scanning direction and the sub-scanning direction between the imaging head and the focal position detecting means 2053 is added to the distance between the focal position detecting means 2053 and the medium support drum 91 obtained by the displacement sensor incorporated into the focal position detecting means 2053. Then, the thickness of the imaging medium, 0.150 mm, is subtracted from the resultant value.

In the case where the distance between the imaging head and the imaging medium is 6.000 mm at the focal state, the distance between the focal position detecting means 2053 and the medium support drum 91 is 1.150 mm. Note that the focal adjusting means is the X-stage 2051, which is driven by the linear motor, and the imaging head 92 and the focal position detecting means 2053 are fixed to the sub-scanning means, that is, the linear stage 94 through the X-stage 2051.

Then, at the focal adjusting time, the linear motor of the X-stage 2051 is driven to move the imaging head 92 and the focal position detecting means 2053 in the direction of an arrow in the figure. Then, the distance between the imaging head 92 and the imaging medium 98 attached to the medium support drum 91c an be adjusted. The X-stage may be moved by the linear motor such that the value of the displacement sensor of the focal position detecting means corresponds to 1.150 mm.

This focal adjusting operation is carried out at an apparatus initial adjusting time, a focal position confirming time after a long rest, after replacing a part such as the imaging head, and a readjusting time when the thickness of the imaging medium is changed. When the thickness of the imaging medium is changed, the signal level showing the focal position may be shifted by a value corresponding to the change in the thickness of the imaging medium.

Example 4

High Accurate Optical Array

The following will the specific example of the optical fiber array apparatus used in the imaging apparatus of the present invention. FIG. 24 shows the first example of the optical fiber array apparatus of the present invention. FIG. 25 shows the arrangement of the optical fiber emission ends.

The optical fiber array apparatus 3001 comprises four optical fiber rows (3011a to 3011d) in which 10 optical fiber emission ends are arranged in a straight line. In each optical fiber row, 10 optical fiber emission ends are arranged in a straight line with a distance of 125 μm. The respective fiber rows are arranged such that the direction of the optical fiber emission ends included therein is parallel to the sub-scanning direction.

If the position of the optical fiber row 3011a is used as a reference, the optical fiber row 3011b is shifted by 108 μm in the main scanning direction and 62.5 μm in the sub-scanning direction. The optical fiber row 3011c is shifted by 608 μm in the main scanning direction and 31.25 μm in the sub-scanning direction. The optical fiber row 3011d is shifted by 716 μm in the main scanning direction and 93.75 μm in the sub-scanning direction. In this figure, b is 500 μm, which is fourfold of the distance of 125 μm between the optical fiber emission ends.

The use of the optical fiber array apparatus 3001 and the optical system having a magnification of 0.32 times makes it possible to execute the imaging with 2540 dpi. In this example, the number of optical fibers emission ends of one optical fiber row is 10. However, if the number of optical fibers emission ends is two or more, any number is possible. The favorable range is 8 to 32.

In the case of using the above arrangement of the optical fiber emission ends, the entire imaging area can be imaged without inclining the optical fiber array apparatus as shown in FIG. 6. Also, in such an arrangement, the good image area, which is required for the optical system, can be reduced to an extent (i.e., about 1.4 mm) that the length of one optical fiber row is sufficiently included as compared with the case in which all optical fiber emission ends are arranged in a straight line and the case in which the optical fiber emission ends are arranged in two rows. Therefore, a large amount of optical fiber emission ends can be arranged without increasing the cost of the optical system and the size thereof.

The shift amount of the optical fiber emission ends in the main scanning direction can be reduced to about 716 μm, that is, less than six times as large as the distance between the optical fiber emission ends. For this reason, many optical fiber emission ends can be arranged without complicating the electric circuit for controlling timing of imaging with the shift or without increasing the manufacturing cost. In this case, contrivance of the sub-scanning method and the rearrangement of data are not necessarily needed.

Next, the following will explain the method for manufacturing the optical fiber array apparatus 3001 with a good positional accuracy of the optical fiber emission ends. The manufacturing process will be shown in FIGS. 26A to 26E.

First, as shown in FIG. 26A, the columnar material 3019 for forming an optical fiber support member is prepared. Next, as shown in FIG. 26B, a two-stage fiber fixing groove is formed in upper and lower portions by discharge process etc., so as to manufacture the optical fiber support member 3017. In this case, the two-stage fiber fixing groove is formed to have a width, that is, 1375 μm, where 11 optical fibers can be arranged.

At the time of positioning the optical fibers, the bottom surface of the fiber fixing groove functions as the parallel portions 3015a and 3015b. Also, the side surface functions as restricting portions 3016a to 3016d. For this reason, the parallel portions 3015a and 3015b are precisely processed to be parallel to each other. And, the restricting portions 3016a to 3016d are precisely processed such that the shift of the optical fiber array direction between the restricting portions 3016a and 3016c and the shift of the optical fiber array direction between the restricting portions 3016b and 3016d are set to 93.75 μm.

Next, as shown in FIG. 26C, the optical fiber row 3011b having 10 optical fibers and one dummy fiber 3014a whose diameter is equal to the optical fiber serving as the light source are arranged as follows. More specifically, they are arranged in the parallel portion 3015a such that the optical fiber positioned at the left edge is closely in contact with the restricting portion 3016a and the dummy fiber 3014a is closely in contact with the restricting portion 3016b. Moreover, the optical fiber row 3011a having 10 optical fibers is arranged on these optical fibers in a barrel-piling manner.

The pressing member 3013a is pressed thereon, and upper and lower portions are inverted as shown in FIG. 26D. Thereafter, the optical fiber row 3011c having 10 optical fibers and one dummy fiber 3014b are arranged, and the optical fiber row 3011d having 10 optical fibers is arranged thereon in the same manner as shown in FIG. 26C. Finally, as shown in FIG. 26E, the pressing member 3013b is pressed thereon, and the space is filled with adhesive to be hardened so that the above members are combined into one. The optical fiber array apparatus is thus completed.

The second example of the optical fiber array apparatus of the present invention is shown in FIG. 27. The array of the optical fiber emission ends is shown in FIG. 28.

The optical fiber array apparatus 3001 comprises two optical fiber rows (3011a and 3011b) in which 20 optical fiber emission ends are arranged in a straight line. In each optical fiber row, 20 optical fiber emission ends are arranged in a straight line with a distance of 125 μm. The array direction of the optical fiber emission ends included in each optical fiber row is provided to have a predetermined angle θ with respect to the sub-scanning direction. The angle θ is defined as in equation (1). In this case, since the distance $a_s$ between the optical fiber emission ends is 125 μm and the dot distance ds between the light source surfaces is 31.25 μm, the angle θ is 75.5°.

If the position of the optical fiber row 3011a is used as a reference, the-optical fiber 3011b is shifted by 0 in the main direction and 625 μm in the sub-scanning direction. The use of the optical fiber array apparatus and the optical system having a magnification of 0.32 times makes it possible to execute the imaging with 2540 dpi.

In this example, the number of optical fibers emission ends of one optical fiber row is 20. However, if the number of optical fibers emission ends is two or more, any number is possible. The favorable range is 8 to 32. Also, in such an arrangement, the good image area, which is required for the optical system, can be reduced to an extent (i.e., about 2.9 mm) that the length of one optical fiber row is sufficiently included as compared with the case in which all optical fiber emission ends are arranged in a straight. Therefore, a large amount of optical fiber emission ends can be arranged without increasing the cost of the optical system and the size thereof.

Since the shift amount of the optical fiber emission ends in the main scanning direction can be reduced to a half, many optical fiber emission ends can be arranged without complicating the electric circuit for controlling timing of imaging with the shift or without increasing the manufacturing cost.

The method for manufacturing the optical fiber array apparatus with a good positional accuracy of the optical fiber emission ends is basically the same as the manufacturing process shown in the optical fiber array of the first example. The difference therebetween is the formation of only one optical fiber row in one fiber fixing groove and the positional relationship between the parallel portions and the restricting portions.

The fiber fixing groove has a width, that is, 2500 µm, where 20 optical fibers can arranged. The distance between the parallel portions is precisely processed to be 480 µm and the shift between the restricting portions is also precisely processed to be 156 µm.

The third example of the optical fiber array apparatus of the present invention is shown in FIG. 29. The arrangement of the optical fiber emission ends of the fiber array apparatus is shown in FIG. 30.

The optical fiber array apparatus 3001 comprises six optical fiber rows (3011a and 3011f) in which 10 optical fiber emission ends are arranged in a straight line. In each optical fiber row, 10 optical fiber emission ends are arranged in a straight line with a distance of 120 µm. The array direction of the optical fiber emission ends included in each optical fiber row is formed to be parallel to the sub-scanning direction.

If the position of the optical fiber row 3011a is used as a reference, the optical fiber row 3011b is shifted by 104 µm in the main scanning direction and 60 µm in the sub-scanning direction. The optical fiber row 3011c is shifted by 284 µm in the main scanning direction and 20 µm in the sub-scanning direction. The optical fiber row 3011d is shifted by 388 µm in the main scanning direction and 80 µm in the sub-scanning direction. The optical fiber row 3011e is shifted by 568 µm in the main scanning direction and 40 µm in the sub-scanning direction. The optical fiber row 3011f is shifted by 672 µm in the main scanning direction and 100 µm in the sub-scanning direction. In this case, b is 180 µm, which is 1.5 times as large as the distance between the optical fiber emission ends of 120 µm The use of the optical fiber array apparatus and the optical system having a magnification of 0.5 times makes it possible to execute the imaging with 2540 dpi. In this example, the number n of optical fibers emission ends of one optical fiber row is 10. However, if the number of optical fibers emission ends is two or more, any number is possible. The favorable range is 8 to 32.

In the case of using the above arrangement of the optical fiber emission ends, the entire imaging area can be imaged without inclining the optical fiber array apparatus as shown in FIG. 6. Also, in such an arrangement, the good image area, which is required for the optical system, can be reduced to an extent (i.e., about 1.1 mm) that the length of one optical fiber row is sufficiently included as compared with the case in which all optical fiber emission ends are arranged in a straight line and the case in which the optical fiber emission ends are arranged in two rows. Therefore, a large amount of optical fiber emission ends can be arranged without increasing the cost of the optical system and the size thereof.

The shift amount of the optical fiber emission ends in the main scanning direction can be reduced to about 672 µm, that is, less than six times as large as the distance between the optical fiber emission ends. For this reason, many optical fiber emission ends can be arranged without complicating the electric circuit for controlling timing of imaging with the shift or without increasing the manufacturing cost. In this case, contrivance of the sub-scanning method and the rearrangement of data are not necessarily needed.

Next, the following will explain the method for manufacturing the optical fiber array apparatus 3001 with a good positional accuracy of the optical fiber emission ends . The manufacturing process will be shown in FIGS. 31A to 31E.

First, as shown in FIG. 31A, the columnar material 3019 for forming an optical fiber support member is prepared. Next, as shown in FIG. 31B, the two-stage groove is formed by wire discharge process etc., so as to manufacture an optical fiber support member 3017a. In this case, the two-stage groove is formed such that a bottom portion has a width, i.e., 1320 µm where 11 optical fibers can be arranged and an opening portion has a width, i.e., 1720 µm equal to the widths of optical fiber arranging members 3017b and 3017c. The optical fiber arranging members 3017b and 3017c have fiber fixing grooves each having a width where 11 optical fibers can be arranged.

The optical fiber support member 3017a and the optical fiber arranging members 3017b and 3017c are combined into one as described later, and function as an optical fiber support member. The bottom surface of the groove of the support member 3017a functions as the parallel portion 3015a and the bottom surfaces of the fiber fixing grooves of the arranging member 3017b and 3017c function as the parallel portions 3015b and 3015c. Also, the side surface of the groove of the support member 3017a functions as restricting portions 3016a and 3016b, and the side surfaces of the grooves of the optical fiber arranging members 3017b and 3017c function as restricting portions 3016c to 3016f. For this reason, the parallel portions 3015a and 3015c are precisely processed to be parallel to each other. And, the restriction portions 3016a to 3016f are precisely processed such that the shift of the optical fiber array direction between the restricting portions 3016a, 3016c, 3016e and the restricting portions 3016b, 3016d, 3016f is a pitch of 20 µm.

Next, as shown in FIG. 31C, the optical fiber row 3011a having 10 optical fibers and one dummy fiber 3014a whose diameter is equal to the optical fiber serving as the light source are arranged as follows. More specifically, they are arranged in the parallel portion 3015a such that the optical fiber positioned at the left edge is closely in contact with the restricting portion 3016a and the dummy fiber 3014a is closely in contact with the restricting portion 3016b. Moreover, the optical fiber row 3011b having 10 optical fibers is arranged on these optical fibers in a barrel-piling manner.

Next, as shown in FIG. 31D, the optical fiber arranging member 3017b is pressed thereon. Then, the optical fiber row 3011c having 10 optical fibers and one dummy fiber 3014b whose diameter is equal to the optical fiber serving as the light source are arranged in the parallel portion 3015b. In this case, they are arranged such that the optical fiber positioned at the left edge is closely in contact with the restricting portion 3016c and the dummy fiber 3014b is closely in contact with the restricting portion 3016d. Moreover, the optical fiber row 3011d having 10 optical fibers is arranged on these optical fibers in a barrel-piling manner.

Thereafter, the optical fiber arranging member 3017c, the optical fiber row 3011e having 10 optical fibers and one dummy fiber 3014c are arranged, and the optical fiber row 3011f having 10 optical fibers is arranged thereon in the same manner as shown in FIG. 31D. Finally, as shown in FIG. 31E, the pressing member 3013 is pressed thereon, and the space is filled with adhesive to be hardened so that the above members are combined into one. The optical fiber array apparatus is thus completed.

The fourth example of the optical fiber array apparatus of the present invention is shown in FIG. 32. The array of the optical fiber emission ends is shown in FIG. 33.

The optical fiber array apparatus 3001 comprises four optical fiber rows (3011a and 3011d) in which 10 optical fiber emission ends are arranged in a straight line.

In each optical fiber row, 10 optical fiber emission ends are arranged in a straight line with a distance of 125 µm. The array direction of the optical fiber emission ends included in each optical fiber row is formed to be parallel to the sub-scanning direction. If the position of the optical fiber row 3011a is used as a reference, the optical fiber row 3011b is shifted by 175 μm in the main scanning direction and 62.5 μm in the sub-scanning direction. The optical fiber row 3011c is shifted by 675 μm in the main scanning direction and 31.25 μm in the sub-scanning direction. The optical fiber row 3011d is shifted by 850 μm in the main scanning direction and 93.75 μm in the sub-scanning direction. In this case, b is 500 μm, which is four times as large as the distance between the fiber emission ends, and c is a sum, i.e., 175 μm of the clad diameter, 125 μm, of the fibers and the thickness, 50 μm, of the spacers. The use of the optical fiber array apparatus and the optical system having a magnification of 0.32 times makes it possible to execute the imaging with 2540 dpi.

In this example, the number n of optical fibers emission ends of one optical fiber row is 10. However, if the number of optical fibers emission ends is two or more, any number is possible. The favorable range is 8 to 32. In the case of using the above arrangement of the optical fiber emission ends, the entire imaging area can be imaged without inclining the optical fiber array apparatus as shown in FIG. 6. Also, in such an arrangement, the good image area, which is required for the optical system, can be reduced to an extent (about 1.4 mm) that the length of one optical fiber row is sufficiently included as compared with the case in which all optical fiber emission ends are arranged in a straight line and the case in which the optical fiber emission ends are arranged in two rows. Therefore, a large amount of optical fiber emission ends can be arranged without increasing the cost of the optical system and the size thereof.

The shift amount of the optical fiber emission ends in the main scanning direction can be reduced to about 850 μm, that is, less than 8 times as large as the distance between the optical fiber emission ends. For this reason, many optical fiber emission ends can be arranged without complicating the electric circuit for controlling timing of imaging with the shift or without increasing the manufacturing cost. In this case, contrivance of the sub-scanning method and the rearrangement of data are not necessarily needed.

Next, the following will explain the method for manufacturing the optical fiber array apparatus with a good positional accuracy of the optical fiber emission ends. The manufacturing process will be shown in FIGS. 34A to 34E.

First, as shown in FIG. 34A, the columnar material 3019 for forming an optical fiber support member is prepared. Next, as shown in FIG. 34B, a two-stage fiber fixing groove is formed in upper and lower portions by wire discharge process etc., so as to manufacture an optical fiber support member 3017. In this case, a width of the first-stage of the two-stage fiber fixing groove is such that 10 optical fibers can be arranged, and a width of the second-stage thereof is such that 11 optical fibers can be arranged.

At the time of positioning the optical fibers, the bottom surface of the fiber fixing groove functions as the parallel portions 3015a and 3015b. Also, the first-stage side surfaces 3016a, 3016b, 3016e, 3016f and the second-stage side surfaces 3016c, 3016d, 3016g, 3016h function as restricting portions. For this reason, the parallel portions 3015a and 3015c are precisely processed to be parallel to each other. And, the restricting portions 3016a to 3016h are precisely processed such that the shift of the optical fiber array direction among the restricting portions 3016a, 3016c, the restricting portions 3016b, 3016d, the restricting portions 3016e and 3016g, and the restricting portions 3016f and 3016h are set to 62.5 μm and that the shift of the optical fiber array direction between the restricting portions 3016a, 3016e and the restricting portions 3016b, 3016f is set to 31.25 μm.

Next, as shown in FIG. 34C, the optical fiber row 3011b having 10 optical fibers is arranged in the parallel portion 3015a such that the optical fiber left end positioned at the left edge is closely in contact with the restricting portion 3016a and the optical fiber positioned at the right edge is closely in contact with the restricting portion 3016b.

Then, a spacer 3018a is mounted on these optical fibers, and the optical fiber row 3011a having 10 optical fibers and one dummy fiber 3014a whose diameter is equal to the optical fiber serving as the light source are arranged thereon. More specifically, they are arranged such that the left edge of the dummy fiber 3014a is closely in contact with the restricting portion 3016c and the optical fiber positioned at the right edge is closely in contact with the restricting portion 3016d.

Next, the pressing member 3013a is pressed thereon, and upper and lower portions are inverted as shown in FIG. 34D. Thereafter, the optical fiber row 3011c having 10 optical fibers, the spacer 3018b are arranged, and the optical fiber row 3011d having 10 optical fibers and one dummy fiber 3014b are arranged thereon in the same manner as shown in FIG. 34C. Finally, as shown in FIG. 34E, the pressing member 3013b is pressed thereon, and the space is filled with adhesive to be hardened so that the above members are combined into one.

The fifth example of the optical fiber array apparatus of the present invention is shown in FIG. 35. The array of the optical fiber emission ends is shown in FIG. 36.

The optical fiber array apparatus 3001 comprises 10 optical fiber rows (3011a and 3011j) in which four optical fiber emission ends are arranged in a straight line. In each optical fiber row, four optical fiber emission ends are arranged in a straight line to have a distance and an angle such that the projection in the sub-scanning direction becomes 50 μm. If the position of the optical fiber row 3011a is used as a reference, the optical fiber row 3011b is shifted by 200 μm in the sub-scanning direction. The optical fiber row 3011c is shifted by 400 μm in the sub-scanning direction. The optical fiber row 3011d is shifted by 600 μm . . . , and the optical fiber row 3011j is shifted by 1800 μm in the sub-scanning direction.

The use of the optical fiber array apparatus and the optical system having a magnification of 0.20 times makes it possible to execute the imaging with 2540 dpi. In this example, the number n of optical fibers emission ends of one optical fiber row is four. Actually, two to eight optical fiber emission ends are practically used, and the most favorable number of optical fiber emission ends is four.

In the case of using the above arrangement of the optical fiber emission ends, the entire imaging area can be imaged without inclining the optical fiber array apparatus as shown in FIG. 6. In such an arrangement, as compared with the case in which all optical fiber emission ends are arranged in a straight line and the case in which the optical fiber emission ends are arranged in two rows, the good image area, which is required for the optical system, can be reduced to an extent that the clad diameter is about twice as many as the number of optical fiber rows. In this example, since the clad diameter is 125 μm and the number of optical fiber rows is 10, the good image area can be reduced to 2.5 mm. Therefore, a large amount of optical fiber emission ends can be arranged without increasing the cost of the optical system and the size thereof.

The shift amount of the optical fiber emission ends in the main scanning direction can be reduced to be below three times as large as the clad diameter of the fiber, that is, 375 µm. For this reason, many optical fiber emission ends can be arranged without complicating the electric circuit for controlling timing of imaging with the shift or without increasing the manufacturing cost. In this case, contrivance of the sub-scanning method and the rearrangement of data are not necessarily needed.

Next, FIG. 37 shows an enlarged view of the fiber support portion of a comblike optical fiber support member 3027, which makes it possible to manufacture the optical fiber array apparatus with a good accuracy of the optical fiber emission ends.

As shown in FIG. 37, comblike grooves are formed in the fiber support portion of the comblike optical fiber support member 3027. More specifically, the comblike grooves are formed by wire discharge process so as to have a width where one optical fiber can arranged, that is, 127 µm corresponding to the number of fiber emission ends of one fiber row, and a depth corresponding to four fiber emission ends. In other words, the comblike grooves of 500 µm, which corresponds to the number of fiber rows, are formed.

At the time of positioning the optical fibers, the bottom surface of the fiber fixing groove functions as the restricting portions 3016a, 3016b, 3016c, . . . , 3016j. Then, the side surface functions as parallel portions 3015a, 3015b,, 3015c, . . . , 3015t. For this reason, the parallel portions 3015a, 3015b, 3015c, . . . , 3015t are precisely processed so as to be all parallel to each other. The restricting portions 3016a to 3016j are precisely processed such that the shift in the main scanning direction becomes 0, and that the distance between the adjacent restricting portions in the sub-scanning direction becomes 200 µm, and that the width of the groove ranges 1.012 to 1.020 times as large as the optical fiber diameter of 125 µm, that is, 126.5 to 127.5 µm.

The actual manufacturing method is as follows. More specifically, 40 fibers are closely arranged at the fiber support portion of the comblike fiber support member 3027, and the pressing member 3013 is pressed thereon. Then, the space is filled with adhesive to be hardened so that the above members are combined into one, thereby the manufacture of the comblike fiber support member can be realized.

The printing-apparatus of the present invention having the above-explained imaging apparatus of the present invention and the printing means can be realized by use of a lithographic press with an automatic feeding and discharging apparatus described in e.g., Examined Japanese Patent Publication No. 2-8585, or plate cylinders of the lithographic press described in Examined Japanese Patent Publication No. 5-37112 as the medium support drum 91 of the above examples. More specifically, the printing apparatus of the present invention having the above-explained imaging apparatus of the present invention and the printing means can be realized by providing the imaging head of the above examples and the scanning means around the medium support drum. In such an apparatus, an unprocessed press plate is wound around the plate cylinder by the automatic feeding and discharging plate apparatus, the imaging is executed by the imaging head. Then, residues of the surface layer left on the surface of the plate are wiped off by wiping-off means such as a waste as required, or removed by residue removing means such as a brush.

Then, ink is supplied to the above-formed imaging processed press plate from the ink unit, and the sequent operations may be used as in the general lithographic press. After printing, the plate is removed by the automatic feeding and discharging plate apparatus.

In this case, since the positioning (registering) of the plate on the printing machine becomes unnecessary or greatly simplified, printing preparation time can be largely reduced.

INDUSTRIAL APPLICABILITY

According to the imaging apparatus, the imaging method, the imaging head apparatus, the printing apparatus, and the optical fiber array apparatus of the present invention, the alternative operations can be executed without making it impossible to operate the apparatus when a part of the plurality of beam irradiation sources is out of order.

Also, in the case of forming the plurality of beam irradiation sources in the same semiconductor chip at the imaging head preparation stage, the apparatus can be used with limitations and the considerable reduction of yield can be prevented even if the part of the plurality of irradiation beam sources is out of order by the local defectiveness of the semiconductor chip.

Moreover, a large amount of beam irradiation sources can be arranged without increasing the manufacturing cost of the optical system and the size thereof.

Further, according to the imaging apparatus, the imaging method, the imaging head apparatus, the printing apparatus, and the optical fiber array apparatus of the present invention, time, which is required for changing the imaging data absent state of the beam irradiation sources to the imaging data present state, can be largely reduced, thereby making it possible to improve the imaging speed.

Furthermore, according to the imaging apparatus, the imaging method, the imaging head apparatus, the printing apparatus, and the optical fiber array apparatus of the present invention, the adjustment of the distance between the imaging head and the imaging medium, which has needed much time and effort in the conventional imaging apparatus, can be easily executed.

Also, the confirmation of the focal state and the slight adjustment can be executed even while the imaging is operated.

Also, according to the optical fiber array apparatus of the present invention, the optical fiber support member having the positioning portions such as the parallel portions and the restricting portions is used, thereby making possible to provide the multi-stage piling optical fiber array apparatus having a good positional accuracy.

What is claimed is:

1. An imaging apparatus having a plurality of beam irradiation sources which can be individually driven, said imaging apparatus comprising:

supporting means for an imaging medium;

n (n=an integer$\geq$2) light source blocks each including k (k=an integer$\geq$2) beam irradiation sources, wherein a distance between neighboring beam irradiation sources in a sub-scanning direction determines a medium surface dot distance;

at least one or more beam irradiation source driving devices, with each of said beam irradiation source driving devices that is driving a beam irradiation source during imaging being connected in one-to-one relationship with a corresponding light source block that is different from any light source block connected to any other of said beam irradiation source driving devices; and scanning means for changing a feed amount between said light source blocks and said supporting means in the sub-scanning direction to at least one of a second feed amount and a combination of feed amounts in response to a situation where not all said beam irradiation sources are operational, wherein said imaging apparatus is adapted to make an image using all the light source blocks when all said beam irradiation sources are operational, and to make an image using the light source blocks that are not associated with at least one of a non-operational beam irradiation source and all the light source blocks except for the non-operational beam irradiation source when not all said beam irradiation sources are operational.

2. The imaging apparatus according to claim 1, wherein said respective light source blocks include a plurality of beam irradiation sources arranged in a line.

3. The imaging apparatus according to claim 2, wherein said blocks are arranged in the same direction as a direction the beam irradiation sources of the blocks are arranged.

4. The imaging apparatus according to claim 2, wherein said blocks are arranged to have a predetermined angle to a direction where the beam irradiation sources of the blocks are arranged.

5. The imaging apparatus according to claim 1, wherein said imaging apparatus includes an imaging head manufactured using the light source blocks and having at least one of the beam irradiation sources of said blocks being normally operated and at least one of the beam irradiation sources being abnormally operated.

6. The imaging apparatus according to claim 1, wherein said beam irradiation sources are emission ends of a laser device formed of a compound semiconductor.

7. The imaging apparatus according to claim 6, wherein the beam irradiation sources of one block are formed in a single semiconductor chip.

8. The imaging apparatus according to claim 6, wherein all beam irradiation sources are formed in a single semiconductor chip.

9. The imaging apparatus according to claim 1, wherein said beam irradiation sources are emission ends of optical fibers.

10. The imaging apparatus according to claim 1, wherein the scanning means changes the feed amount to the at least one of the second feed amount and the combination of feed amounts based on a position of the non-operational beam irradiation source and the medium surface dot distance.

* * * * *